United States Patent
Butterfield et al.

(10) Patent No.: US 7,125,477 B2
(45) Date of Patent: *Oct. 24, 2006

(54) CONTACTS FOR ELECTROCHEMICAL PROCESSING

(75) Inventors: Paul Butterfield, San Jose, CA (US); Liang-Yuh Chen, Foster City, CA (US); Yongqi Hu, Campbell, CA (US); Antoine Manens, Palo Alto, CA (US); Rashid Mavliev, Campbell, CA (US); Stan Tsai, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 214 days.

This patent is subject to a terminal disclaimer.

(21) Appl. No.: 10/211,626

(22) Filed: Aug. 2, 2002

(65) Prior Publication Data

US 2004/0023495 A1 Feb. 5, 2004

Related U.S. Application Data

(63) Continuation-in-part of application No. 09/505,899, filed on Feb. 17, 2000, now Pat. No. 6,537,144, and a continuation-in-part of application No. 10/033,732, filed on Dec. 27, 2001.

(51) Int. Cl.
*B23H 3/00* (2006.01)
*B23H 7/00* (2006.01)
(52) U.S. Cl. ............... 204/224 M; 451/24; 451/287; 204/217; 204/224 R; 204/286.1; 204/288.6; 205/640; 205/651; 205/662; 205/663; 205/668

(58) Field of Classification Search ............. 204/212, 204/224 R, 224 M, 215–217, 196.28, 242, 204/286.1, 288.6; 205/662–663, 220–223, 205/157, 291, 640, 651, 668; 451/24, 287, 451/526–539; 439/190–191, 197
See application file for complete search history.

(56) References Cited

U.S. PATENT DOCUMENTS 1,601,642 A 9/1926 Parker (Continued)

FOREIGN PATENT DOCUMENTS

EP 0 325 753 8/1989

(Continued)

OTHER PUBLICATIONS

Nogami, "An Innovation in Integrate Porous Low-K Materials and Copper," *InterConnect Japan 2001*; Honeywell Seminar Dec. 6, 2001, p. 1-12.

(Continued)

*Primary Examiner*—Roy King
*Assistant Examiner*—Lois Zheng
(74) *Attorney, Agent, or Firm*—Patterson and Sheridan

(57) ABSTRACT

Systems and methods for electrochemically processing. A contact element defines a substrate contact surface positionable in contact a substrate during processing. In one embodiment, the contact element comprises a wire element. In another embodiment the contact element is a rotating member. In one embodiment, the contact element comprises a noble metal.

67 Claims, 23 Drawing Sheets

U.S. PATENT DOCUMENTS

| | | | |
|---|---|---|---|
| 1,927,162 A | 9/1933 | Fiedler et al. | |
| 2,112,691 A | 3/1938 | Crowder | |
| 2,240,265 A | 4/1941 | Nachtman | |
| 2,392,687 A | 1/1946 | Nachtman | |
| 2,431,065 A | 11/1947 | Miller | |
| 2,451,341 A | 10/1948 | Jemstedt | |
| 2,453,481 A | 11/1948 | Wilson | |
| 2,454,935 A | 11/1948 | Miller | |
| 2,456,185 A | 12/1948 | Grube | |
| 2,457,510 A | 12/1948 | van Ornum | |
| 2,458,676 A | 1/1949 | Brenner et al. | |
| 2,461,556 A | 2/1949 | Lorig | |
| 2,473,290 A | 6/1949 | Millard | |
| 2,477,808 A | 8/1949 | Jones | |
| 2,479,323 A | 8/1949 | Davis | |
| 2,480,022 A | 8/1949 | Hogaboom | |
| 2,490,055 A | 12/1949 | Hoff | |
| 2,495,695 A | 1/1950 | Camin et al. | |
| 2,500,205 A | 3/1950 | Schaefer | |
| 2,500,206 A | 3/1950 | Schaefer et al. | |
| 2,503,863 A | 4/1950 | Bart | |
| 2,506,794 A | 5/1950 | Kennedy et al. | |
| 2,509,304 A | 5/1950 | Klein | |
| 2,512,328 A | 6/1950 | Hays | |
| 2,517,907 A | 8/1950 | Mikulas | |
| 2,519,945 A | 8/1950 | Twele et al. | |
| 2,530,677 A | 11/1950 | Berkenkotter et al. | |
| 2,535,966 A | 12/1950 | Teplitz | |
| 2,536,912 A | 1/1951 | Cobertt | |
| 2,539,898 A | 1/1951 | Davis | |
| 2,540,175 A | 2/1951 | Rosenqvist | |
| 2,544,510 A | 3/1951 | Prahl | |
| 2,549,678 A | 4/1951 | Fiandt | |
| 2,544,943 A | 5/1951 | Farmer | |
| 2,556,017 A | 6/1951 | Vonada | |
| 2,560,534 A | 7/1951 | Adler | |
| 2,560,966 A | 7/1951 | Lee | |
| 2,569,577 A | 10/1951 | Reading | |
| 2,569,578 A | 10/1951 | Rieger | |
| 2,571,709 A | 10/1951 | Gray | |
| 2,576,074 A | 11/1951 | Nachtman | |
| 2,587,630 A | 3/1952 | Konrad et al. | |
| 2,619,454 A | 11/1952 | Zapponi | |
| 2,633,452 A | 3/1953 | Hogaboom, Jr. et al. | |
| 2,646,398 A | 7/1953 | Henderson | |
| 2,656,283 A | 10/1953 | Fink et al. | |
| 2,656,284 A | 10/1953 | Toulmin | |
| 2,657,177 A | 10/1953 | Rendel | |
| 2,657,457 A | 11/1953 | Toulmin | |
| 2,673,836 A | 3/1954 | Vonada | |
| 2,674,550 A | 4/1954 | Dunlevy et al. | |
| 2,675,348 A | 4/1954 | Greenspan | |
| 2,680,710 A | 6/1954 | Kenmore et al. | |
| 2,684,939 A | 7/1954 | Geese | |
| 2,696,859 A | 8/1954 | Gray et al. | |
| 2,689,215 A | 9/1954 | Bart | |
| 2,695,269 A | 11/1954 | de Witz et al. | |
| 2,698,832 A | 1/1955 | Swanson | |
| 2,706,173 A | 4/1955 | Wells et al. | |
| 2,706,175 A | 4/1955 | Licharz | |
| 2,708,445 A | 5/1955 | Manson et al. | |
| 2,710,834 A | 6/1955 | Vrilakas | |
| 2,711,993 A | 6/1955 | Lyon | |
| 3,162,588 A | 12/1964 | Bell | 204/141 |
| 3,334,041 A | 8/1967 | Dyer et al. | |
| 3,433,730 A | 3/1969 | Kennedy et al. | |
| 3,448,023 A | 6/1969 | Bell | |
| 3,476,677 A | 11/1969 | Corley et al. | |
| 3,607,707 A | 9/1971 | Chenevier | |
| 3,873,512 A | 3/1975 | Latanision | 204/129.46 |
| 3,942,959 A | 3/1976 | Markoo et al. | |
| 3,992,178 A | 11/1976 | Markoo et al. | |
| 4,047,902 A | 9/1977 | Wiand | |
| 4,082,638 A * | 4/1978 | Jumer | 204/213 |
| 4,119,515 A | 10/1978 | Costakis | |
| 4,125,444 A | 11/1978 | Inoue | 204/129.43 |
| 4,312,716 A | 1/1982 | Maschler et al. | |
| 4,523,411 A * | 6/1985 | Freerks | 451/357 |
| 4,704,511 A * | 11/1987 | Miyano | 219/69.12 |
| 4,713,149 A | 12/1987 | Hoshino | |
| 4,752,371 A | 6/1988 | Kreisel et al. | |
| 4,772,361 A | 9/1988 | Dorsett et al. | |
| 4,793,895 A | 12/1988 | Kaanta et al. | 156/627 |
| 4,839,993 A | 6/1989 | Masuko et al. | 51/129 |
| 4,934,102 A | 6/1990 | Leach et al. | |
| 4,954,141 A | 9/1990 | Takiyama et al. | 51/296 |
| 4,956,056 A | 9/1990 | Zubatova et al. | 204/129.43 |
| 5,011,510 A | 4/1991 | Hayakawa et al. | |
| 5,061,294 A | 10/1991 | Harmer et al. | |
| 5,066,370 A | 11/1991 | Andreshak et al. | |
| 5,096,550 A | 3/1992 | Mayer et al. | |
| 5,104,319 A | 4/1992 | Evans et al. | |
| 5,108,463 A | 4/1992 | Buchanan | |
| 5,136,817 A | 8/1992 | Tabata et al. | 51/165.71 |
| 5,137,542 A | 8/1992 | Buchanan et al. | |
| 5,203,884 A | 4/1993 | Buchanan et al. | |
| 5,217,586 A | 6/1993 | Datta et al. | |
| 5,225,034 A | 7/1993 | Yu et al. | |
| 5,257,478 A | 11/1993 | Hyde et al. | |
| 5,328,716 A | 7/1994 | Buchanan | |
| 5,478,435 A | 12/1995 | Murphy et al. | |
| 5,534,106 A | 7/1996 | Cote et al. | |
| 5,543,032 A | 8/1996 | Datta et al. | 205/670 |
| 5,560,753 A | 10/1996 | Schnabel et al. | |
| 5,562,529 A | 10/1996 | Kishii et al. | |
| 5,567,300 A | 10/1996 | Datta et al. | 205/652 |
| 5,575,706 A | 11/1996 | Tsai et al. | 451/41 |
| 5,578,362 A | 11/1996 | Reinhardt et al. | 428/147 |
| 5,624,300 A | 4/1997 | Kishii et al. | 451/36 |
| 5,674,122 A | 10/1997 | Krech | |
| 5,693,239 A | 12/1997 | Wang et al. | |
| 5,702,811 A | 12/1997 | Ho et al. | |
| 5,733,564 A | 3/1998 | Lehtinen | |
| 5,738,574 A | 4/1998 | Tolles et al. | 451/288 |
| 5,804,507 A | 9/1998 | Perlov et al. | 438/692 |
| 5,804,513 A | 9/1998 | Sakatani et al. | |
| 5,807,165 A | 9/1998 | Uzoh et al. | 451/41 |
| 5,823,854 A | 10/1998 | Chen | |
| 5,840,190 A | 11/1998 | Scholander et al. | |
| 5,840,629 A | 11/1998 | Carpio | |
| 5,846,882 A | 12/1998 | Birang | 438/692 |
| 5,871,392 A | 2/1999 | Meikle et al. | 451/56 |
| 5,882,491 A | 3/1999 | Wardle | |
| 5,893,796 A | 4/1999 | Birang et al. | |
| 5,911,619 A | 6/1999 | Uzoh et al. | 451/5 |
| 5,938,801 A | 8/1999 | Robinson | 51/306 |
| 5,948,697 A | 9/1999 | Hata | |
| 5,985,093 A | 11/1999 | Chen | |
| 6,001,008 A | 12/1999 | Fujimori et al. | 451/443 |
| 6,004,880 A | 12/1999 | Liu et al. | 438/692 |
| 6,017,265 A | 1/2000 | Cook et al. | 451/41 |
| 6,020,264 A | 2/2000 | Lustig et al. | 438/692 |
| 6,024,630 A | 2/2000 | Shendon et al. | 451/41 |
| 6,033,293 A | 3/2000 | Crevasse et al. | 451/494 |
| 6,056,851 A | 5/2000 | Hsieh et al. | 156/345 |
| 6,066,030 A | 5/2000 | Uzoh | 451/41 |
| 6,074,284 A | 6/2000 | Tani et al. | |
| 6,077,337 A | 6/2000 | Lee | |
| 6,090,239 A | 7/2000 | Liu et al. | 156/345 |
| 6,103,096 A | 8/2000 | Datta et al. | 205/686 |
| 6,116,998 A | 9/2000 | Damgaard et al. | 451/490 |
| 6,132,292 A | 10/2000 | Kubo | |
| 6,146,244 A | 11/2000 | Atsugi et al. | |
| 6,153,043 A | 11/2000 | Edelstein et al. | 156/345 |

| Patent No. | Date | Inventor | Class |
|---|---|---|---|
| 6,156,124 A | 12/2000 | Tobin | 118/719 |
| 6,159,079 A | 12/2000 | Zuniga et al. | 451/41 |
| 6,171,467 B1 | 1/2001 | Weihs et al. | 205/93 |
| 6,176,992 B1 | 1/2001 | Talieh | 205/87 |
| 6,176,998 B1 | 1/2001 | Wardle et al. | |
| 6,183,354 B1 | 2/2001 | Zuniga et al. | |
| 6,190,494 B1 | 2/2001 | Dow | |
| 6,210,257 B1 | 4/2001 | Carlson | 451/56 |
| 6,234,870 B1 | 5/2001 | Uzoh et al. | 451/8 |
| 6,238,271 B1 | 5/2001 | Cesna | 451/41 |
| 6,238,592 B1 | 5/2001 | Hardy et al. | |
| 6,244,935 B1 | 6/2001 | Birang et al. | 451/41 |
| 6,245,700 B1 | 6/2001 | Budd et al. | |
| 6,248,222 B1 | 6/2001 | Wang | 204/297.09 |
| 6,251,235 B1 | 6/2001 | Talieh et al. | |
| 6,257,953 B1 | 7/2001 | Gitis et al. | |
| 6,258,223 B1 | 7/2001 | Cheung et al. | |
| 6,261,168 B1 | 7/2001 | Jensen et al. | 451/527 |
| 6,261,959 B1 | 7/2001 | Travis et al. | 438/692 |
| 6,273,798 B1 | 8/2001 | Berman | 451/72 |
| 6,296,557 B1 | 10/2001 | Walker | |
| 6,297,159 B1 | 10/2001 | Paton | 438/693 |
| 6,319,108 B1 | 11/2001 | Adefris et al. | |
| 6,319,420 B1 | 11/2001 | Dow | |
| 6,322,422 B1 | 11/2001 | Satou | |
| 6,328,642 B1 | 12/2001 | Pant et al. | 451/307 |
| 6,328,872 B1 | 12/2001 | Talieh et al. | |
| 6,331,135 B1 | 12/2001 | Sabde et al. | 451/41 |
| 6,335,083 B1 | 1/2002 | Kasai et al. | |
| 6,361,414 B1 | 3/2002 | Ravkin et al. | |
| 6,368,184 B1 | 4/2002 | Beckage | |
| 6,368,190 B1 | 4/2002 | Easter et al. | |
| 6,372,001 B1 | 4/2002 | Omar et al. | |
| 6,379,223 B1 | 4/2002 | Sun et al. | |
| 6,381,169 B1 | 4/2002 | Bocian et al. | 365/151 |
| 6,383,066 B1 | 5/2002 | Chen et al. | |
| 6,386,956 B1 | 5/2002 | Sato et al. | 451/57 |
| 6,391,166 B1 | 5/2002 | Wang | 204/224 R |
| 6,395,152 B1 | 5/2002 | Wang | 204/224 M |
| 6,402,591 B1 | 6/2002 | Thornton | 451/36 |
| 6,402,925 B1 | 6/2002 | Talieh | |
| 6,406,363 B1 | 6/2002 | Xu et al. | 451/296 |
| 6,409,904 B1 | 6/2002 | Uzoh et al. | |
| 6,413,388 B1 | 7/2002 | Uzoh et al. | |
| 6,428,394 B1 | 8/2002 | Mooring et al. | 451/41 |
| 6,431,968 B1 | 8/2002 | Chen et al. | |
| 6,440,295 B1 | 8/2002 | Wang | 205/640 |
| 6,447,668 B1 | 9/2002 | Wang | |
| 6,461,988 B1 | 10/2002 | Budd et al. | |
| 6,471,847 B1 | 10/2002 | Talieh et al. | |
| 6,475,332 B1 | 11/2002 | Boyd et al. | 156/345.12 |
| 6,479,962 B1 | 11/2002 | Ziemkowski et al. | |
| 6,482,307 B1 | 11/2002 | Ashjaee et al. | 205/103 |
| 6,484,539 B1 | 11/2002 | Nordine et al. | |
| 6,497,800 B1 | 12/2002 | Talieh et al. | 204/224 R |
| 6,511,739 B1 | 1/2003 | Kasai et al. | |
| 6,514,892 B1 | 2/2003 | Kasai et al. | |
| 6,517,426 B1 | 2/2003 | Lee | 451/537 |
| 6,520,843 B1 | 2/2003 | Halley | 451/285 |
| 6,537,140 B1 | 3/2003 | Miller et al. | |
| 6,537,144 B1 | 3/2003 | Tsai et al. | |
| 6,551,179 B1 | 4/2003 | Halley | 451/285 |
| 6,561,873 B1 | 5/2003 | Tsai et al. | |
| 6,561,889 B1 | 5/2003 | Xu et al. | 451/526 |
| 6,569,004 B1 | 5/2003 | Pham | 451/526 |
| 6,572,463 B1 | 6/2003 | Xu et al. | 451/526 |
| 6,585,579 B1 | 7/2003 | Jensen et al. | 451/527 |
| 6,630,059 B1 | 10/2003 | Uzoh et al. | |
| 6,641,471 B1 | 11/2003 | Pinheiro et al. | |
| 6,656,019 B1 | 12/2003 | Chen et al. | |
| 6,666,959 B1 | 12/2003 | Uzoh et al. | |
| 6,685,548 B1 | 2/2004 | Chen et al. | |
| 6,692,338 B1 | 2/2004 | Kirchner | |
| 6,736,952 B1 * | 5/2004 | Emesh et al. | 205/81 |
| 6,739,951 B1 | 5/2004 | Sun et al. | |
| 6,752,700 B1 | 6/2004 | Duescher | |
| 6,769,969 B1 | 8/2004 | Duescher | |
| 6,802,955 B1 | 10/2004 | Emesh et al. | |
| 6,848,977 B1 | 2/2005 | Cook et al. | |
| 6,856,761 B1 | 2/2005 | Doran | |
| 6,982,524 B1 | 11/2005 | Butterfield et al. | |
| 2001/0005667 A1 | 6/2001 | Tolles et al. | |
| 2001/0024878 A1 | 9/2001 | Nakamura | 438/691 |
| 2001/0027018 A1 | 10/2001 | Molnar | |
| 2001/0035354 A1 * | 11/2001 | Ashjaee et al. | 205/103 |
| 2001/0036746 A1 | 11/2001 | Sato et al. | 438/745 |
| 2001/0040100 A1 | 11/2001 | Wang | 205/220 |
| 2001/0042690 A1 | 11/2001 | Talieh | 205/118 |
| 2002/0008036 A1 | 1/2002 | Wang | 205/118 |
| 2002/0011417 A1 | 1/2002 | Talieh et al. | |
| 2002/0020621 A1 | 2/2002 | Uzoh et al. | |
| 2002/0025760 A1 | 2/2002 | Lee et al. | |
| 2002/0025763 A1 | 2/2002 | Lee et al. | |
| 2002/0070126 A1 | 6/2002 | Sato | 205/640 |
| 2002/0077037 A1 | 6/2002 | Tietz | 451/41 |
| 2002/0088715 A1 | 7/2002 | Talieh et al. | |
| 2002/0102853 A1 | 8/2002 | Li et al. | |
| 2002/0108861 A1 | 8/2002 | Emesh et al. | |
| 2002/0119286 A1 | 8/2002 | Chen et al. | |
| 2002/0123300 A1 | 9/2002 | Jones et al. | |
| 2002/0130049 A1 | 9/2002 | Chen et al. | |
| 2002/0130634 A1 | 9/2002 | Ziemkowski et al. | |
| 2002/0146963 A1 | 10/2002 | Teetzel | |
| 2002/0148732 A1 | 10/2002 | Emesh et al. | |
| 2003/0013397 A1 | 1/2003 | Rhoades | |
| 2003/0034131 A1 | 2/2003 | Park et al. | |
| 2003/0040188 A1 | 2/2003 | Hsu et al. | |
| 2003/0114087 A1 | 6/2003 | Duboust et al. | |
| 2003/0116445 A1 | 6/2003 | Sun et al. | |
| 2003/0209448 A1 | 11/2003 | Hu et al. | |
| 2003/0213703 A1 | 11/2003 | Wang et al. | |
| 2003/0220053 A1 | 11/2003 | Manens et al. | |
| 2004/0020788 A1 | 2/2004 | Mavliev et al. | |
| 2004/0020789 A1 | 2/2004 | Hu | |
| 2004/0082288 A1 | 4/2004 | Tietz et al. | |
| 2004/0121708 A1 | 6/2004 | Hu et al. | |
| 2004/0134792 A1 | 7/2004 | Butterfield et al. | |
| 2004/0163946 A1 | 8/2004 | Chang et al. | |
| 2004/0266327 A1 | 12/2004 | Chen et al. | |
| 2005/0000801 A1 | 1/2005 | Wang et al. | |
| 2005/0092621 A1 | 5/2005 | Hu et al. | |
| 2005/0133363 A1 | 6/2005 | Hu et al. | |
| 2005/0161341 A1 | 7/2005 | Duboust et al. | |
| 2005/0178666 A1 | 8/2005 | Tsai et al. | |
| 2005/0194681 A1 | 9/2005 | Hu et al. | |

FOREIGN PATENT DOCUMENTS

| | | |
|---|---|---|
| EP | 0 455 455 A2 | 11/1991 |
| EP | 1361023 | 11/2003 |
| EP | 1 368 826 A1 | 12/2003 |
| JP | 58-171264 | 10/1983 |
| JP | 61-079666 | 4/1986 |
| JP | 61265279 | 11/1986 |
| JP | 63-028512 | 2/1988 |
| JP | 05277957 | 10/1993 |
| JP | 06-047678 | 2/1994 |
| JP | 10-006213 | 1/1998 |
| JP | 11042554 | 2/1999 |
| JP | 2870537 | 3/1999 |
| JP | 2000-218513 | 8/2000 |
| JP | 11-216663 | 12/2000 |
| JP | 2001-77117 | 3/2001 |
| JP | 2001-179611 | 7/2001 |
| JP | 2001-244223 | 9/2001 |
| JP | 2002-334858 | 11/2002 |

| | | |
|---|---|---|
| JP | 3453352 | 10/2003 |
| KR | 2003-037158 | 5/2003 |
| SU | 1618538 | 1/1991 |
| WO | WO 93/15879 | 8/1993 |
| WO | WO 98/49723 | 11/1998 |
| WO | WO 99/41434 | 8/1999 |
| WO | WO 99/53119 | 10/1999 |
| WO | WO 99/65072 | 12/1999 |
| WO | WO 00/03426 | 1/2000 |
| WO | WO 00/26443 | 5/2000 |
| WO | WO 00/33356 | 6/2000 |
| WO | WO 00/59682 | 10/2000 |
| WO | WO 00/71297 | 11/2000 |
| WO | WO 01/13416 | 2/2001 |
| WO | WO 01/49452 | 7/2001 |
| WO | WO 01/52307 | 7/2001 |
| WO | WO 01/63018 | 8/2001 |
| WO | WO 01/71066 | 9/2001 |
| WO | WO 01/88229 | 11/2001 |
| WO | WO 01/88954 | 11/2001 |
| WO | WO 02/23616 | 3/2002 |
| WO | WO 02/064314 | 8/2002 |
| WO | WO 03/001581 | 1/2003 |

OTHER PUBLICATIONS

European Search Report for 03252801.0, dated Jan. 16, 2004 (AMAT/7047.EP).

PCT International Search Report and Written Opinion dated Apr. 28, 2005 for PCT/US04/037870. (AMAT/4100PC09).

Alexander, Jr., "Electrically Conductive Polymer Nanocomposite Materials", http://www.afrlhorizons.com/Briefs/Sept02/ML0206.html printed Feb. 19, 2003.

Contolini, "Electrochemical Planarization of ULSI Copper," Solid State Technology, vol. 40, No. 6, Jun. 1, 1997.

Copy of Search Report issued by the Austrian Patent Office for corresponding Singapore Patent Application No. 200302562-4, provided by letter dated Oct. 7, 2004.

Communication pursuant to Article 96(2) EPC for Application No. 02728965.4, dated Jun. 11, 2004 (4100 EP 02).

Partial International Search / PCT Invitation to pay additional fees dated Nov. 14, 2002 (4100 PC 02).

Notification regarding review of justification for invitation to pay additional fees for PCT/US/02/11009 (4100 PC 02) dated Feb. 25, 2003.

Notification of Transmittal of International Preliminary Examination Report dated Nov. 10, 2003 (4100 EP 02).

PCT Written Opinion dated Apr. 1, 2003 for PCT/US02/11009. (4100 EP 02).

Notification of Transmittal of International Preliminary Examination Report and Written Opinion dated Feb. 21, 2005 (4100 PCT).

Invitation to pay additional fees dated Nov. 11, 2004 (4100 P5 PCT).

Notification of transmittal of the International Search report and Written Opinion dated Mar. 14, 2005 (4100 P5 PCT).

EP Search Report for Application No. 03254807.5 dated Sep. 27, 2005. (APPM/004100.P2(Y3).

* cited by examiner

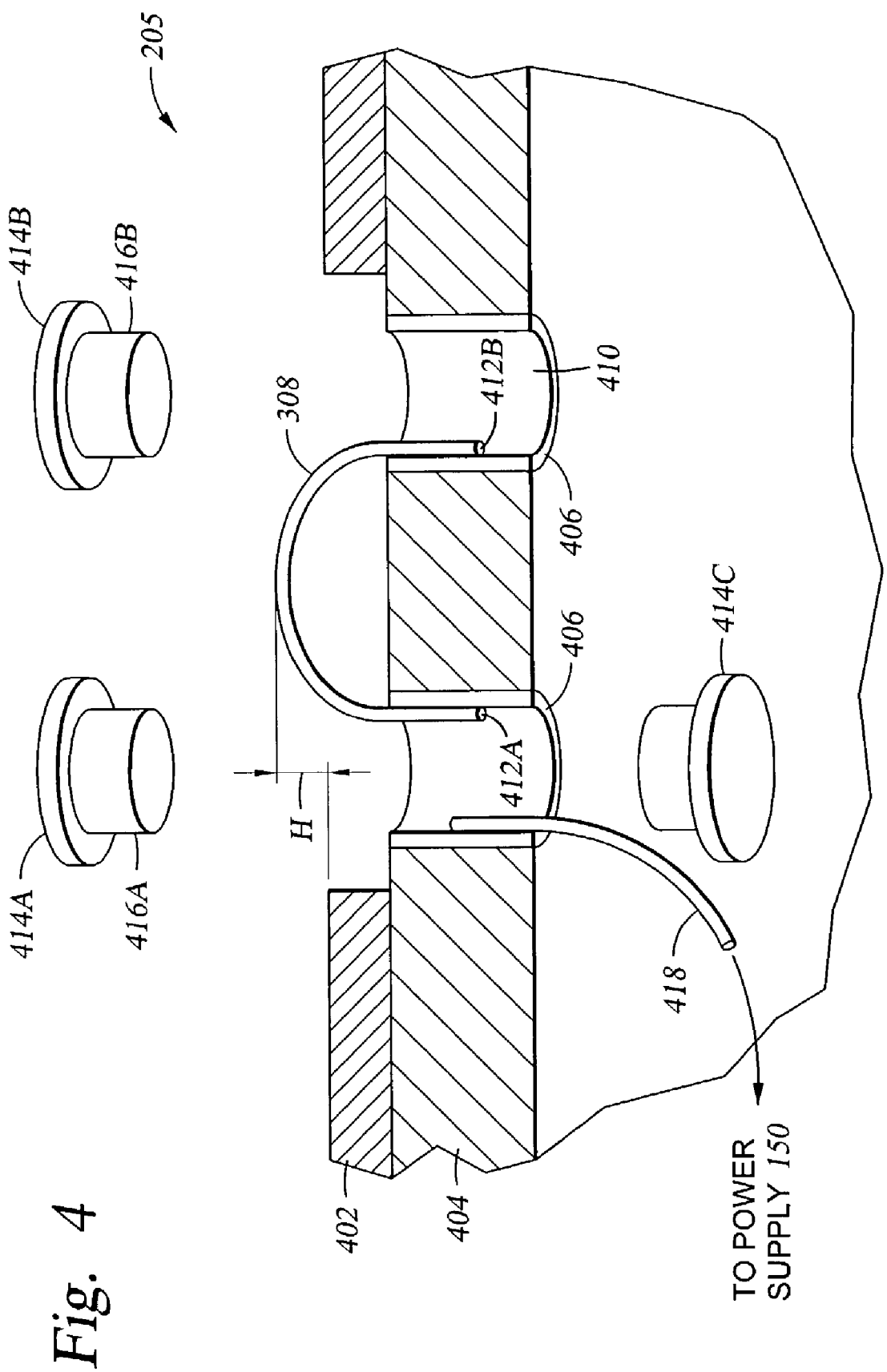

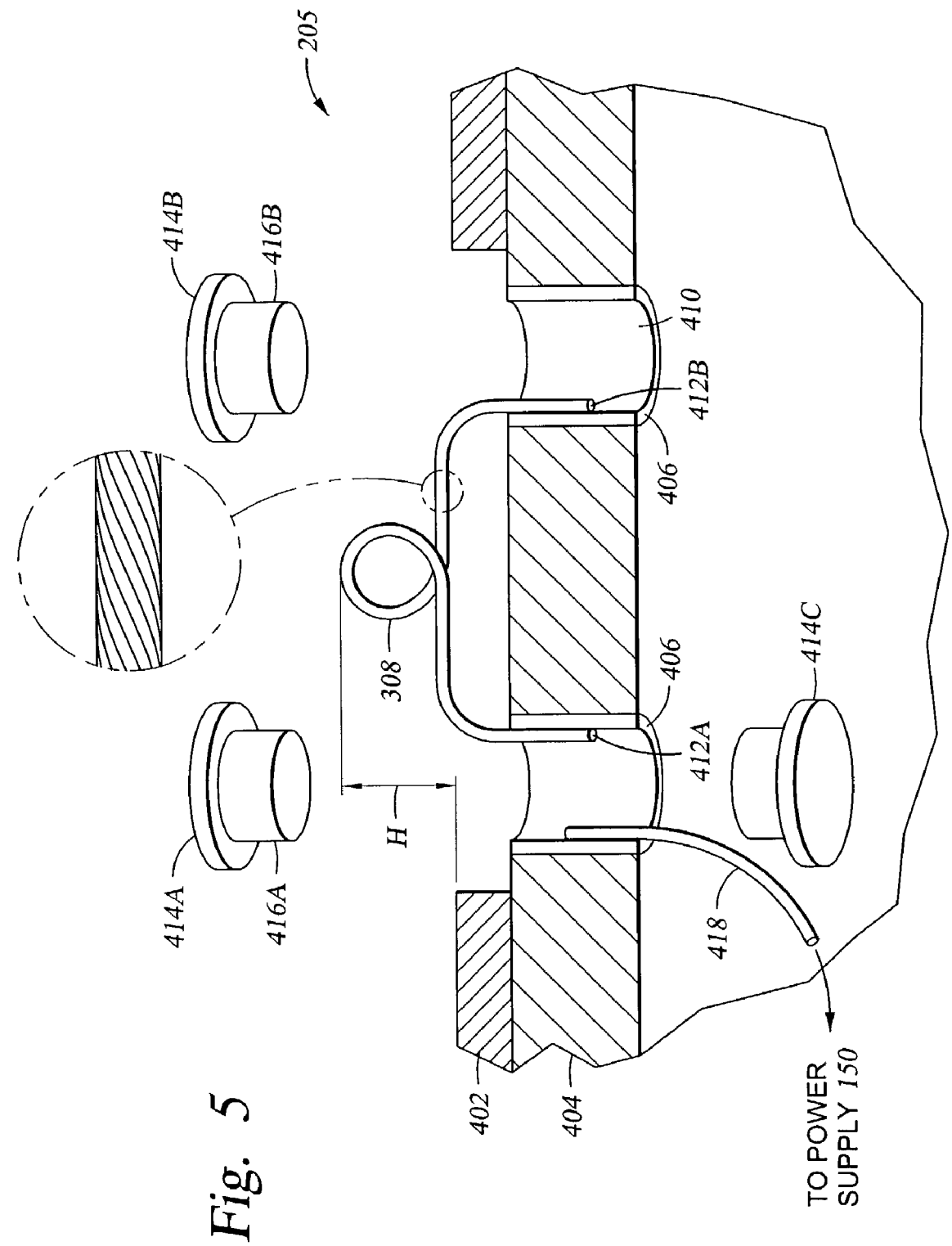

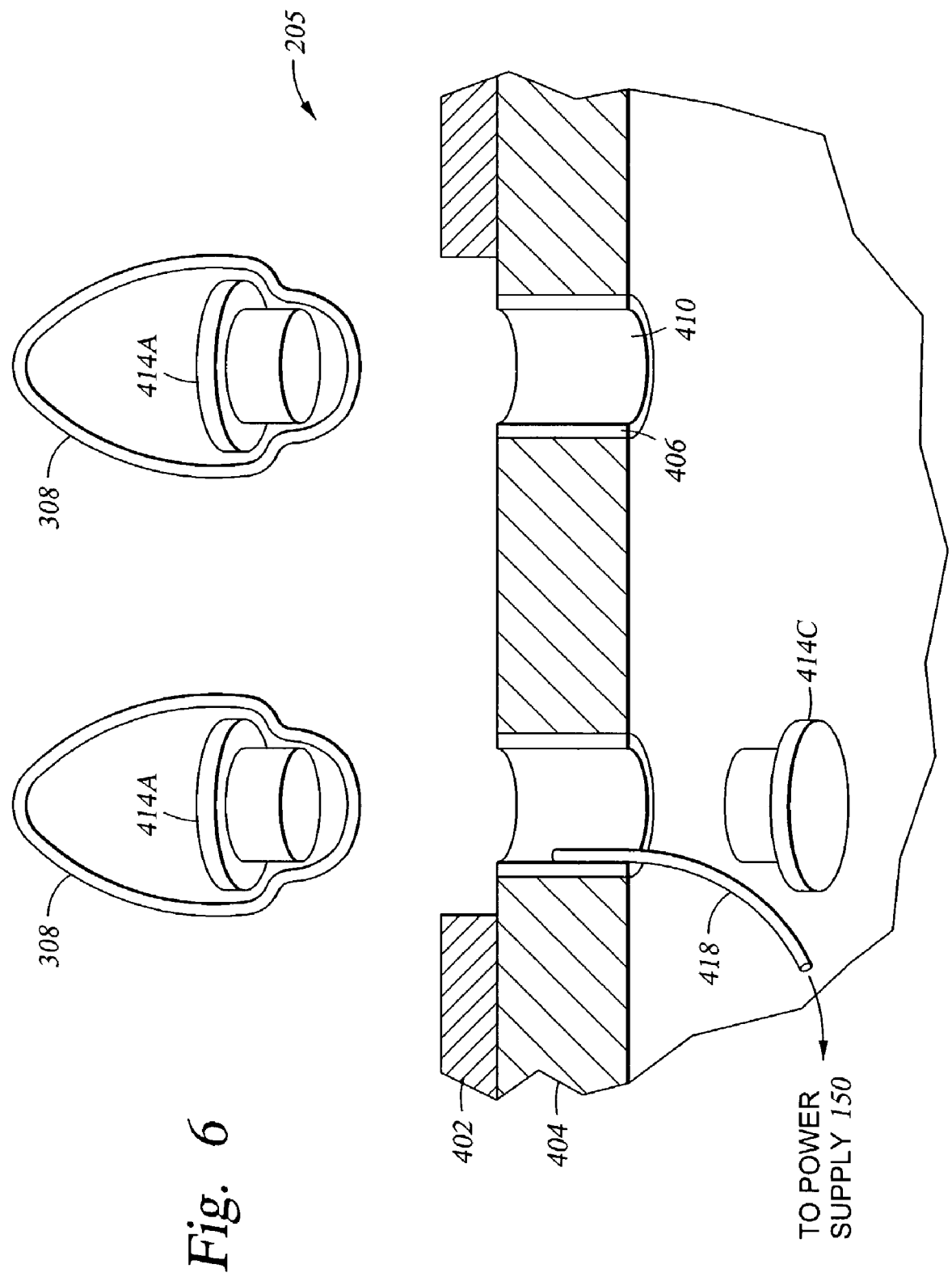

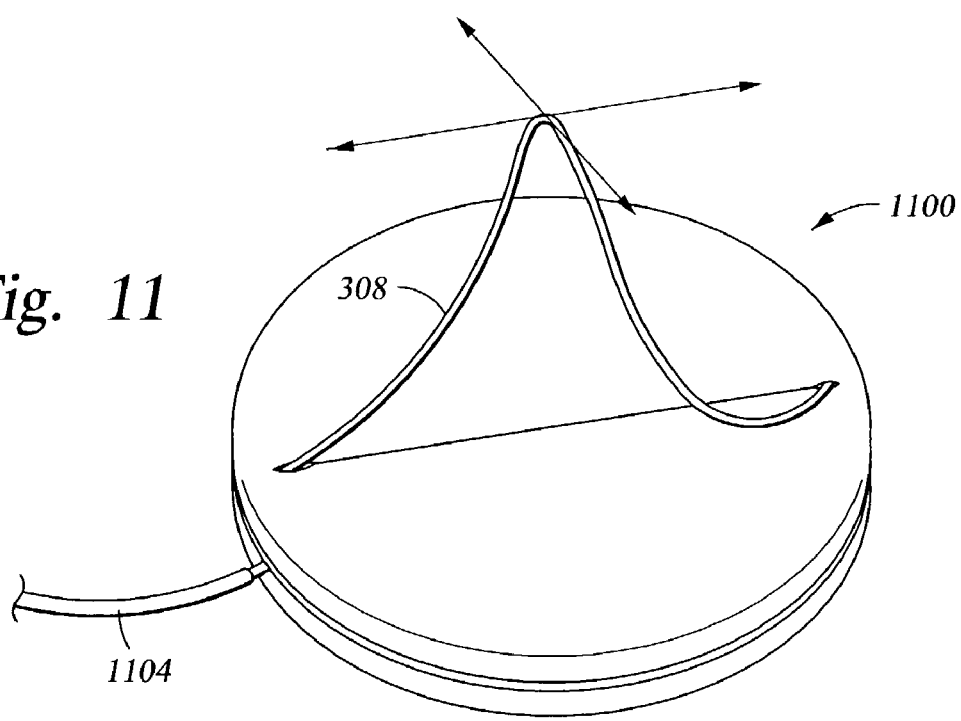
*Fig. 11*
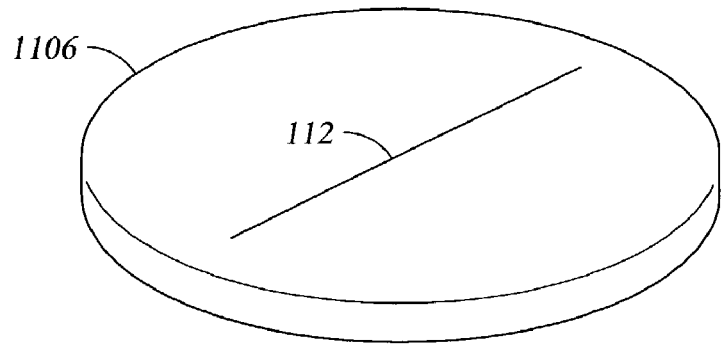
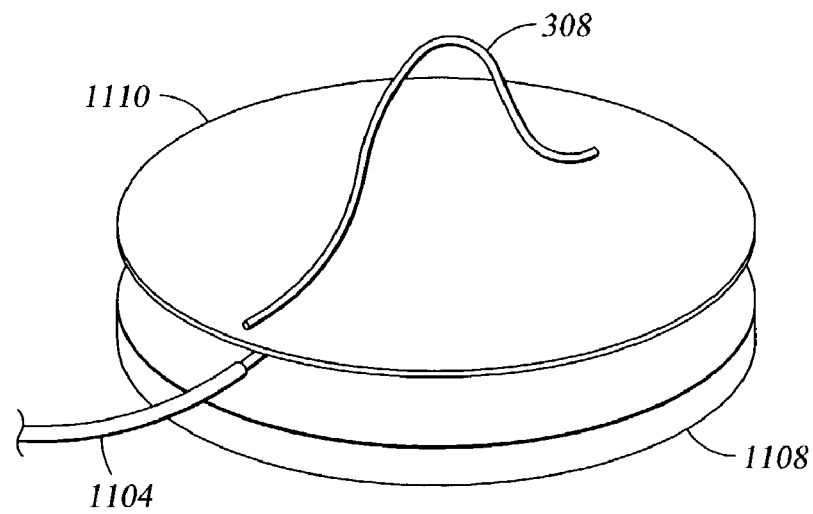
*Fig. 12*

CONTACTS FOR ELECTROCHEMICAL PROCESSING

This application is a continuation-in-part of U.S. patent application Ser. No. 09/505,899 (AMAT/4100), filed on Feb. 17, 2000, now U.S. Pat. No. 6,537,144 and a continuation-in-part of co-pending U.S. patent application Ser. No. 10/033,732 (AMAT/4100.P1), filed on Dec. 27, 2001, which are incorporated herein by reference.

BACKGROUND OF THE INVENTION

1. Field of the Invention

The present invention generally relates to polishing, planarization, plating and combinations thereof. More particularly, the invention relates to contacts for electro-chemical mechanical polishing and/or electropolishing.

2. Description of the Related Art

Sub-micron multi-level metallization is one of the key technologies for the next generation of ultra large-scale integration (ULSI). The multilevel interconnects that lie at the heart of this technology require planarization of interconnect features formed in high aspect ratio apertures, including contacts, vias, trenches and other features. Reliable formation of these interconnect features is very important to the success of ULSI and to the continued effort to increase circuit density and quality on individual substrates and die.

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electro-chemical plating (ECP).

As layers of materials are sequentially deposited and removed, the uppermost surface of the substrate may become non-planar across its surface and require planarization. An example of non-planar process is the deposition of copper films with the ECP process in which the copper topography simply follows the already existing non-planar topography of the wafer surface, especially for lines wider than 10 microns. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Chemical Mechanical Planarization, or Chemical Mechanical Polishing (CMP), is a common technique used to planarize substrates. CMP utilizes a chemical composition, typically a slurry or other fluid medium, for selective removal of materials from substrates. In conventional CMP techniques, a substrate carrier or polishing head is mounted on a carrier assembly and positioned in contact with a polishing pad in a CMP apparatus. The carrier assembly provides a controllable pressure to the substrate, thereby pressing the substrate against the polishing pad. The pad is moved relative to the substrate by an external driving force. The CMP apparatus effects polishing or rubbing movements between the surface of the substrate and the polishing pad while dispersing a polishing composition to affect chemical activities and/or mechanical activities and consequential removal of materials from the surface of the substrate.

Another planarization technique is Electro Chemical Mechanical Polishing (ECMP). ECMP techniques remove conductive materials from a substrate surface by electro-chemical dissolution while concurrently polishing the substrate with reduced mechanical abrasion compared to conventional CMP processes. The electrochemical dissolution is performed by applying a bias between a cathode and a substrate surface to remove conductive materials from the substrate surface into a surrounding electrolyte. Typically, the bias is applied to the substrate surface by a ring of conductive contacts in a substrate support device, such as a substrate carrier head. Mechanical abrasion is performed by positioning the substrate in contact with conventional polishing pads and providing relative motion there between.

Despite some advantages over other polishing techniques, conventional ECMP poses some problems of its own. One important aspect of ECMP which presents difficulties is maintaining a sufficient and uniform bias on the substrate. In this regard, the use of a contact ring has proven undesirable in some cases because such devices exhibit non-uniform distribution of current over the substrate surface, which results in non-uniform dissolution. Additionally, the polishing pad may be composed of insulative materials that may interfere with the application of bias to the substrate surface and result in non-uniform or variable dissolution of material from the substrate surface.

As a result, there is a need for an improved polishing article for the removal of conductive material on a substrate surface.

SUMMARY OF THE INVENTION

The present invention provides methods of eletrochemical processing, eletrochemical processing systems and polishing articles used with eletrochemical processing systems.

One embodiment provides a polishing article for electro-chemical mechanical polishing, comprising: a body defining a outer surface; and a conductive contact element at least partially disposed through the pad body and positionable in a substrate contact position, and wherein the conductive contact element comprises at least two wires in contact with one another and defining a substrate contact surface. In one embodiment, the body is a polishing pad and the outer surface is a polishing surface.

Another embodiment of a polishing article for electro-chemical processing comprises: a body defining a outer surface; and a conductive contact element at least partially disposed through the pad body and positionable in a substrate contact position, and wherein the conductive contact element comprises a wire portion and a relatively enlarged portion disposed on the wire portion and defining a substrate contact surface. In one embodiment, the body is a polishing pad and the outer surface is a polishing surface.

Another embodiment provides a current conducting assembly for electrochemical processing, comprising: an insulating member defining a plurality of contact element retaining openings; a conducting surface disposed on the insulating member; and a plurality of contact elements each having a first end disposed in one of the plurality of contact element retaining openings and a second end disposed on the conducting surface, wherein a portion of each of the plurality of contact elements defines a substrate contact surface.

Yet another embodiment provides a polishing article for electrochemical processing, comprising: a body defining an outer surface; and an elongated assembly disposed in the body and at least partially recessed below the polishing surface. The elongated assembly comprises: at least one elongated conductive member; and a conductive wire wound around and in contact with the least one elongated conductive member and forming at least two loops each comprising a portion at least partially extending over the outer surface, wherein the portion of the at least two loops defines a substrate contact surface.

Yet another embodiment provides a polishing article for electrochemical processing, comprising: a body defining an outer surface; and an elongated assembly disposed in the body and at least partially recessed below the outer surface. The elongated assembly comprises: at least one elongated conductive member; and a noble-metal-containing conductive sheet wrapped around and in contact with the least one elongated conductive member and defining a substrate contact surface.

Yet another embodiment provides an electrochemical processing system, comprising: a cell body defining an electrolyte-containing volume; an electrode disposed in the electrolyte-containing volume; a polishing pad disposed in the electrolyte-containing volume and comprising: (i) a pad body defining a polishing surface; and (ii) a conductive contact element at least partially disposed through the pad body and extending over the polishing surface, wherein the contact element comprises at least two wire strands; and a power supply coupled to the electrode and the contact element.

Yet another embodiment provides a method for electrochemically processing a substrate comprising a conductive surface, the method comprising: providing a pad defining a polishing surface and comprising a conductive contact element disposed through the pad, wherein the conductive contact element comprises at least two wires defining a substrate contact surface at an upper end; placing the conductive surface of the substrate in contact with the polishing surface of pad and with the substrate contact surface of the conductive contact element in presence of electrolytic fluid; and providing a bias to the substrate via the conductive contact element.

Yet another embodiment provides a polishing article for electrochemical processing, comprising: a body defining an outer surface; and a conductive rotating contact element rotatably disposed in the body and having at least a portion positionable in a substrate contact position (e.g., at or over the outer surface) in which the conductive rotating contact element contacts a substrate surface during electrochemical processing. In some embodiments, the contact pressure is controlled to provide good and reliable electrical contact while preventing damage to the substrate surface being polished.

Yet another embodiment provides a current conducting assembly for electrochemical processing, comprising: a housing; and a current-providing conductive rotatable contact element rotatably disposed in the housing and having at least a substrate contact portion positionable at a substrate contact position to rotatably contact a substrate surface during electrochemical mechanical polishing.

Still another embodiment provides an electrochemical processing system, comprising: a cell body defining an electrolyte-containing volume; an electrode disposed in the electrolyte-containing volume; a polishing pad disposed in the electrolyte-containing volume and comprising: (i) a pad body defining a polishing surface; and (ii) at least one conductive rotatable contact element at least partially disposed through the pad body and extending over the polishing surface and rotatable with respect to the polishing pad, wherein the conductive rotatable contact element is adapted to contact a substrate surface during electrochemical processing and rotate relative to the substrate surface; and a power supply coupled to the electrode and the contact element.

Still another embodiment provides a contact assembly for electrochemical processing, comprising: a housing comprising a seat and defining a passageway having a restricted opening at one end defined by the seat; a contact element connectable to a power supply; and a conductive rotatable contact element rotatably disposed in the passageway and having a degree of axial freedom therein and having at least a substrate contact portion positionable beyond the housing and adapted to rotatably contact a substrate surface during electrochemical processing and wherein the conductive rotatable contact element is positionable in at least a first position to be separated from the contact element and a second position to be in contact with the contact element.

Yet another embodiment provides a method for electrochemical processing a substrate comprising a conductive surface, the method comprising: providing a pad defining a polishing surface; providing a conductive rotating contact element rotatably disposed in the pad body; placing a conductive surface of the substrate in contact with the polishing surface of pad and the conductive rotating contact element; delivering a current to the conductive rotating contact element; and causing relative motion between the substrate and the pad, whereby the conductive rotating contact element is rotated over the substrate while in contact with the substrate.

Still another embodiment provides an electrochemical processing contact assembly, comprising: a support body; a conductive housing disposed in the support body; a removable insulative plug disposed in the support body; and an electrically conductive wire contact wrapped about the removable insulative plug and forming an arch defining a substrate contact surface at an apex.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 is a partial perspective view of the polishing article of FIG. 3 illustrating one embodiment for securing the wire contact element;

FIG. 5 is a partial perspective view of the polishing article of FIG. 3 illustrating another embodiment of the wire contact element;

FIG. 6 is a partial perspective view of the polishing article of FIG. 3 illustrating another embodiment of the wire contact element;

FIG. 11 is a perspective view of another embodiment of a wire contact element carrier disposable on a polishing article;

FIG. 12 is an exploded perspective view of the element carrier of FIG. 11;

To facilitate understanding, identical reference numerals have been used, wherever possible, to designate identical elements that are common to the figures.

DETAILED DESCRIPTION OF THE PREFERRED EMBODIMENT

The present invention provides methods of polishing, electropolishing systems and polishing articles used with electropolishing systems.

The words and phrases used herein should be given their ordinary and customary meaning in the art by one skilled in the art unless otherwise further defined. Chemical-mechanical polishing should be broadly construed and includes, but is not limited to, abrading a substrate surface by chemical activities, mechanical activities, or a combination of both chemical and mechanical activities. Electropolishing should be broadly construed and includes, but is not limited to, planarizing a substrate by the application of electrical and/or electrochemical activity. Electrochemical mechanical polishing (ECMP) should be broadly construed and includes, but is not limited to, planarizing a substrate by the application of electrochemical activity, mechanical activity, or a combination of both electrochemical and mechanical activity to remove materials from a substrate surface. Electroplating should be broadly construed and includes, but is not limited to, electrochemically depositing material on a substrate by the application of electrochemical activity, mechanical activity, or a combination of both electrochemical and mechanical activity. Electrochemical mechanical plating process (ECMPP) should be broadly construed and includes, but is not limited to, electrochemically depositing material on a substrate and concurrently planarizing the deposited material by the application of electrochemical activity, mechanical activity, or a combination of both electrochemical and mechanical activity.

Anodic dissolution should be broadly construed and includes, but is not limited to, the application of an anodic bias to a substrate directly or indirectly which results in the removal of conductive material from a substrate surface and into a surrounding electrolyte solution.

In general, any of the above-defined polishing techniques may be used, individually or in combination. Further, it is contemplated that polishing and plating may occur simultaneously, alternately or exclusively. The foregoing embodiments are broadly and collectively characterized as electrochemical processing.

Figure 1:
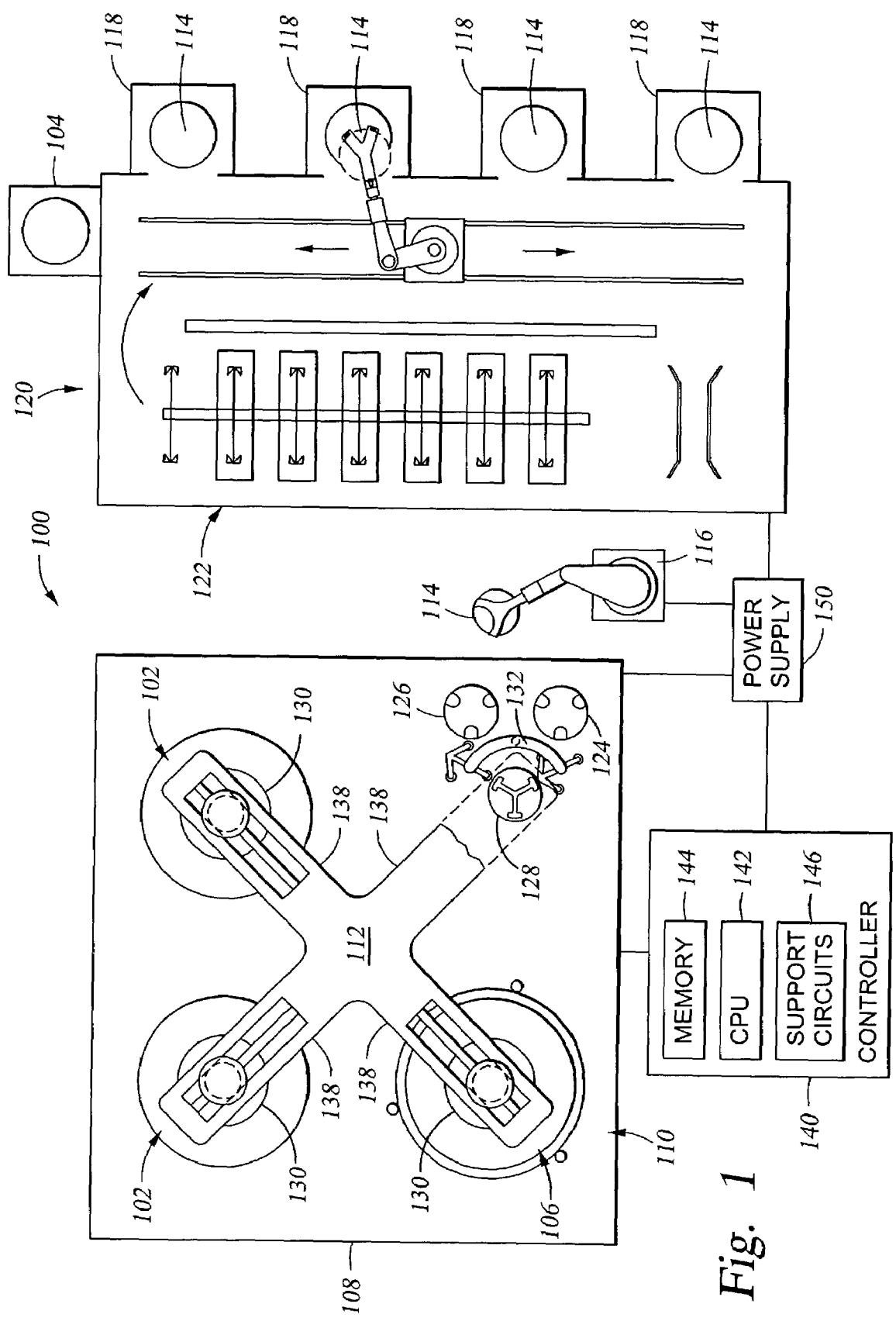
FIG. 1 is a plan view of one embodiment of a processing apparatus of the invention.

FIG. 1 depicts a processing apparatus 100 having at least one station suitable for electrochemical deposition and chemical mechanical polishing, such as electrochemical mechanical polishing (ECMP) station 102 and at least one conventional polishing or buffing station 106 disposed on a single platform or tool. One polishing tool that may be adapted to benefit from the invention is a REFLEXION® chemical mechanical polisher available from Applied Materials, Inc. located in Santa Clara, Calif. Another polishing tool that may be adapted to benefit from the invention is a MIRRA MESA® chemical mechanical polisher available from Applied Materials, Inc. located in Santa Clara, Calif.

The exemplary apparatus 100 generally includes a base 108 that supports one or more ECMP stations 102, one or more polishing stations 106, a transfer station 110 and a carousel 112. The transfer station 110 generally facilitates transfer of substrates 114 to and from the apparatus 100 via a loading robot 116. The loading robot 116 typically transfers substrates 114 between the transfer station 110 and a factory interface 120 that may include a cleaning module 122, a metrology device 104 and one or more substrate storage cassettes 118. One example of a metrology device 104 is a NovaScan™ Integrated Thickness Monitoring system, available from Nova Measuring Instruments, Inc., located in Phoenix, Ariz.

Alternatively, the loading robot 116 (or factory interface 120) may transfer substrates to one or more other processing tools (not shown) such as a chemical vapor deposition tool, physical vapor deposition tool, etch tool and the like.

In one embodiment, the transfer station 110 comprises at least an input buffer station 124, an output buffer station 126, a transfer robot 132, and a load cup assembly 128. The loading robot 116 places the substrate 114 onto the input buffer station 124. The transfer robot 132 has two gripper assemblies, each having pneumatic gripper fingers that hold the substrate 114 by the substrate's edge. The transfer robot 132 lifts the substrate 114 from the input buffer station 124 and rotates the gripper and substrate 114 to position the substrate 114 over the load cup assembly 128, then places the substrate 114 down onto the load cup assembly 128.

The carousel 112 generally supports a plurality of polishing heads 130, each of which retains one substrate 114 during processing. The carousel 112 transfers the polishing heads 130 between the transfer station 110, the one or more ECMP stations 102 and the one or more polishing stations 106. One carousel 112 that may be adapted to benefit from the invention is generally described in U.S. Pat. No. 5,804,507, issued Sep. 8, 1998 to Tolles et al., which is hereby incorporated by reference to the extent it is not inconsistent with the claims and disclosure herein.

Generally, the carousel 112 is centrally disposed on the base 108. The carousel 112 typically includes a plurality of arms 138. Each arm 138 generally supports one of the polishing heads 130. One of the arms 138 depicted in FIG. 1 is not shown so that the transfer station 110 may be seen. The carousel 112 is indexable such that the polishing head 130 may be moved between the stations 102, 106 and the transfer station 110 in a sequence defined by the user.

Generally the polishing head 130 retains the substrate 114 while the substrate 114 is disposed in the ECMP station 102 or polishing station 106. The arrangement of the ECMP stations 106 and polishing stations 102 on the apparatus 100 allow for the substrate 114 to be sequentially plated or polished by moving the substrate between stations while being retained in the same polishing head 130.

To facilitate control of the polishing apparatus 100 and processes performed thereon, a controller 140 comprising a central processing unit (CPU) 142, memory 144, and support circuits 146, is connected to the polishing apparatus 100. The CPU 142 may be one of any form of computer processor that can be used in an industrial setting for controlling various drives and pressures. The memory 144 is connected to the CPU 142. The memory 144, or computer-readable medium, may be one or more of readily available memory such as random access memory (RAM), read only memory (ROM), floppy disk, hard disk, or any other form of digital storage, local or remote. The support circuits 146 are connected to the CPU 142 for supporting the processor in a conventional manner. These circuits include cache, power supplies, clock circuits, input/output circuitry, subsystems, and the like.

Power to operate the polishing apparatus 100 and/or the controller 140 is provided by a power supply 150. Illustratively, the power supply 150 is shown connected to multiple components of the polishing apparatus 100, including the transfer station 110, the factory interface 120, the loading robot 116 and the controller 140. In other embodiments separate power supplies are provided for two or more components of the polishing apparatus 100.

Figure 2:
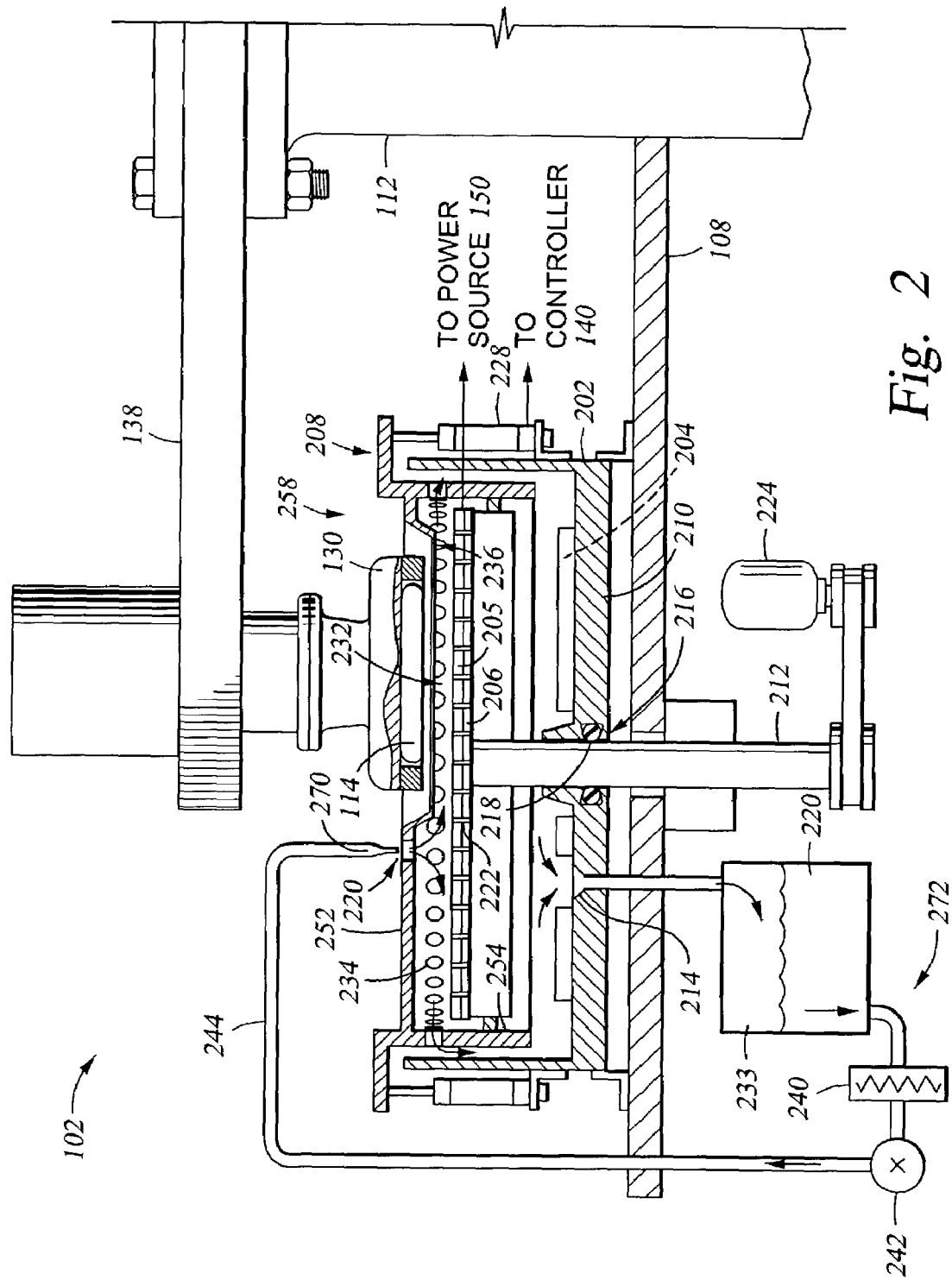
FIG. 2 is a sectional view of one embodiment of an ECMP station.

FIG. 2 depicts one embodiment of the electrochemical mechanical polishing (ECMP) station 102 of FIG. 1. Generally, the ECMP station 102 comprises a polishing head 130 adapted to retain the substrate 214. Illustratively, the polishing head 130 is a cantilever mounted to a carousel 211 by a brace 237. The carousel 211 operates to rotate the polishing head 130 to a position over various stations, including the ECMP station 102. Examples of embodiments of polishing heads 130 that may be used with the polishing apparatus 102 described herein are described in U.S. Pat. No. 6,024,630, issued Feb. 25, 2000 to Shendon, et al. One particular polishing head that may be adapted to be used is a TITAN HEAD™ wafer carrier, manufactured by Applied Materials, Inc., located in Santa Clara, Calif.

The ECMP station 102 further includes a basin 202, an electrode 204, polishing article 205, a pad support disc 206 and a cover 208. In one embodiment, the basin 202 is coupled to a base 207 of the polishing apparatus 102. The basin 202, the cover 208, and the disc 206 may be movably disposed relative to the base 207. Accordingly, the basin 202, cover 208 and disc 206 may be axially moved toward the base 207 to facilitate clearance of the polishing head 130 as the carousel 211 indexes the substrate 214 between the ECMP 102 and other polishing stations (not shown).

The basin 202 generally defines a container or electrolyte-containing volume 232 in which a conductive fluid such as an electrolyte 220 (shown in a reservoir 233) can be confined and in which the electrode 204, polishing article 205, and disc 206 are generally housed. The electrolyte 220 used in processing the substrate 214 can electrochemically remove metals such as copper, aluminum, tungsten, gold, silver or other conductive materials. Accordingly, the basin 202 can be a bowl-shaped member made of a plastic such as fluoropolymers, TEFLON®, PFA, PE, PES, or other materials that are compatible with electroplating and electropolishing chemistries.

The basin 202 has a bottom 210 that includes an aperture 216 and a drain 214. The aperture 216 is generally disposed in the center of the bottom 210 and allows a shaft 212 to pass therethrough. A seal 218 is disposed between the aperture 216 and the shaft 212 and allows the shaft 212 to rotate while preventing fluids disposed in the basin 202 from passing through the aperture 216. Rotation is imparted to the shaft 212 by a motor connected to a lower end of the shaft 212. The motor may be an actuator capable of rotating the shaft at a predefined speed or speeds.

At an upper end, the shaft carries the disc or pad support 206. The pad support disc 206 provides a mounting surface for the polishing article 205, which may be secured to the disc 206 by a clamping mechanism or an adhesive (such as a pressure sensitive adhesive). Although shown connected to the shaft 212, in another embodiment, the disc 206 can be secured in the basin 202 using fasteners such as screws or other fastening means, thereby eliminating the need for the shaft 212. The disc 206 can be spaced from the electrode 204 to provide a better electrolyte recirculation.

In one embodiment, the disc 206 may be made from a material compatible with the electrolyte 220 which would not detrimentally affect polishing. Illustratively, the disc 206 may be fabricated from a polymer, for example fluoropolymers, PE, TEFLON®, PFA, PES, HDPE, UHMW or the like. In one embodiment, the disc 206 includes a plurality of perforations or channels formed therein. The perforations are coupled to the perforations of the polishing article 205 which, cooperatively, define channels 222 extending from a lower surface of the disc 206 to an upper surface of the polishing article 205. The provision of the channels 222 make the disc 206 and the polishing article 205 generally permeable to the electrolyte 220. The perforation size and density is selected to provide uniform distribution of the electrolyte 220 through the disc 206 to the substrate 214.

The polishing article 205 can be a pad, a web or a belt of material, which is compatible with the fluid environment and the processing specifications. The polishing article 205 is positioned at an upper end of the basin 202 and supported on its lower surface by the disc 206. In one embodiment, the polishing article 205 includes at least a partially conductive surface of a conductive material for contact with the substrate surface during processing. Accordingly, the polishing article 205 may be a conductive polishing material or a composite of a conductive polishing material disposed in a conventional polishing material. The conductive material may also be inserted between the disc 206 and polishing article 205 with some conductive ends in contact with the substrate during polishing. The conductive polishing materials and the conventional polishing materials generally have mechanical properties which do not degrade under sustained electric fields and are resistant to degradation in acidic or basic electrolytes.

Because the polishing article 205 is at least partially conductive, the polishing article 205 may act as an electrode in combination with the substrate during electrochemical processes. The electrode 204 is a counter-electrode to the polishing article 205 contacting a substrate surface. The electrode 204 may be an anode or cathode depending upon the positive bias (anode) or negative bias (cathode) applied between the electrode 204 and polishing article 205.

For example, depositing material from an electrolyte on the substrate surface, the electrode 204 acts as an anode and the substrate surface and/or polishing article 205 acts as a cathode. When removing material from a substrate surface, such as by dissolution from an applied bias, the electrode 204 functions as a cathode and the substrate surface and/or polishing article 205 may act as an anode for the dissolution process.

The electrode 204 is generally positioned between the disc 206 and the bottom 210 of the basin 202 where it may be immersed in the electrolyte 220. The electrode 204 can be a plate-like member, a plate having multiple holes formed therethrough or a plurality of electrode pieces disposed in a permeable membrane or container. A permeable membrane (not shown) may be disposed between the disc 206 and the electrode 204 to prevent particles or sludge from being released from the electrode 204 into the electrolyte. The permeable membrane may also act as a filter and prevent gas evolution from the counter electrode from reaching the substrate during processing. Pores size and density of the permeable membrane are defined in a way to optimize the process performances.

For electrochemical removal processes, such as anodic dissolution, the electrode 204 may include a non-consumable electrode of a material other than the deposited material, such as platinum for copper dissolution. However, the electrode 204 can also be made of copper for copper polishing, if preferred.

In operation, electrolyte 220 is flowed from a reservoir 233 into the volume 232 via a nozzle 270. The electrolyte 220 is prevented from overflowing the volume 232 by a plurality of holes 234 disposed in a skirt 254. The holes 234 generally provide a path through the cover 208 for the electrolyte 220 exiting the volume 232 and flowing into the lower portion of the basin 202. At least a portion of the holes 234 are generally positioned between a lower surface 236 of the depression 258 and the center portion 252. As the holes 234 are typically higher than the lower surface 236 of the depression 258, the electrolyte 220 fills the volume 232 and is thus brought into contact with the substrate 214 and polishing article 205. Thus, the substrate 214 maintains contact with the electrolyte 220 through the complete range of relative spacing between the cover 208 and the disc 206.

The electrolyte 220 collected in the basin 202 generally flows through the drain 214 disposed at the bottom 210 into the fluid delivery system 272. The fluid delivery system 272 typically includes the reservoir 233 and a pump 242. The electrolyte 220 flowing into the fluid delivery system 272 is collected in the reservoir 233. The pump 242 transfers the electrolyte 220 from the reservoir 233 through a supply line 244 to the nozzle 270 where the electrolyte 220 recycled through the ECMP station 102. A filter 240 is generally disposed between the reservoir 233 and the nozzle 270 to remove particles and agglomerated material that may be present in the electrolyte 220.

Electrolyte solutions may include commercially available electrolytes. For example, in copper containing material removal, the electrolyte may include sulfuric acid, sulfuric acid salt based electrolytes or phosphoric acid, phosphoric acid salt based electrolytes, such as potassium phosphate ($K_3PO_4$), ($NH_4$)$H_2PO_4$, ($NH_4$)$_2HPO_4$, or combinations thereof. The electrolyte may also contain derivatives of sulfuric acid based electrolytes, such as copper sulfate, and derivatives of phosphoric acid based electrolytes, such as copper phosphate. Electrolytes having perchloric acid-acetic acid solutions and derivatives thereof may also be used. Additionally, the invention contemplates using electrolyte compositions conventionally used in electroplating or electropolishing processes, including conventionally used electroplating or electropolishing additives, such as brighteners, chelating agents, and levelers among others. In one aspect of the electrolyte solution, the electrolyte may have a concentration between about 0.2 and about 1.2 Molar of the solution. Preferably, the electrolyte is selected to react with metal but not with the underlying materials, such as the dielectric.

During operation, a potential difference is applied between the electrode 204 and the conductive polishing article 205, which acts as another electrode of opposite polarity with respect to the electrode 204. The substrate 214 being in direct contact with the conductive polishing article 205 will then be at the same potential as the electrode 205. In this manner, a bias may be applied to the substrate 214 via conductive contact elements (described below) embedded in the polishing article 205. Preferably, a current is also flowed through the substrate via the embedded conductive contact elements. The current loop may be completed in the polishing station by transforming atomic substrate materials into ions in the electrolyte. Concurrent mechanical polishing of the substrate 214 is achieved by relative movement between the substrate and the polishing article 205.

The provision of potential difference between the electrode 204 and the substrate 214 allows removal of conductive material, such as copper-containing materials, formed on a substrate surface. Establishing the potential difference may include the application of a voltage of about 15 volts or less to the substrate surface. A voltage between about 0.1 volts and about 10 volts may be used to dissolve copper-containing material from the substrate surface and into the electrolyte. The potential difference may also produce a current density between about 0.1 milliamps/cm$^2$ and about 50 milliamps/cm$^2$, or between about 0.1 amps to about 20 amps for a 200 mm substrate. Preferably, the embedded conductive contact elements in the polishing article 205 have low resistivity (less than 1 Ohm) and are capable of providing high current (greater than 1 amp and preferably between about 10 amps and 20 amps).

The signal provided by the power supply 150 to establish the potential difference and perform the anodic dissolution process may be varied depending upon the requirements for removing material from the substrate surface. For example, a time varying anodic signal may be provided to the conductive polishing article 205. The signal may also be applied by electrical pulse modulation techniques. The electrical pulse modification technique comprises applying a constant current density or voltage over the substrate for a first time period, then applying a constant reverse voltage over the substrate for a second time period, and repeating the first and second steps. For example, the electrical pulse modification technique may use a varying potential from between about −0.1 volts and about −15 volts to between about 0.1 volts and about 15 volts.

In one embodiment, conductive material, such as copper containing material can be removed from at least a portion of the substrate surface at a rate of about 15,000 Å/min or less, such as between about 100 Å/min and about 15,000 Å/min. In one embodiment of the invention where the copper material to be removed is less than 5,000 Å thick, the voltage may be applied to the conductive polishing article 205 to provide a removal rate between about 100 Å/min and about 5,000 Å/min.

Polishing Media: Structure

Particular embodiments of the polishing article 205 will now be described with reference to FIGS. 3–14. It is understood that the following embodiments are merely illustrative and persons skilled in the art will recognize other embodiments within the scope of the invention.

Figure 3:
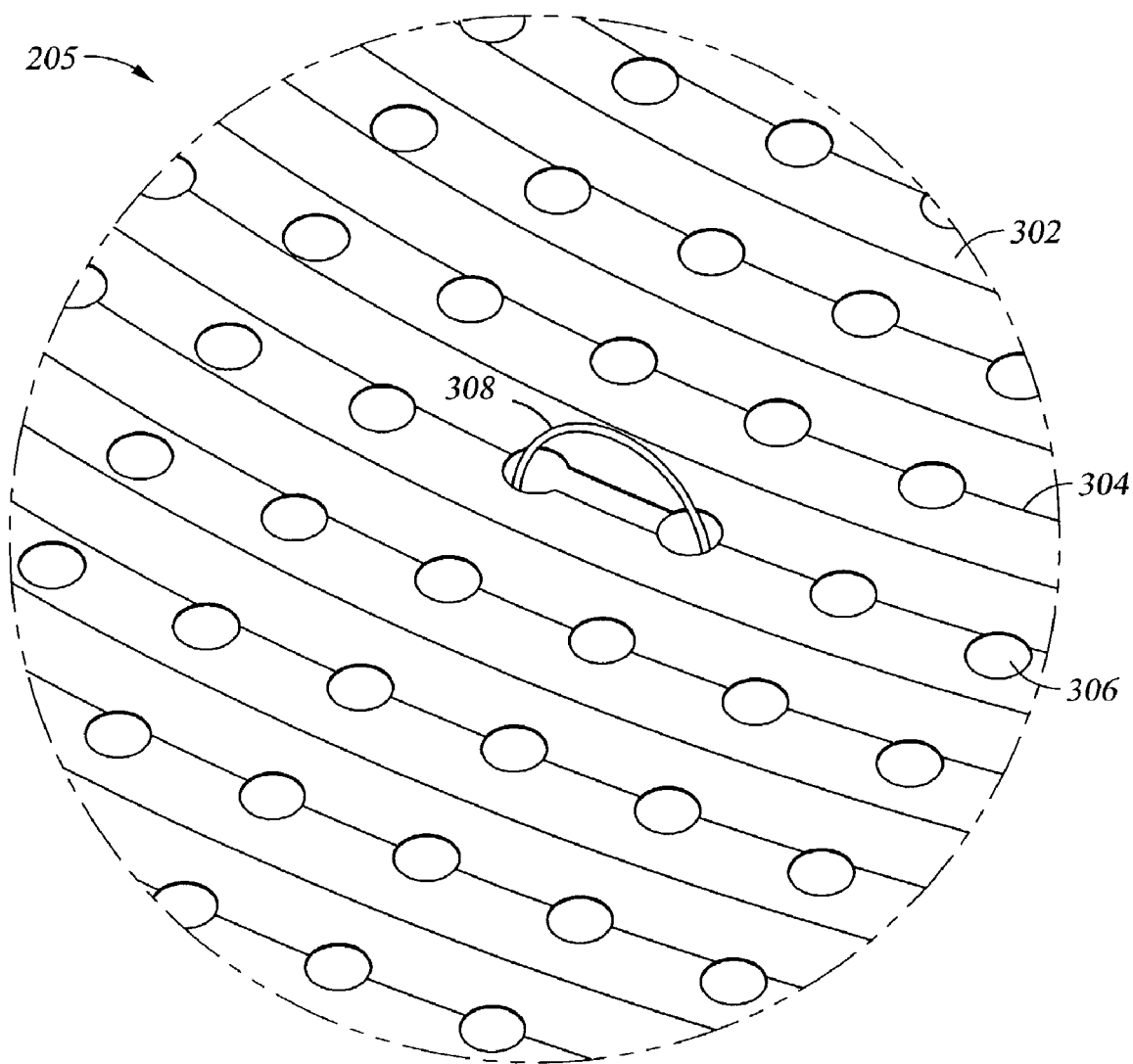
FIG. 3 is a partial perspective view of one embodiment of the polishing article having an exposed wire contact element disposed therethrough.

Referring first FIG. 3, a partial perspective view of one embodiment of the polishing article 205 is shown. In the illustrative embodiment, the polishing article 205 generally includes an upper polishing surface 302 having annular grooves 304 defined therein. However, in a preferred embodiment, the upper polishing surface 302 is smooth (i.e., without grooves). In fact, in some embodiments, the polishing article 205 is not even adapted for polishing (i.e., the polishing article 205 does not have a polishing surface.) and serves primarily as a support body for carrying embedded conductive contact elements (described below). One such embodiment would be in an apparatus for plating. Accordingly, the term "polishing" used in the context of the polishing article 205 is merely for convenience of identifying a preferred embodiment.

Holes 306 defined in the polishing article 205 define the upper terminal ends of the channels 222. A contact element 308 in the form of twisted wires traverses the distance between two adjacent holes 306. The contact element 308 extends some distance over the upper polishing surface 302 to form an arch. For simplicity, only a single contact element 308 is shown. However, the polishing article 205 may be equipped with any number of such contact elements 308. Further, in some embodiments, a single contact element 308 traverses the distance between two or more adjacent holes 306.

In one aspect, the contact element 308 provides limited friction while accommodating multidirectional movement of a substrate. That is, the contact element 308 possesses sufficient flexibility to move in various planar directions, preferably all planar directions. In this manner, the contact element 308 provides good and reliable electrical contact with minimal friction and scratches while polishing a substrate. Further, the wire contact element 308 of FIG. 3 is adaptable to face up or face down processing. In this regard, it is noted that while the ECMP station 102 of FIG. 1 is configured for face down processing, face up processing systems are well known and a detailed description of such systems is not needed.

Referring now to FIG. 4, one embodiment of securing the contact element 308 is shown. In particular, FIG. 4 shows a perspective cross-sectional view of the polishing article 205, in which the polishing article 205 generally comprises an upper polishing pad 402 and a lower support pad 404. In one embodiment, the upper polishing pad 402 is made of polyurethane while the support pad 404 is made of polyetheretherketone (PEEK). The upper polishing pad 402 may be secured to the support pad 404 by a pressure sensitive adhesive (PSA) or any other means of affixing the polishing pad 402 to the support pad 404. Collectively, the upper polishing pad 402 and the support pad 404 define a pad body. However, as used herein, a pad body may be any material which makes up at least a part of the polishing article 205 and may be one or more layers of material. In one aspect, the support pad 404 provides support for both the polishing pad 402 (to achieve a desired degree of flexibility, conformance and/or rigidity) as well as an electrical contact assembly described below. A portion of the upper polishing pad 402 is removed to expose a portion of the underlying support pad 404. As such, the exposed portion of the support pad 404 is recessed below the upper polishing surface of the polishing pad 402 by a distance D. Inserts 406 (which may also referred to herein as hollow inserts, housings or hollow housings) are disposed through the support pad 404 and define openings 410 to each receive an end 412A, 412B of the contact element 308. The inserts 406 may be of any sufficiently conductive material. As such, the inserts 406 may be made of metal or may be plated/coated with a conductive material, for example. In a particular embodiment, the inserts 406 are made of, or are coated with, gold. In the illustrated embodiment, the inserts 406 are hollow; however, in other embodiments the inserts 406 are at least partially filled. The ends 412A, 412B of the contact element 308 are secured to the hollow inserts 406 with insulating members 414A, 414B, respectively. The insulating members 414A, 414B have a lower plug member 416A, 416B which is sized to fit within the openings 410 and to ensure good contact between the inner surfaces of the inserts 406 and the ends 412A–B of the contact element 308. At least one of the hollow inserts 406 is in electrical contact with a wire 418 (or any other conducting element). Illustratively, engagement between the wire 418 and the hollow insert 406 is secured by another insulating inserts 414C. The wire 418 is connected to the power supply 150 (shown in FIG. 1). In this manner, current may be provided to the contact element 308. In the illustrative embodiment, electrical contact between the wire 418 and the contact element 308 is achieved via the hollow insert 406. In another embodiment, the wire 418 and the contact element 308 may be directly connected with one another.

In the embodiment described with respect to FIG. 4, the contact member 308 forms an arch, a portion of which extends some height H above the upper surface of the polishing pad 402. In one embodiment, the height H is between about 1 and 2 mm. More generally, the contact member 308 may assume any geometric shape and height providing sufficient flexibility in various directions. For example, in another embodiment, the contact element 308 defines a loop, as shown in FIG. 5. In yet another embodiment, the contact element defines a partially twisted loop/arch as will be described with reference to FIGS. 11 and 12 below.

FIG. 6 shows yet another embodiment for coupling current from the power supply 150 to the contact element 308. In contrast to the embodiments shown in FIGS. 4–5, a single insulating insert 414A is used to secure the contact element 308 in contact with the conductive hollow insert 406. In this case, a portion of the contact element 308 is wound about the outer surface of the insulating insert 414A, while the upper portion of the contact element 308 forms an arch extending some height over the upper polishing pad 402. In some embodiments, the contact element 308 may be secured to the insulating insert 414A by threading a portion of the contact element 308 through a hole (not shown) formed in the insulating insert 414. However, in any case, a portion of the contact element 308 remains exposed to allow electrical contact with the electrically conductive hollow insert 406 when the insulating insert 414A is disposed in the opening 410.

Figure 7A:
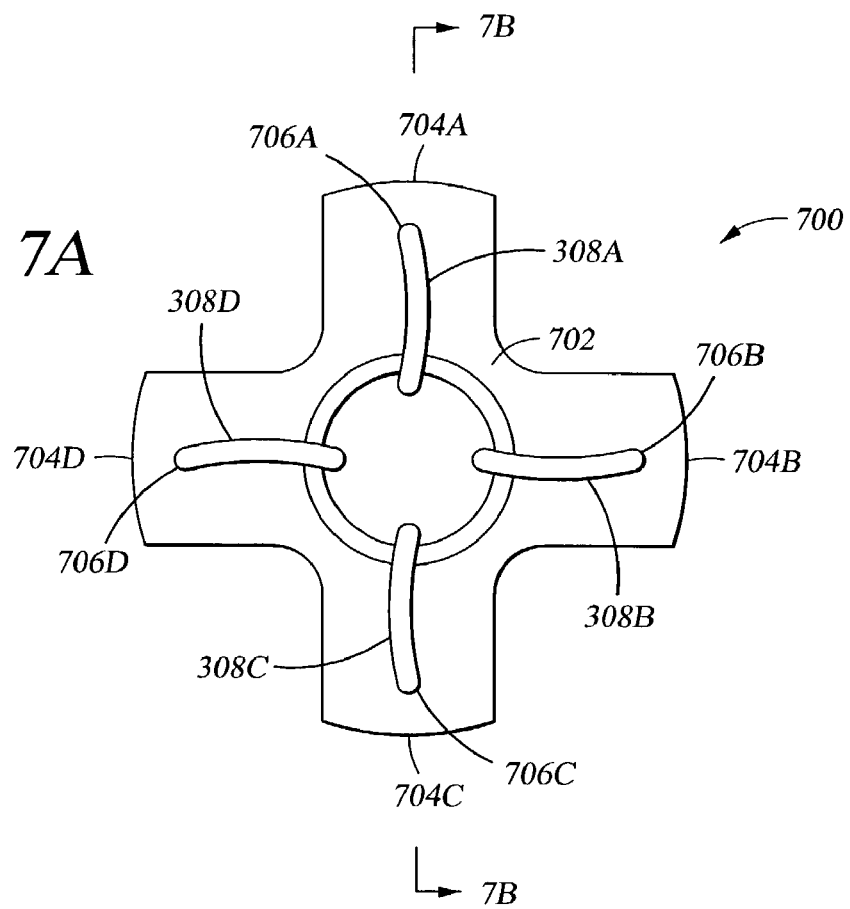
FIG. 7A is a top plan view of one embodiment of a wire contact element carrier.
Figure 7B:
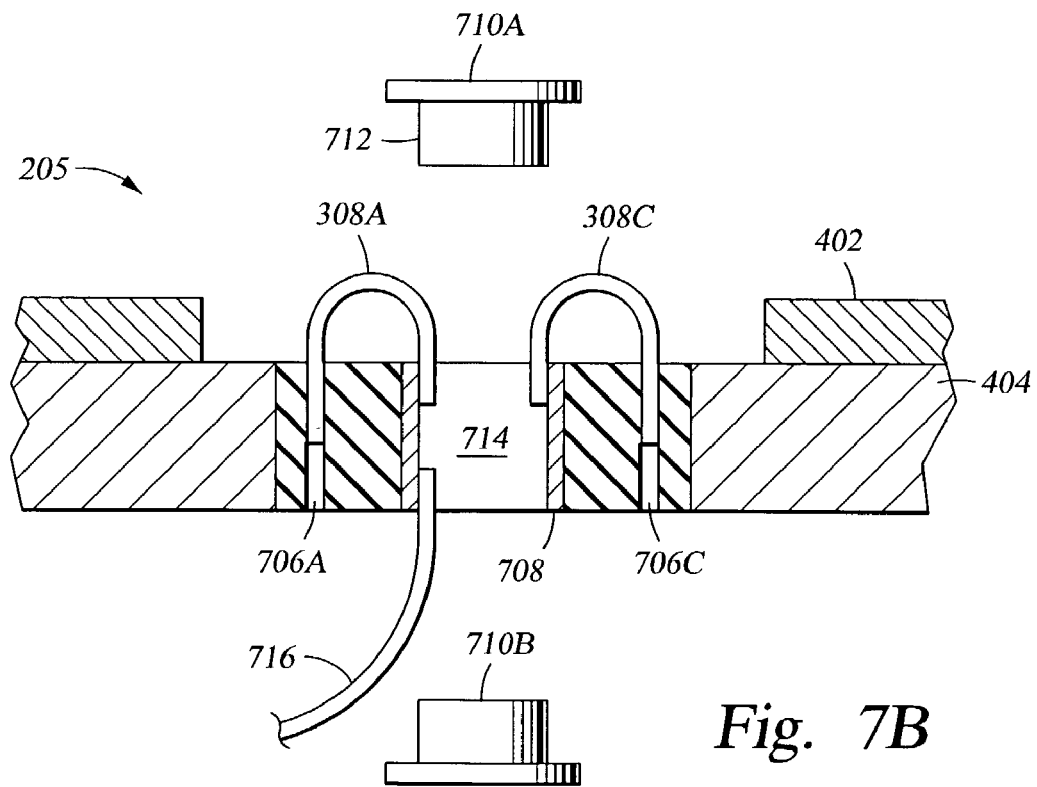
FIG. 7B is a side cross-sectional view of the wire contact element carrier of FIG. 7A.

FIGS. 7A and 7B show yet another embodiment for coupling current from the power supply 150 to contact elements 308. In particular, FIG. 7A shows a top view and FIG. 7B shows a side cross-sectional view, respectively, of a contact element carrier 700. In FIG. 7B, the contact element carrier 700 is shown disposed in a pad body comprising an upper pad 402 and a lower support pad 404. As best seen in FIG. 7A, the contact element carrier 700 is a generally cross-shaped member comprising a body 702 and a plurality of arms 704A–D extending therefrom. The particular shape and number of arms 704 shown in FIG. 7A is merely illustrative; in other embodiments, any number of arms 704 may be provided. Each arm 704 has a hole 706A–D extending therethrough. As shown in FIG. 7B, the holes (706A and 706C shown) extend through the height of the respective arms. However, in other embodiments the holes 706 extend through only a part of the arms. In any case, the holes 706 are sized to receive and retain an end of a contact member 308. The other end of the contact member 308 is disposed against an inner surface of a hollow housing 708 and retained in this position by an insulating member 710A. The insulating member 710A has a lower plug member 712A which is sized to fit within an opening 714 of the hollow housing 708 and to ensure adequate contact between the inner surfaces of the hollow housings 708 and the ends of the contact elements 308A–D. The hollow housing 708 is in electrical contact with a wire 716 (or any other conducting element), which is connected to the power supply 150. Illustratively, engagement between the wire 716 and the hollow housing 708 is secured by another insulating insert 710B. The wire 716 is connected to the power supply 150 (shown in FIG. 1). In this manner, current may be provided to the contact elements 308A–D. In the illustrative embodiment, electrical contact between the wire 716 and the contact elements 308A–D is achieved via the hollow housing 708. In another embodiment, the wire 716 and the contact elements 308A–D may be directly connected with one another.

Figure 8A:
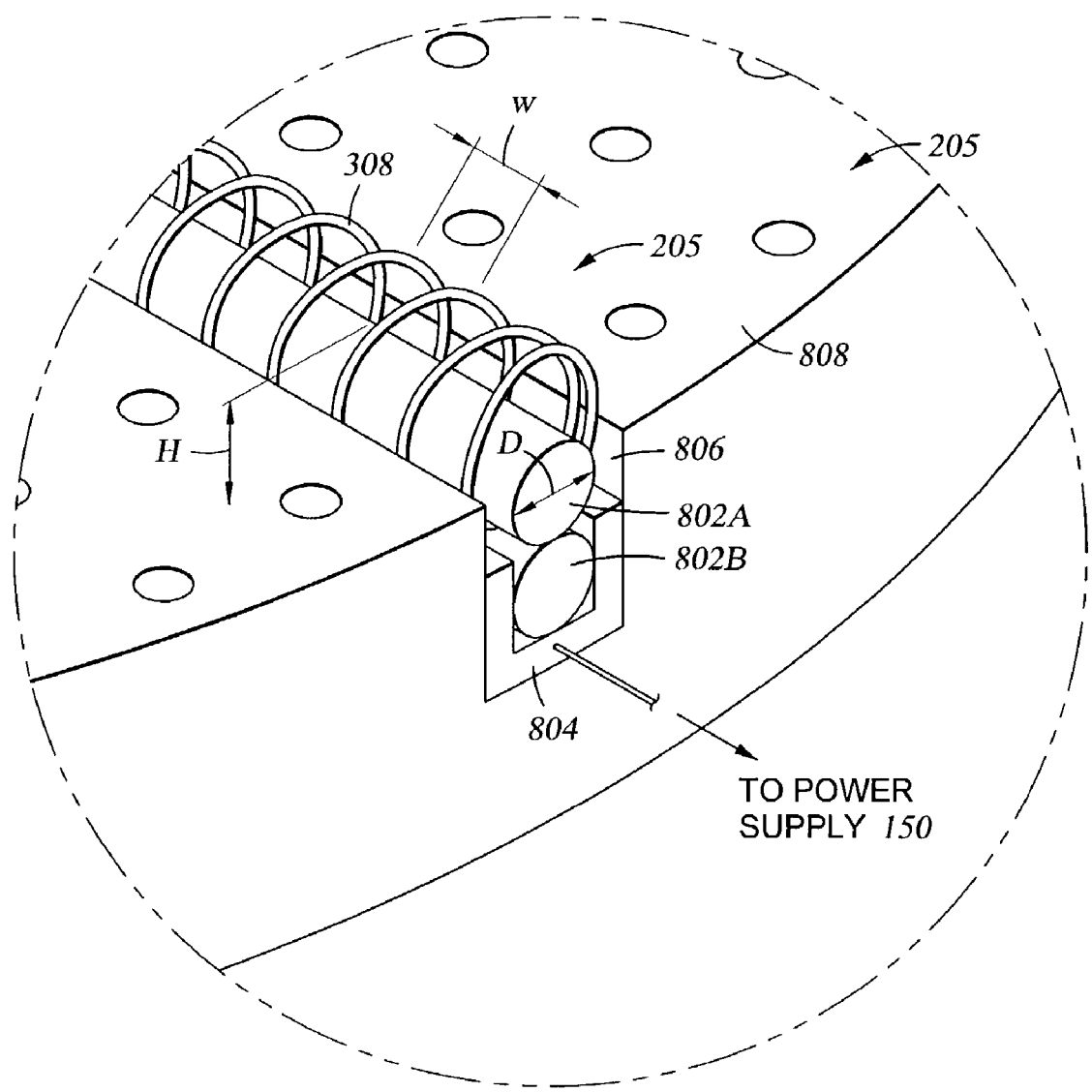
FIG. 8A is a partial perspective view of another embodiment of a wire contact element carrier disposed on a polishing article.
Figure 8B:
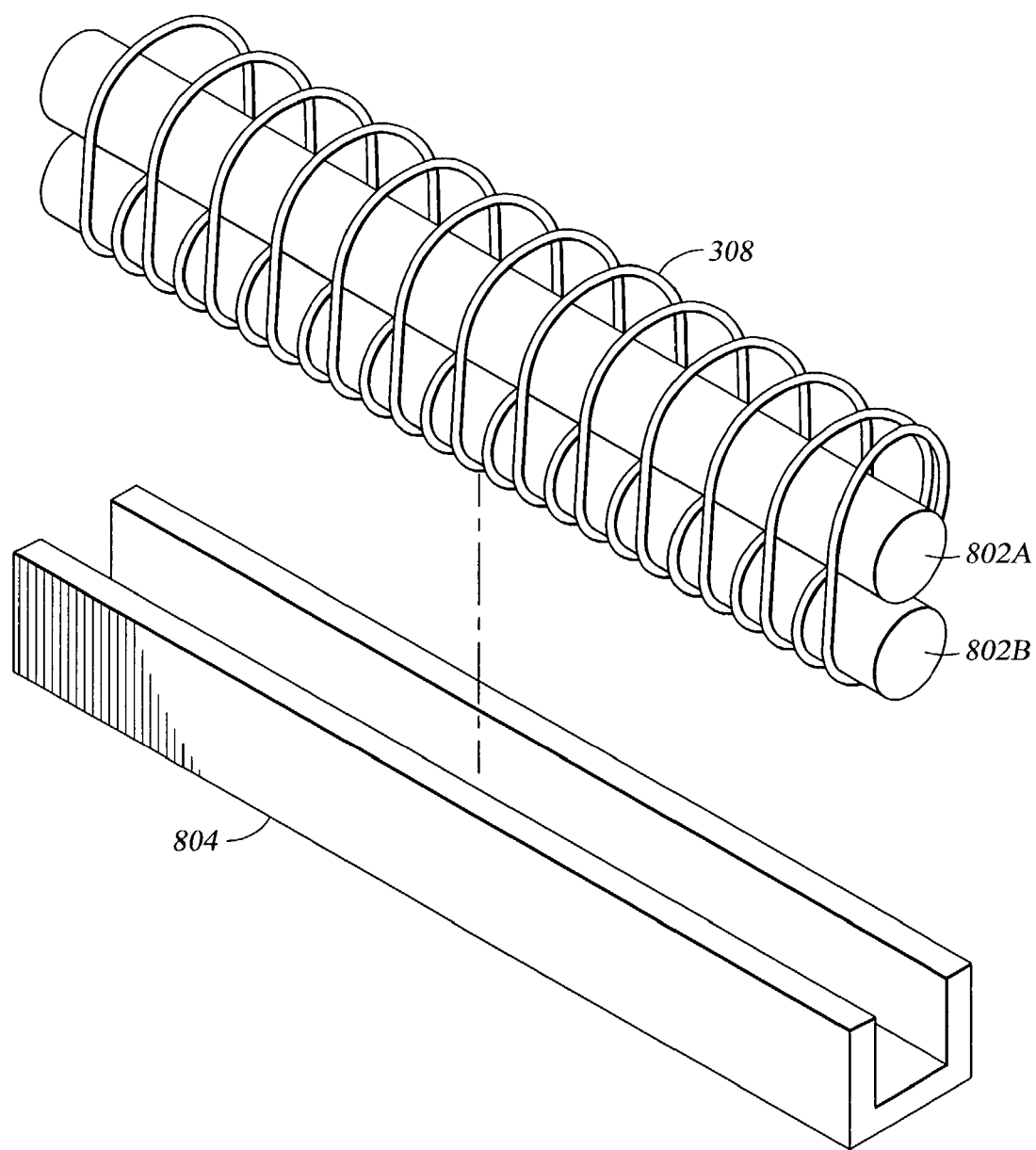
FIG. 8B is an exploded perspective view of the element carrier of FIG. 8A.

FIG. 8A shows yet another embodiment for coupling current from the power supply 150 to the contact element 308. In general, the contact element 308 is a wire (or twisted strands of wire) wound about one or more elongated conducting members 802A–B. Illustratively, two elongated conducting members 802A, 802B are shown. In one aspect, the bottom conducting member 802B facilitates wire assembly (e.g., by press-fitting or gluing into a U-shaped conduit 804) and the upper conducting member 802A is a sacrificial element which may prevent electrochemical dissolution of the wires 308. In one embodiment, the elongated conducting members 802 are cylindrical members (such as tubes or rods) formed of, or coated with, conducting material (such as gold). However, more generally, the elongated conducting members 802 may be of any suitable geometry according to the purpose described herein. Where cylindrical members are used, the elongated conducting members 802 may have a diameter D between about 0.125 and 0.5 inches, for example. In one embodiment, the diameter of the upper elongated conducting member 802A is different from the lower elongated conducting member 802B. The elongated conducting members 802 are preferably in contact with one another along a substantial portion of their lengths. Alternatively, electrical contact between the elongated conducting members 802 is made via the contact element 308.

At least one of the elongated conducting members 802 is at least partially disposed in, and in contact with, a U-shaped conduit 804, which is also electrically conductive and coupled to the power source 150. The U-shaped conduit 804 is disposed in a channel 806 formed within a pad body 808 of the polishing article 205, where the pad body 808 may comprise one or more layers of pad material.

In one embodiment, the U-shaped conduit 804 may be seated in a correspondingly shaped U-shaped conduit. Such an arrangement may facilitate quick and easy replacement of the assembly comprising the U-shaped conduit 804, the elongated conducting members 802 and the contact element 308.

As noted above, the contact element 308 is a wire (or twisted strands of wire) wound about one or more of the elongated conducting members 802. Even where twisted strands of wire are used, the conducting element 308 may form a singular (i.e., unbroken) piece of material which assumes a spiraling configuration around the elongated conducting members 802. In one embodiment, the contact element 308 is wound about each elongated conducting member 802 with an equal number of turns. In another embodiment, the number of turns around the bottom elongated conducting member 802B is greater than the number of turns around the upper elongated conducting member 802A, as a shown in FIG. 8B (which shows an exploded view of the elongated conducting members 802 relative to the U-shaped conduit 804). In any case, a portion of the contact element 308 extends some height H above the upper polishing surface of the pad body 808. Further, the respective adjacent arch portions of the contact element extending above the upper polishing surface of the pad body 808 are separated from one another by a width W. In one embodiment, the height H is between about 0.040 inches and 0.125 inches, and the width W is between about 0.040 inches and 1 inch.

Figure 9:
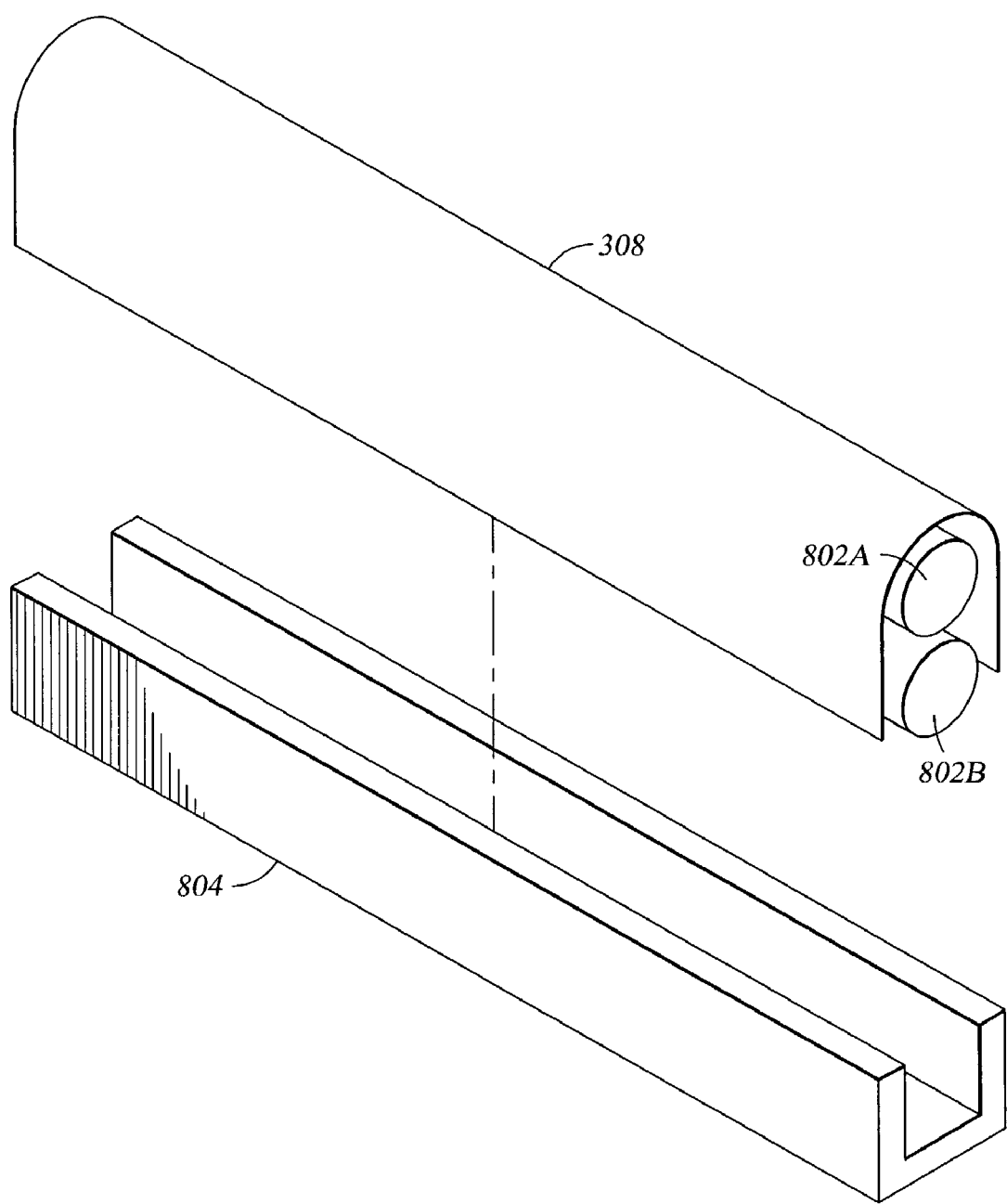
FIG. 9 is an exploded perspective view of a wire contact element carrier.

Referring to FIG. 9, another embodiment for coupling current from the power supply 150 to the contact element 308 is shown (in an exploded view). For simplicity, like numerals are used to identify like components of FIGS. 8A and 8B. In general, the contact element 308 is a coating or sheet wrapped at least partially about the one or more elongated conducting members 802 (illustratively two shown). In one embodiment, the coating is a nylon fabric comprising a conducting portion. For example, the conducting portion can be a gold coating disposed on the nylon fabric.

The number, placement and geometry of the current conducting assembly shown in FIGS. 8–9 may vary according to application. In one embodiment, a single U-shaped conduit 804 with one or more elongated conducting members 802 may be sufficient. In one embodiment, a U-shaped conduit 804 traverses substantially the entire radius of the polishing article 205. In alternative embodiment, a U-shaped conduit 804 traverses only a portion of the radius of the polishing article 205. In yet another embodiment, one or more U-shaped conduits 804 traverse the entire radius of the polishing article 205, while one or more U-shaped conduits 804 traverse only a portion of the radius. In still another embodiment, a U-shaped conduit 804 traverses a distance greater than the radius of the polishing article 205, such as the entire diameter of the polishing article 205.

In one embodiment, the U-shaped conduit 804 and/or the elongated conducting members 802 (or any other structure or material in the vicinity of the contact elements 308) are at least partially formed a sacrificial material. A sacrificial material is any material which is consumed during electrochemical processing, in order to minimize the damage to the contact elements 308. For example, in one embodiment the contact element 308 is a gold-containing material, while the sacrificial material is copper. It is believed that the presence of such a sacrificial material in the vicinity of the contact element 308 reduces the potential damage to the contact element 308 because negative ions, which would otherwise attacked the gold-containing material, are used to etch the sacrificial material.

Figure 10:
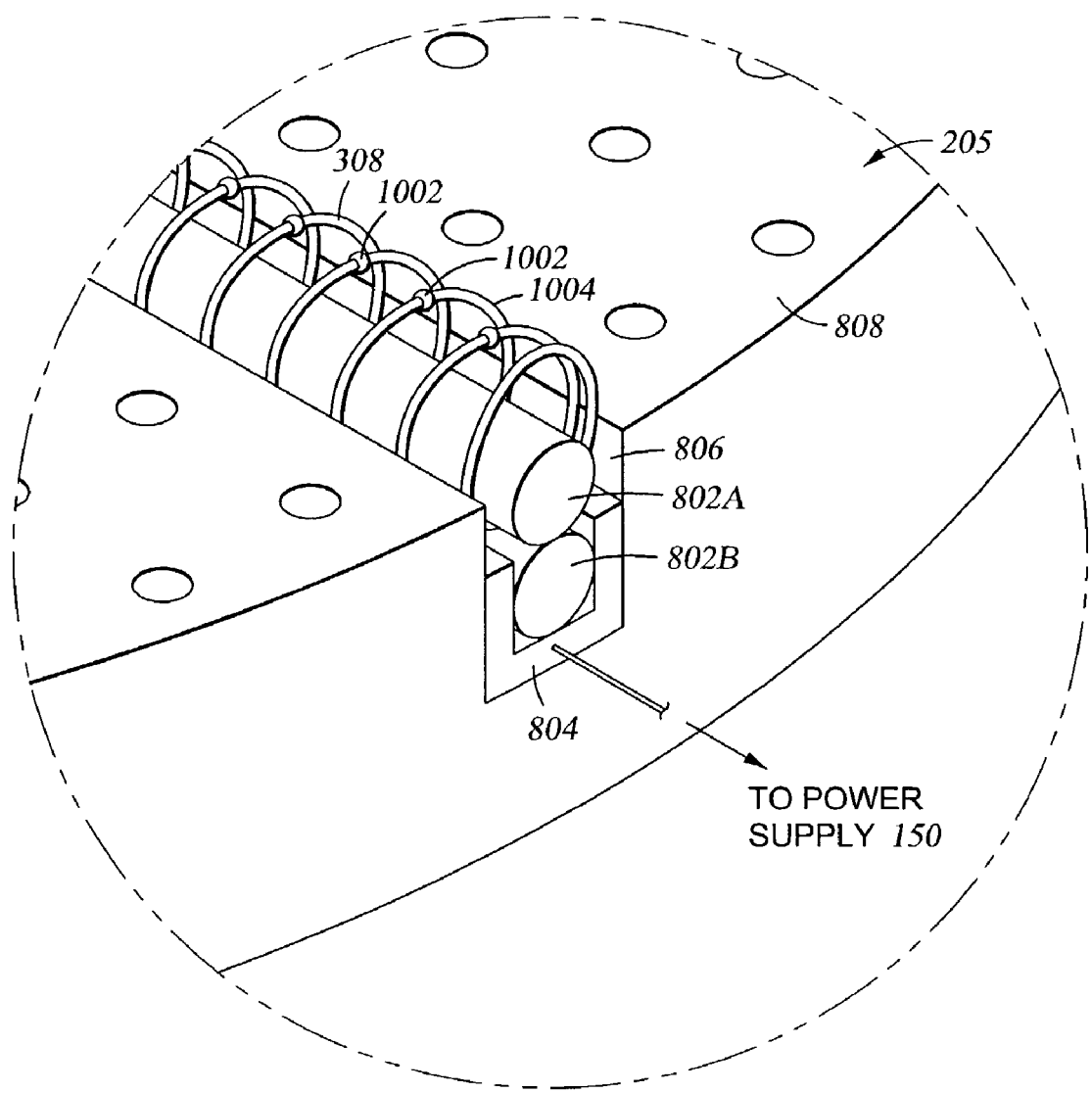
FIG. 10 is perspective view of another embodiment of a wire contact element carrier polishing article having contact elements with nodules formed thereon.

In another embodiment, the lifetime of the contact elements 308 (i.e., the time period during which the contact elements 308 are usable to achieve a desired result) is increased by increasing the available material (along some portion of the contact element 308) that comes into contact with a substrate. One such embodiment is shown in FIG. 10. Generally, the embodiment shown in FIG. 10 is substantially the same as that shown in FIG. 8. However, in contrast to previous embodiments, the contact elements 308 are now equipped with nodules 1002. Although each contact element 308 is shown equipped with only a single nodule 1002, two or more nodules 1002 may be formed on each contact element 308.

In general, the nodules 1002 are portions disposed on and/or supported by wire portions 1004 of the contact element 308. As such, the wire portions 1004 may also be referred to herein as support portions or support members for the nodules 1002. In one embodiment, the nodules 1002 are relatively enlarged portions compared to a greatest diameter of the wire portions 1004. However, the nodules 1002 may also be of substantially the same size but made of a different material. For example, the nodules 1002 may be wire segments made of a first material placed between two ends of the wire portions 1004 made of a second material, but having substantially the same diameter. The nodules may be formed on the contact elements 308 using any number of techniques including, for example, welding.

Illustratively, the nodules 1002 are substantially spherical members disposed at an upper and of the contact elements 308. In one aspect, a substantially smooth and spherical shape may be advantageous in preventing damage to the contacting substrates being polished. However, more generally, any geometric shape of the nodules 1002 may be used to advantage. Further, since the nodules 1002 are positioned to contact the substrate being polished, wear on the wire portion 1004 of the contact members 308 may be reduced.

In one embodiment, the nodules 1002 and the wire portion 1004 of the contact elements 308 are of the same material. For example, the nodules 1002 and the wire portion 1004 may be gold or gold plated. In another embodiment, the nodules 1002 and the wire portion 1004 are of different materials. For example, the nodules 1002 may comprise gold while the wire portion 1004 is copper.

In one aspect, the provision of nodules 1002 provide bulk material having a greater longevity (wear resistance) than the wire portion 1004, which provides a desirable degree flexibility. In addition, the nodules 1002 may be highly polished to reduce the probability of scratching the substrate being polished.

It should be understood that any of the embodiments of the contact element 308 disclosed herein may comprise nodules such as those shown in FIG. 10.

FIG. 11 shows another embodiment of a contact element carrier and wire contact element 308. In particular, FIG. 11 shows a perspective view of a contact element carrier 1100. The contact element carrier 1100 is a generally disk shaped member having the wire contact element 308 disposed thereon. A wire 1104 connects the wire element to the power supply 150. The wire contact element 308 is arranged as a partially twisted loop, or arch. This orientation may be achieved by first forming an arch with the wire element 308 (such as is shown in FIG. 4) and then twisting the wire element approximately 90 degrees about it central axis (i.e., the axis extending perpendicularly from the upper surface of the contact element carrier 1102 and through the center of the arch wire element. The resulting partially twisted loop/arch allows for bidirectional flexibility in two planar directions, shown by the arrows.

The construction of the contact element carrier 1100 may be understood with reference to the exploded view shown in FIG. 12. In general, the contact element carrier 1100 comprises an upper isolating disk 1106, a lower isolating disk 1108 and a conductive disk 1110. The conductive disk 1110 is disposed on the bottom isolating disk 1108 and may be secured thereto by any appropriate means including, for example, a pressure sensitive adhesive (PSA). The wire contact element 308 in the form of an arch is disposed on the conductive disk 1110. The conductive wire 1104 is connected to the wire contact element 308 in a manner that ensures good electrical contact. A slit 1112 formed in the upper isolating disk 1106 accommodates the wire contact element 308, which is disposed therethrough in the finished product. The upper isolating disk 1106, lower isolating disk 1108 and conductive disk 1110 may be secured to one another by adhesive applied to the backs of the respective surfaces.

The upper and lower isolating disks 1106, 1108 may be made of any insulating material including, for example, plastic while the conductive disk 1110 may be made of any electrically conductive material such copper foil. The wire contact element 308 may be made of any electrically conductive material, preferably a noble metal such as gold, platinum or titanium. In each case, the components of the contact element carrier 1100 and the wire element 308 may be composite materials or may be coated with the appropriate material.

In each of the foregoing embodiments described with respect to FIGS. 4–12, the contact element 308 may comprise a plurality of conducting elements. For example, in one embodiment the contact element 308 comprises a plurality of wire strands or filaments, which may be twisted. In a particular embodiment, each contact element 308 comprises M number of wires with N number of twists per inch, where M is between about 6 and 12, and N is between about 0.5 and 5 inches. Further, the wires that make up the contact element 308 may be gold or gold plated. In one embodiment, the wires are a gold alloy (such as AW14 or AW8) and may have a diameter of 1.3–3 mils.

Figure 13:
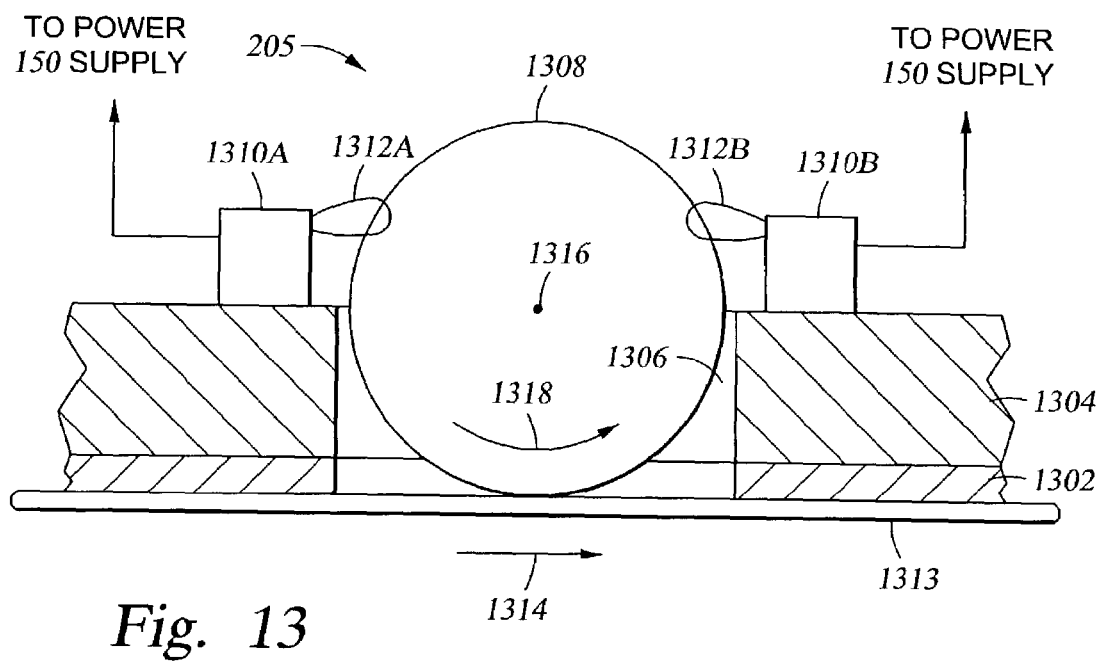
FIG. 13 is a schematic side view of a roller contact assembly disposed in a polishing article and configured for wafer face up polishing.

In another embodiment, the polishing article 205 is equipped with rolling contact elements. The rolling contact elements are configurable for wafer facedown and wafer faceup processing. A simplified schematic cross sectional side view of an embodiment of the polishing article 205 with a rolling contact element configured for wafer face up processing is shown in FIG. 13. In general, the polishing article 205 comprises a polishing pad 1302 and a support pad 1304, which may be attached to one another by a pressure sensitive adhesive (PSA), for example. The polishing pad 1302 may be made of polyurethane. The support pad 1304 may be made of PEEK. An opening 1306 is formed in the polishing pad 1302 and the support pad 1304. The opening 1306 is shaped to accommodate a rolling contact element 1308. The rolling contact element 1308 is disposed within the opening 1306 in a manner that allows rotation about at least one axis 1316, where the axis 1316 is parallel to a plane of a substrate 1313. As such, the geometry of the rolling contact element 1308 may be cylindrical, spherical, conical, frustoconical, etc. In operation, the rotation of the substrate 1313 (e.g., in the direction of the arrow 1314) causes a corresponding rotation of the rolling contact element 1308, as represented by the arrow 1318.

In one embodiment, the rolling contact element 1308 is "floating" within the opening 1306. For example, the rolling contact element 1308 may be rotatably suspended on a spring-loaded axel axially disposed on the axis 1316. In this manner, the rolling contact element 1308 may be urged upwardly through the opening 1306 when brought into contact with the substrate 1313. Gravity and/or a spring bias ensures a good and reliable contact between the rolling contact element 1308 and the substrate 1313. To prevent the rolling contact element 1308 from falling out of the opening 1306 when the substrate 1313 is not present, any variety of methods and mechanisms may be used to advantage. Illustrative embodiments are described below.

At least the outer surface of the rolling contact element 1308 is electrically conductive so that a current (generated by the power supply 150) may be flowed through the electrically conductive portion of the rolling contact element 1308. In the illustrative embodiment, the current is communicated from the power supply 150 to the rolling contact element 1308 via wire elements 1312A–B (two are shown, but any number is contemplated). More particularly, the power supply 150 may be coupled to wire element holders 1310A–B, each of which has a respective wire element 1312A–B connected thereto. Preferably, either or both the wire elements 1312 and the wire element holders 1310 comprise a noble metal, such as gold. In one embodiment, the noble metal may be a plating disposed over the wire elements and/or the wire element holders.

In one embodiment, the wire element holders are elongated rods spaced sufficiently far enough apart from one another to allow positioning of the rolling contact element 1308 therebetween. In such a configuration, a plurality of individual rolling contact elements 1308 may be disposed between a pair of wire element holders 1310. Further, a plurality of wire element holder pairs may be disposed within the polishing article 205. For example, N pairs of wire element holders 1310 may be radially disposed on the polishing article 205, with each pair of wire element holders accommodating M rolling contact elements 1308, where N and M are integer numbers. In a particular embodiment, N and M equal eight (8).

Figure 14:
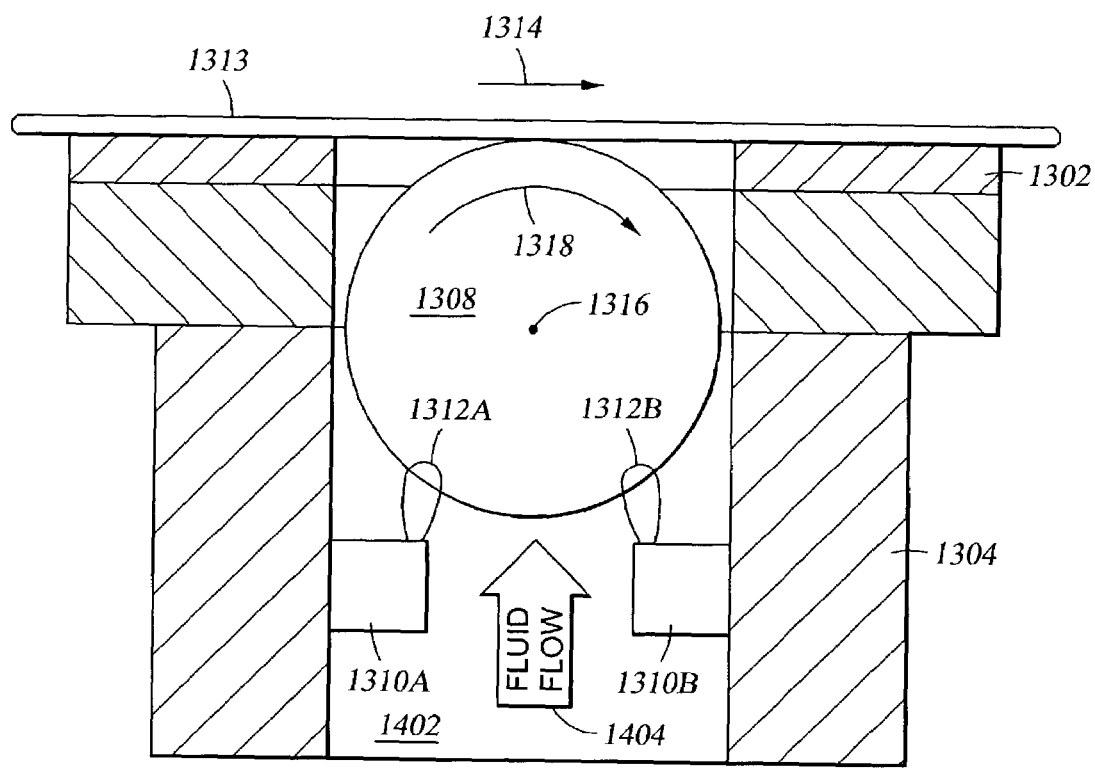
FIG. 14 is a schematic side view of a roller contact assembly disposed in a polishing article and configured for wafer face down polishing.

Referring now to FIG. 14, a facedown processing configuration of the polishing article 205 is shown in schematic. For brevity and simplicity, like numerals are used to indicate the same or similar components described above with respect to FIG. 13, regardless of differences in relative orientation and/or position. In the embodiment of FIG. 14, the rolling contact element 1308 is disposed in a fluid flow channel 1402, extending through the support pad 1304 and the polishing pad 1302. Downward travel of the rotating contact element 1308 is restricted by the provision of the wire element holders 1310A–B, which are spaced apart at a distance less than a diameter of the rolling contact element 1308. The wire element holders 1310 are disposed within the fluid flow channel 1402, thereby preventing the rotating contact element 1308 from inadvertently dropping out of the bottom of the fluid flow channel 1402.

Prior to initiating polishing of the substrate 1313, the rotating contact element 1308 may be (by operation of gravity) recessed below the plane of the upper polishing surface of the pad 1308. In order to bring the rotating contact element 1308 into contact with the substrate 1313, a fluid (e.g., electrolyte or a gas) is flowed into the fluid flow channel 1402, as indicated by the arrow 1404. In one embodiment, the fluid flow channel 1402 creates fluid flow resistance resulting in a pressure drop across the rotating contact element 1308, which provides the necessary force to lift the rotating contact element 1308 in a raised processing position. FIG. 14 shows the rotating contact element 1308 in the raised processing position (i.e., in contact with the substrate 1313). The particular lifting force applied to the rotating contact element 1308 may be controlled by varying the fluid pressure. Generally, increasing fluid pressure include the lifting force, while decreasing fluid pressure will decrease the lifting force. Note that, in the raised processing position, the wire elements 1312 are sufficiently flexible to maintain good electrical contact with the rotating contact element 1308, without substantially inhibiting the rotation thereof.

In addition to fluid levitation, the rotating contact element 1308 may also be placed in the raised processing position by magnetic or electromagnetic force. For example, a permanent magnet may be embedded in the rotating contact element 1308 and an electromagnet may be placed on one side of the substrate 1313. Depending on the location of the electromagnet, the polarity of the electromagnets may be either attractive or repulsive with respect to the permanent magnet embedded in the rotating contact element 1308. For example, if the electromagnet is disposed in the fluid flow channel 1402 below the rotating contact element 1308, then the polarity of the electromagnet is selected to be repulsive with respect to permanent magnet in order to magnetically bias the rotating contact element 1308 upward into contact with the substrate. In one embodiment, the wire element holders 1310A–B are electromagnets. Alternatively, the electromagnet may be disposed over the substrate (e.g., in the carrier head of the polisher), in which case the polarity of the electromagnet is selected to be attractive with respect to permanent magnet in order to magnetically bias the rotating contact element 1308 upward into contact with the substrate.

Figure 15:
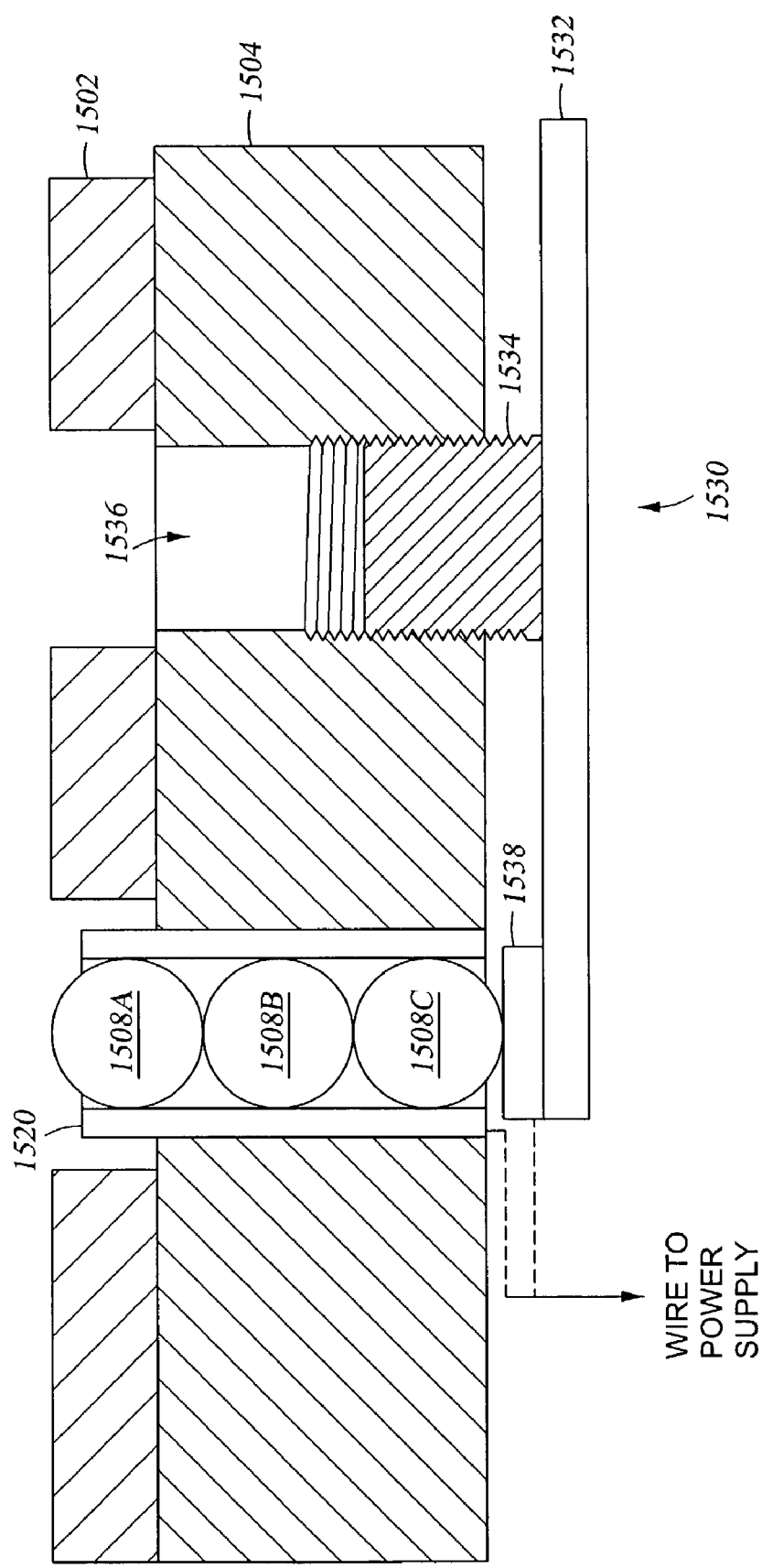
FIG. 15 is a schematic side view of a roller contact assembly disposed in a polishing article and having three stacked roller contacts and a height adjustment mechanism.

As described above, it is contemplated that a plurality of rolling contact elements 1308 may be used and brought into contact with the substrate 1313 during polishing. However, the provision of additional rolling contact elements which do not contact the substrate 1313 during polishing is also contemplated. For example, two or more rolling contact elements 1308 may be stacked on top of one another (i.e., in the plane of the FIGS. 13 and 14). One such embodiment is shown in FIG. 15. In particular, FIG. 15 shows a schematic side view of an embodiment of the polishing article 205 equipped with three rolling contact elements 1508.

In general, FIG. 15 shows a pad 1502 disposed on a support pad 1504 and a contact assembly 1500 disposed at least partially within the support pad. The contact assembly 1500 generally includes a housing 1520 and three rolling contact elements 1508A–C residing within the housing 1520. The travel of the rolling contact elements 1508A–C within the housing 1520 may be limited at one end by a diametrically restricted opening (not shown). The travel of the ball is limited at another end by a height adjustment mechanism 1530. In particular, the bottom rolling contact element 1508A is shown resting on (in contact with) a height adjustment arm 1532. The height adjustment arm 1532, in turn, is supported by an adjustor 1534 disposed in a bore 1536 defined in the support pad 1504. In one embodiment, the adjustor is a threaded member having threads engaged with counter-threads formed on the inner surface which forms the bore. The height adjustment arm 1532 carries a roller element support pad 1538 at a distal end and on which the bottom roller contact element 1508A rests. In one embodiment, the power supply 150 is coupled to the pad 1538. In this manner, the current may be applied to the bottom rotating contact element 1508A and communicated to the top rotating contact element 1508C (i.e., the rotating contact element in contact with the substrate) via any intermediate rotating contact elements (e.g., the middle rotating contact element 1508B). In another embodiment, the power supply 150 is coupled to the housing 1520. In yet another embodiment, current may be coupled from the power supply 150 to the one or more of the rotating contact elements 1508A–B via a wire element (not shown).

Figure 16:
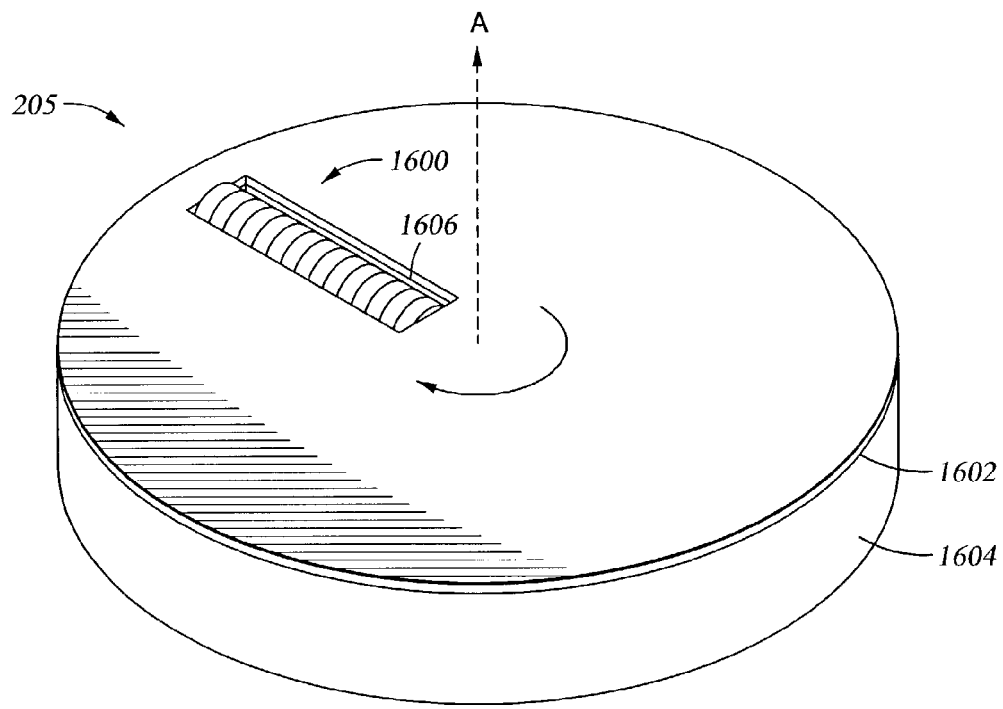
FIG. 16 is a perspective view of a polishing article comprising a roller bearing assembly.
Figure 17:
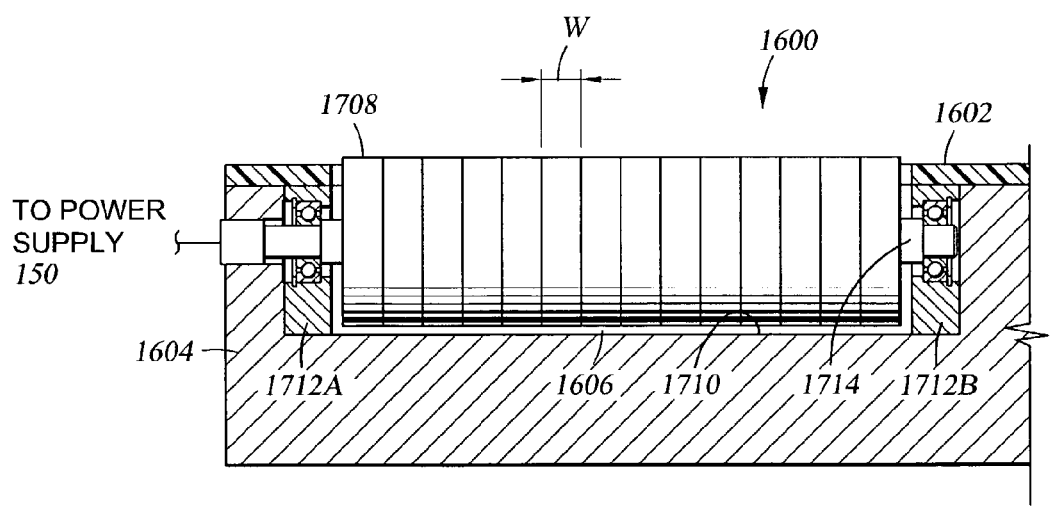
FIG. 17 is a front view of the roller bearing assembly of FIG. 16.

Referring now to FIG. 16, a perspective view and a side cross-sectional view, respectively, of another embodiment of the polishing article 205 shown. In general, the polishing article 205 comprises an upper polishing pad 1602 and a lower support pad 1604, which may be attached to one another by a pressure sensitive adhesive (PSA), for example. The upper polishing pad 1602 may be made of polyurethane. The lower support pad 1604 may be made of PEEK. A recess 1606 is formed in the upper polishing pad 1602 and the support pad 1604. Illustratively, the recess 1606 is substantially rectangular in shape. More generally, the recess 1606 may be any shape sized to accommodate a roller bearing contact assembly 1600. As best seen in FIG. 17, the roller bearing contact assembly 1600 is disposed in the recess 1606 such that the upper exposed surface of the roller bearing contact assembly 1600 is substantially coplanar with the upper polishing surface of the upper polishing pad 1602. However, the position of the roller bearing contact assembly 1600 allows sufficient contact to be made with a substrate being polished. Accordingly, the upper surface of the roller bearing contact assembly 1600 may be some height slightly above the upper polishing surface of the upper polishing pad 1602. Further, a lower surface of the roller bearing contact assembly 1600 has a clearance with respect to a floor 1608 of the recess 1606.

In the illustrated embodiment, the roller bearing contact assembly 1600 is suspended over the floor 1708 by a pair of ball bearing assemblies 1712A–B, one disposed at either end of the roller bearing contact assembly 1600. The ball bearing assemblies 1712 are disposed against the lower pad support 1604 and each receive an end of an axle 1714.

Referring still to FIG. 17, the roller bearing contact assembly 1600 is shown comprising a plurality of contact elements 1708 rotatably disposed on the axle 1714. Specifically, the contact elements 1708 are disk-shaped members rotating about their central axes (along which the axle 1714 is disposed). More generally, the contact elements 1708 may be any shape capable of rotating on the axle 1714. For example, in one embodiment, the contact elements 1708 are conical or frustoconical shaped members, where the contact elements 1708 rotating about the axis of symmetry. In the latter embodiment, the taper angle of the contact elements 1708 may be adjusted to adjust for changing linear speed with increasing radius on an orbital polisher. Specifically, the contact elements 1708 may have an increasing diameter with the increasing radius of the polishing pad. In another embodiment, the contact elements 1708 are balls. The embodiments of the latter geometry (i.e., balls) are described below.

In at least one embodiment, the contact elements 1708 are rigidly secured to the axle 1714, and rotation of the contact elements 1708 is achieved by rotation of the axle 1714. In one embodiment, the contact elements 1708 may be separated from one another by washers, enlarged portions of the axle or any other feature, component or mechanism allowing separate rotation of the contact elements 1708.

Illustratively, the roller bearing contact assembly 1600 is shown comprising fourteen contact elements 1708. However, any number of contact elements 1708 may be used. Further, each individual contact element 1708 may be of a different width (W). In one embodiment, the number and width of the contact elements 1708 may be selected according to their respective radial position on the polishing article 205. In particular, the number and width of the contact elements 1708 may be selected to accommodate the difference in rotational velocity of contact elements at different radial locations. For example, in one embodiment, the number of contact members 1708 per unit length may increase while their width decreases with increasing radius of the polishing article 205.

Current is provided to the roller bearing contact assembly 1600 via the power supply 150. In one embodiment, the power supply 150 is connected to the axle 1714. As such, to ensure adequate electrical conductivity, the axle 1714 and the contact members 1708 are preferably made of a metal. In one embodiment, the contact members 1708 are gold or are gold-plated. In a particular embodiment, the contact members 1708 comprise a stainless steel core plated with gold. In another embodiment, the contact members 1708 comprise a non-conducting core (e.g., a nylon core) coated with a conducting serial (e.g., gold or some other noble metal).

Of course, other methods and configurations for electrically coupling the power supply with the contact members 1708 are possible. For example, in one embodiment, a current is provided for the power supply 150 via gold wire contacts located on a backside of the roller bearing contact assembly 1600.

Referring again to FIG. 16, the roller bearing contact assembly 1600 is generally disposed radially from a central portion of the polishing article 205. Illustratively, only one roller bearing contact assembly 1600 is shown disposed in the polishing article 205. However, it is contemplated that any number of roller bearing contact assemblies may be used. Further, along any given radial line, two or more separate roller bearing contact assemblies may be provided. Each separate roller bearing contact assembly may have one or more contact elements 1708. In any case, the roller bearing contact assembly 1600 is oriented to allow the contact elements 1708 to rotate relative to a substrate brought into contact with the contact elements 1708.

Figure 18A:
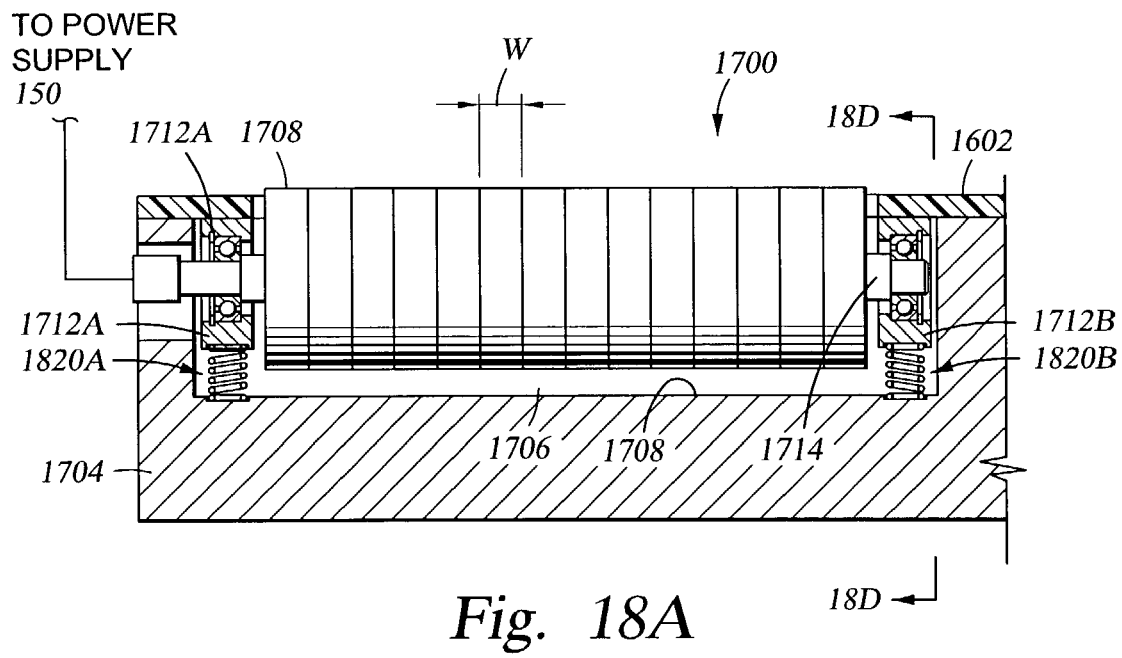
FIG. 18A is a front view of another embodiment of the roller bearing assembly of FIG. 16.
Figure 18B:
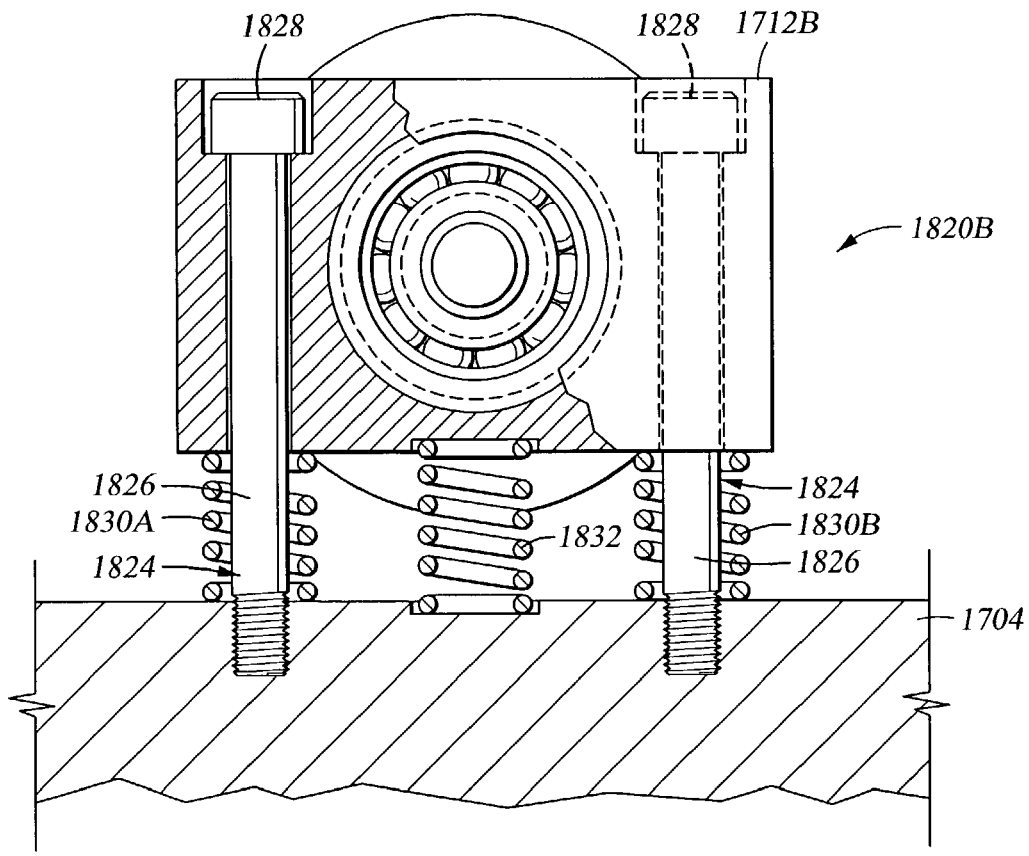
FIG. 18B is a side view of the roller bearing assembly of FIG. 18A.

In some cases, it may be desirable to adjust the position of the roller bearing contact assembly 1600. One position adjustment mechanism is shown in FIGS. 18A–B. In particular, FIG. 18A shows a side cross-sectional view of a pair of position adjustment mechanisms 1820A–B (collectively the position adjustment mechanisms 1820) taken along the axis of the axle 1714, while FIG. 18B shows an elevation of the position adjustment mechanism 1820B taken along the section lines 18B—18B. In general, the position adjustment mechanisms 1820 each comprise a ball bearing assembly 1712A–B for receiving one end of the axle 1714, thereby allowing the axle 1714 to rotate freely about its longitudinal axis. Particular aspects of the ball bearing assemblies 1712A–B can best be described with reference to FIG. 18B. Although FIG. 18B shows only one ball bearing assembly 1712B (i.e., the ball bearing assembly 1712B), it is understood that the ball bearing assembly 1712A is substantially the same. The ball bearing assembly 1712B is secured by a pair of fasteners 1824. In particular, the fasteners 1824 extend at least partially into the lower support pad 1604. To this end, the fasteners 1824 may have threaded portions at their respective ends. The shafts 1826 of the fasteners 1824 are of sufficient length to allow the ball bearing assembly 1712B a degree of travel along the shafts 1826. Travel of the ball bearing assembly 1712B is limited at one end by the lower support pad 1604 and at another end by the heads 1828 of the fasteners 1824.

In one embodiment, one or more biasing members are provided to urge the ball bearing assemblies 1712A–B in a particular direction. Illustratively, FIG. 18B shows three biasing members 1830A–C. However, it is understood that any number of biasing members may be used to advantage. With reference to FIG. 18B, the fasteners 1824 each carry a biasing member 1830A–B (collectively, the biasing members 1830). In particular, the biasing members 1830 are springs wound about a portion of the shafts 1826 of the respective fasteners 1824. Further, the biasing members 1830 are disposed between the ball bearing assembly 1712B and the lower support pad 1604. In this configuration, the biasing members 1830 urge the ball bearing assembly 1712B upwards. The highest position of the ball bearing housing 1822 is reached when the ball bearing housing 1822 contacts the lower surface of the fastener heads 1828. In one embodiment, a portion of the contact elements 1708 extends a height slightly above the polishing surface of the upper polishing pad 1602 when the ball bearing housing 1822 reaches its highest position. The particular height of the contact elements 1708 over the polishing surface can be changed by adjusting the fasteners 1824 (e.g., screwing the fasteners into or out of the lower support pad 1824).

The position adjustment mechanism 1820 is further shown comprising a biasing member 1832 disposed between the ball bearing housing 1822, the lower support pad 1604 and the fasteners 1824. Illustratively, the biasing member 1832 is a spring disposed at least partially in a recess 1834 formed in the lower support pad 1604. In one aspect, the recess 1834 may provide a degree of stability to the biasing member 1832. At its other end, the biasing member 1832 contacts the lower surface of the ball bearing housing 1822. In this configuration, the biasing member 1832 urges the ball bearing housing upward, thereby producing substantially the same effect as the biasing members 1830. Again, the highest position and degree of freedom of the ball bearing housing 1822 can be set by adjusting the fasteners 1824.

In operation, a substrate to be polished is brought into contact with the polishing surface of the upper polishing pad 1602. If contact is made between the substrate and the roller bearing contact assembly 1600 (i.e., the contact elements 1708), a sufficient resulting force may compress the biasing members 1830, 1832, if any such biasing members are provided in the particular configuration being used. As a result, the roller bearing contact assembly 1600 is depressed. However, the provision of the biasing members 1830, 1832 ensures a continuing pressure of the contact elements 1708 against the lower surface of the substrate. In addition, the contact elements 1708 roll over the lower surface of the substrate, thereby reducing friction between the lower surface of the substrate and the contact elements 1708.

During an electrochemical mechanical polishing operation, electrolyte is provided to the surface of the substrate being polished. To this end, electrolyte may be deposited from a fluid delivery arm, for example, onto the polishing surface of the polishing article 205. In another embodiment, fluid is delivered into the recess 1706 via one or more fluid delivery channels (not shown) formed in the support pad 1604. With such a fluid delivery configuration, and where the roller bearing contact assembly 1600 is oriented for facedown processing and is in floating suspension (i.e., resting on biasing members, such as springs 1830A–B and 1832), the fluid may provide enough pressure to urge the roller bearing contact assembly 1600 upward and in contact with the substrate.

Figure 19:
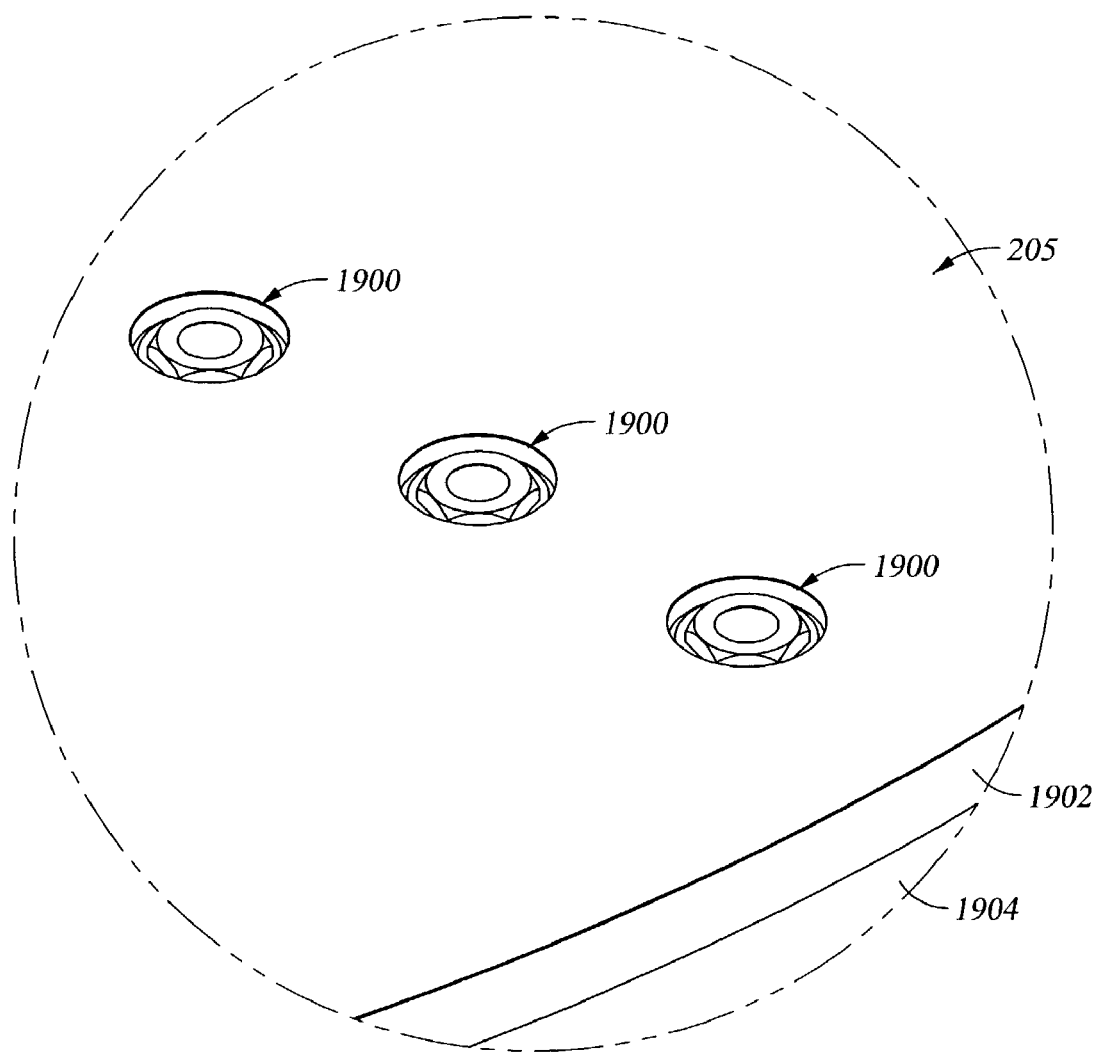
FIG. 19 is partial perspective view of another embodiment of a polishing article having ball bearing contact assemblies.

Referring now to FIG. 19, a perspective view of an embodiment of the polishing article 205 is shown in which roller contact assemblies are embedded therein. In general, the polishing article 205 comprises an upper polishing pad 1902 and a lower support pad 1904, which may be attached to one another by a pressure sensitive adhesive (PSA), for example. In the present embodiment, the polishing article 205 is equipped with one or more rotating member assemblies (three shown). Illustratively, the roller contact assemblies are ball bearing contact assemblies 1900. For purposes of illustration, three ball bearing contact assemblies 1900 are shown. However, any number of ball bearing contact assemblies 1900 may be used to advantage in other embodiments. Further, in FIG. 19, the ball bearing contact assemblies 1900 are arranged in a radial line. In one embodiment, the polishing article 205 may be equipped with a single radial line of ball bearing contact assemblies 1900. In such an arrangement, electrochemical mechanical polishing may be restricted to a particular area of the polishing article 205. However, any variety of other geometric arrangements is contemplated. For example, a plurality of ball bearing contact assemblies 1900 may be uniformly distributed over the polishing surface of the upper polishing pad 1902. In another embodiment, the polishing article 205 may be equipped with a series of radial lines of ball bearing contact assemblies 1900.

Figure 20:
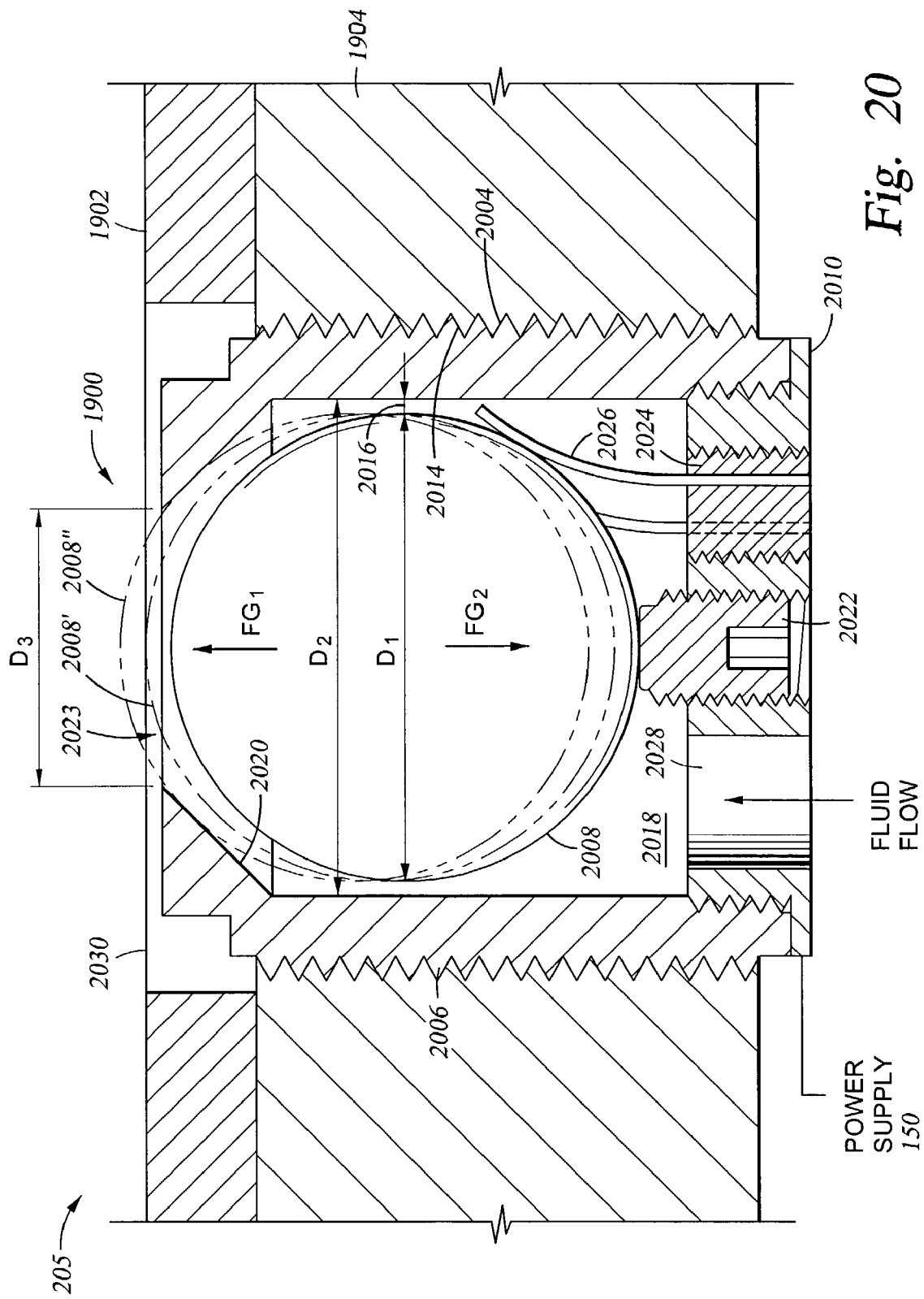
FIG. 20 is a side sectional view of the ball bearing contact assembly of FIG. 19.

Referring now to FIG. 20, a side cross-sectional view of a ball bearing contact assembly 1900 is shown. The ball bearing contact assembly 1900 generally includes a housing 2006, a current-conducting ball 2008 and a contact plate 2010. The housing 2006 is a generally cylindrical member substantially disposed in the lower support pad 1904. Threads 2012 carried on outer surface of the housing 2006 engage counter-threads 2014 which may be disposed on the support pad 1904 itself or on a threaded member disposed between the support pad 1904 and the housing 2006. In any case, the provision of the threads 2004 and the counter-threads 2014 facilitate securing the housing 2006 in, and removing the housing 2006 from, the support pad 1904. In one embodiment, the housing 2006 is made of DELRIN®.

The housing 2006 forms a cavity 2018 which is generally sized to accommodate the ball 2008. In particular, a degree of rotation of the ball 2008 within the cavity 2018 is tolerated. To this end, a diameter (D1) of the ball 2008 is sized slightly smaller than a diameter (D2) of the housing 2006. As a result, when the ball 2008 is laterally centered within the housing 2006, an annular gap 2016 exists between the most proximate surfaces of the housing 2006 and the ball 2008.

The movement of the ball 2008 within the cavity 2018 is restricted at one end by a ball seat 2020 and at another end by a set screw 2022. The ball seat 2020 is a generally tapered surface formed at an upper end of the housing 2006. In particular, the ball seat 2020 tapers inwardly to form a restricted opening 2023 having a diameter (D3) smaller than the diameter (D1) of the ball 2008. Accordingly, the ball 2008 may travel axially upward until engaging the ball seat 2020. The position of the ball 2008 at its upper limit of travel is illustrated by the dashed lines 2008".

The set screw 2022, which confines the ball 2008 at its lower limit, is threadedly disposed in the contact plate 2010. In one embodiment, the set screw 2022 is a nylon member having threads on its outer surface. The set screw 2022 operates as a position adjustment mechanism which may be extended or retracted to determine the limit of travel of the ball 2008 within the cavity 2018. In one embodiment, the set screw 2022 is positioned so that some degree of axial and rotational movement of the ball 2008 is possible. In any case, it will be appreciated that the set screw 2022 is merely illustrative of one adjustment mechanism. Persons skilled in the art will recognize that any variety of adjustment mechanisms can be used to advantage.

In one embodiment, the contact plate 2010 is sized to be pressure fitted within the housing 2006. However, is understood that the contact plate 2010 may be secured to the housing 2006 by other means, such as by fasteners, adhesives or the like. In addition to carrying the set screw 2022, the contact plate 2010 carries a plug 2024. The plug 2024 may be made of any material, such as rubber or some other elastomer, and secures a contact element 2026 with respect to the contact plate 2010, to ensure electrical contact therebetween. The contact element 2026 may be, for example, a wire or other flexible element capable of maintaining electrical contact with the ball 2008 regardless of the particular position of the ball 2008 within the cavity 2018. Although only one contact element 2026 is shown, any number may be provided. For example, in one embodiment three contact element 2026 are positioned equidistant (i.e., 120 degrees) from one another.

In general, the ball 2008, the contact plate 2010, the contact element 2026 are all current-conducting members. As such, these members may be made of conducting materials such as metal. In a particular embodiment, the ball 2008 is a plastic or steel core plated with gold. In another embodiment, the ball 2008 is solid gold. Further, either or both the contact plate 2010 and the contact element 2026 may include gold. In any case, where each of the elements is conductive, the contact plate 2010 is connected to the power supply 150 to provide a current to the contact element 2026 and the ball 2008.

The contact plate 2010 also forms a fluid port 2028. The fluid port 2028 allows fluid to flow from an exterior region (e.g., from the channels formed in the pad support disk 206, i.e., platen) into the cavity 2018. In general, the fluid port 2028 may be sized according to a desired fluid pressure and flow rate. In another embodiment, a valve may be disposed in the fluid port 2028 to facilitate control over fluid flow through the fluid port 2028.

In operation, a substrate to be polished is brought into contact with the upper surface of the polishing pad 1902. The position of lower surface of the substrate is illustrated by the plane 2030, which is substantially coplanar with the upper surface of the polishing pad 1902. Fluid (e.g., electrolyte) is then flowed through the fluid port 2028 to provide a pressure sufficient to lift the ball 2008 from the set screw 2022. In particular, the fluid flow around the ball 2008 creates a pressure drop across the ball 2008, which lifts the ball 2008. In one aspect, the provision of the pressure drop in this manner achieves a frictionless, or substantially friction-reduced (relative to the inner surface of the housing 2006), environment for the ball 2008. When sufficient pressure is available, the ball 2008 is brought into engagement with the lower surface of the substrate. The position of the ball 2008 while engaging the lower surface of the substrate is represented by the dashed lines 2008'. Note that, in this position, the upper surface of the housing 2006 is recessed below the plane 2030 while a portion of the ball 2008 extends over the upper surface of the housing 2006, thereby ensuring adequate contact between the ball 2008 and the substrate. Further, in this position, fluid flow is permitted around the ball 2008 and through the upper opening 2023 of the housing 2006. Either or both the substrate and the pad 1902 may be actuated (e.g., rotated) to provide relative movement between the substrate and the pad. During such relative movement electrical contact between the ball 2008 and the substrate is maintained, while damage to the substrate and/or ball (due to their relative movement) is mitigated because the ball 2008 is able to rotate within the cavity 2018. In one aspect, fluid flow between the inner surface of the housing 2006 and the outer surface of the ball 2008 establishes a fluid bearing, thereby facilitating rotation of the ball 2008 within the cavity 2018.

In one embodiment, the ball bearing contact assembly 1900 may be used for wafer face down processing, as described above. That is, in face down processing the ball bearing contact assembly 1900 is oriented such that the ball 2008 experiences a gravitational force $F_{G1}$ which urges the ball 2008 downward toward the set screw 2022. Fluid flow (pressure drop) provides the necessary lifting force to engage the ball 2008 with the substrate. In an alternative embodiment, the ball bearing contact assembly 1900 may be used for face up processing. In face up processing, the ball 2008 experiences a gravitational force $F_{G2}$ which urges the ball 2008 toward the ball seat 2020 providing reliable electrical contact of the ball 2008 and substrate (without the assistance of fluid flow induced pressure).

In wafer face down processing the ball bearing contact assembly 1900 may be used as a pressure regulator. For example, the ball bearing contact assembly 1900 may be inserted in reversed position (ball seat 2020 down) relative to the position shown. In this arrangement, the movement of the ball 2008 within the cavity 2018 is restricted at lower end by the ball seat 2020 and the opening 2023 is sealed when fluid pressure at a downstream plenum is not enough to lift the ball 2008. When fluid pressure becomes sufficient, the ball 2008 is lifted from the seat 2020 and the opening 2023 allows fluid flow, thereby reducing the pressure in the plenum.

It should be understood that the foregoing embodiments of the ball bearing contact assembly 1900 or merely illustrative. A variety of additional and/or alternative embodiments are contemplated. For example, in one embodiment the ball bearing contact assembly 1900 may include two or more balls disposed in the housing 2006. In another embodiment, a biasing member may be disposed to engage the ball 2008 and urged the ball 2008 in a particular direction. For example, a spring may be disposed at an upper end of the set screw 2022 to urge the ball 2008 against the ball seat 2020 even in the absence of sufficient backside fluid pressure. In another embodiment, the set screw 2022 is itself spring-loaded to tolerate some adjustment in the position of the set screw relative to the cover plate 2010. In yet another embodiment, a biasing member may be disposed between the ball 2008 and the ball seat 2020 to urge the ball downward against the set screw 2022. In the latter embodiment, the ball is urged upward toward the ball seat 2020 in the presence of a sufficient fluid pressure which overcomes the biasing force of the biasing member. Further, the rotating member in the housing 2006 may be any rotatable member and need not be a ball. For example, the assemblies 1900 may be roller bearing assemblies in which case the housing 2006 houses one or more rollers, i.e., generally cylindrical members. The roller(s) may operate in a manner similar to the ball 2008 except that, in one embodiment, the roller only rotates about its longitudinal axis. In this case, the roller is preferably oriented orthogonal to the direction of rotation of the substrate relative to the polishing article. In another embodiment, an additional degree of rotation is provided by allowing the housing 2006 to rotate relative to the pad upper polishing pad 1902, the lower support pad 1904 and a substrate being polished.

Figure 21:
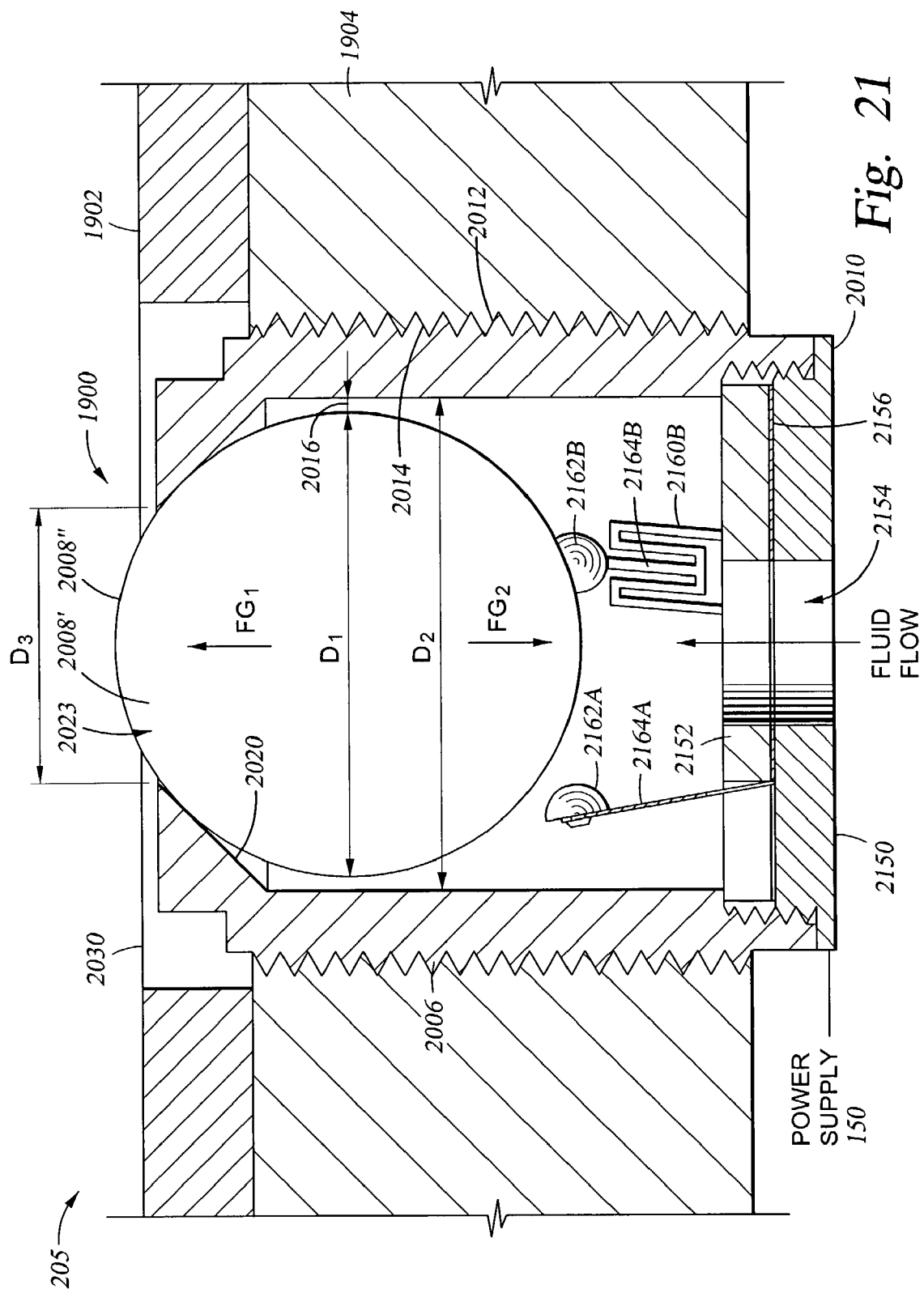
FIG. 21 is a side sectional view of another embodiment of the ball bearing contact assembly of FIG. 19.

Referring now to FIG. 21, another embodiment of the ball bearing contact assembly 1900 shown in a side cross sectional view. Where possible, like numerals have been used for simplicity. Accordingly, components which have been described above will not be described again, except to note particular differences, where appropriate or if necessary.

In the embodiment of FIG. 21, a contact plate 2150 and a support plate 2152 are located at one end of the housing 2006. In one embodiment, the contact plate 2150 and the support plate 2152 are pressure fitted within the housing 2006. The contact plate 2150 and support plate 2152 each have openings formed therein which are registered with one another to form a common fluid port 2154.

Figure 22:
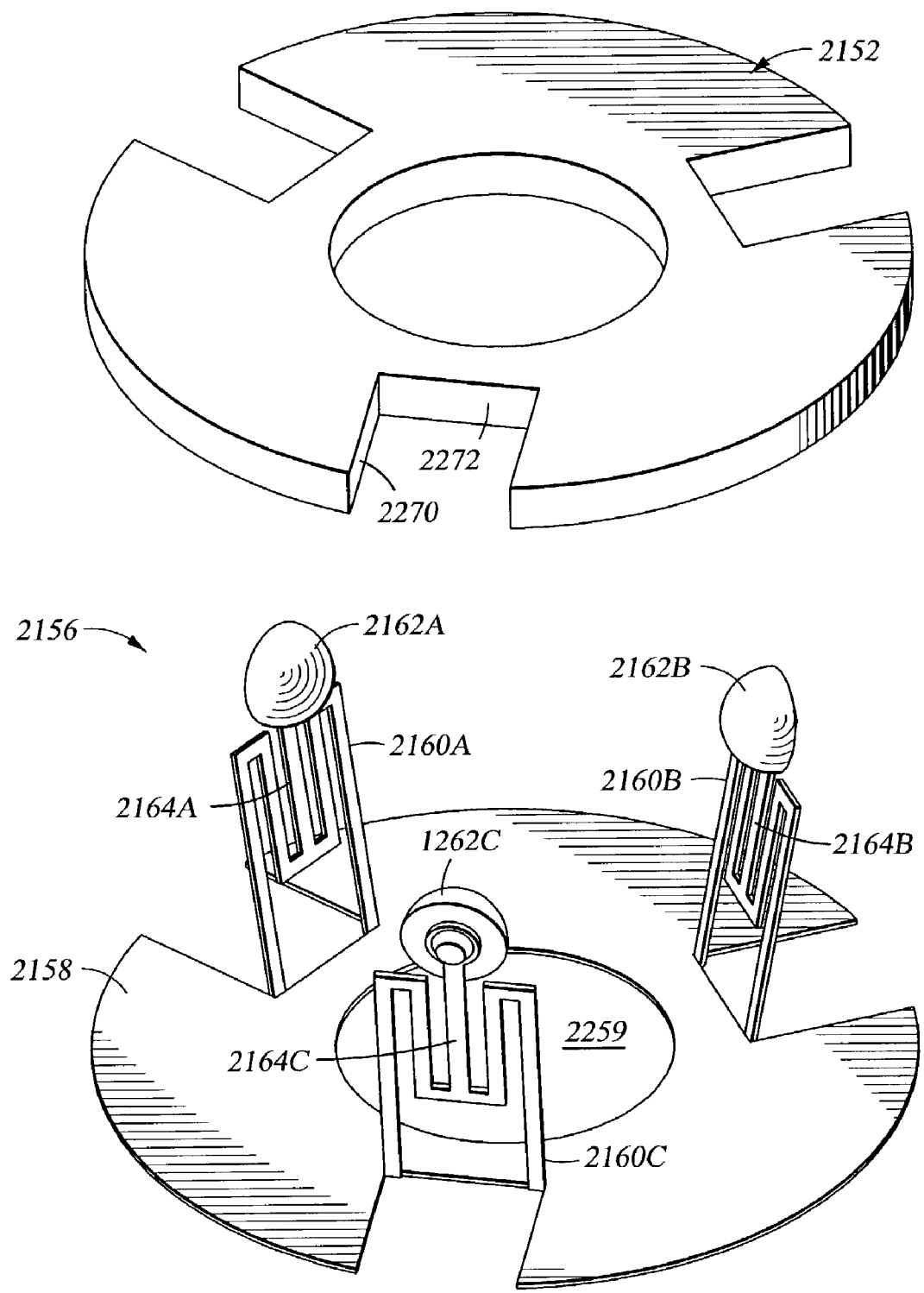
FIG. 22 is a an exploded view of one embodiment of the ball bearing contact assembly of FIG. 21.

A contact assembly 2156 is disposed between the contact plate 2150 and support plate 2152. One embodiment of the contact assembly 2156 and the support plate 2152 is shown in an exploded view in FIG. 22. In general, the contact assembly 2156 comprises a body 2158, one or more flexible biasing members 2160A (three shown by way of illustration) and a contact element 2162A attached to an upper end of each of the flexible biasing members 2160A. The body 2158 defines an opening 2159 which makes up a portion of the fluid port 2154. Illustratively, three contact elements 2162A and their respective biasing members 2160A are shown spaced equidistant from one another, i.e., 120 degrees apart. In this configuration the contact elements 2162A and their respective biasing members 2160A confine the ball 2008 to a central region of the cavity 2018. More generally, any number and positional configuration of biasing members 2160A/contact elements 2162A may be used to advantage.

Figure 23:
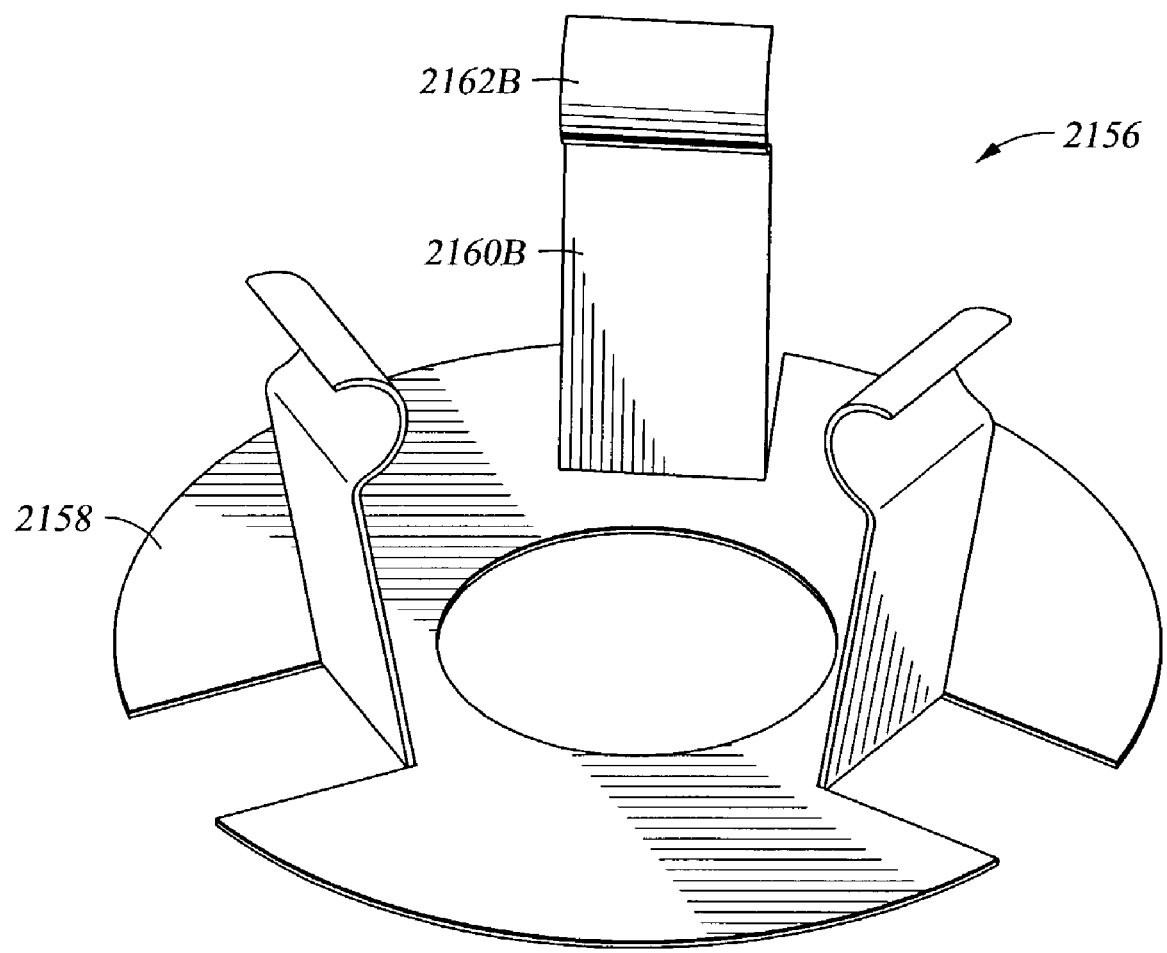
FIG. 23 is a perspective view of another embodiment of the ball bearing contact assembly of FIG. 21.

Illustratively, the contact elements 2162A comprise a hemispherical member attached to a flexible arm 2164 of the respective biasing member 2160. FIG. 23 shows another embodiment in which the body 2158, the biasing members 2160B and the contact elements 2162B form a solid integrated component. Further, the contact elements 2162B are generally elongated curved members, such as a cylinder section. In any case, the contact elements 2162A–B are preferably smooth electrically conductive members which may be brought into low friction contact with the ball 2008.

With reference again to FIG. 22, note that the support plate 2152 has a recess 2270 to accommodate each of the biasing members 2160. The recesses 2270 are in part defined by an inner wall 2272 against which the biasing members 2160 may abut. In this way, the inner wall 2272 serves as a stop to delimit the range of motion of the biasing member 2160 in at least one direction (i.e., in an inward direction towards a center of the contact assembly 2156).

Preferably, the contact plate 2150 and the contact assembly 2156 are each made of conducting materials. For example, the contact plate 2150 may be made of copper while the body of the contact assembly 2156 may be made of the same or some other conductive material. The contact elements are preferably made of (i.e., either solid or plated with) a noble metal such as gold, platinum or titanium. In this configuration, the power supply 150 may be coupled to the contact plate 2150 and allow current flow to the contact elements, when a closed circuit is established.

In FIG. 21, the ball 2008 is shown separated from (i.e., not in contact with) the contact element 2162 and a portion of the ball 2008 is extended over the polishing surface (represented by plane 2030). In one embodiment, the ball 2008 is maintained in the separated contactless position by operation of gravity, where configured for face up polishing. Where the ball bearing contact assembly 1900 is configured for face down polishing the separated contactless position may be maintained by fluid pressure. In other words, fluid is flowed into the cavity 2018 through the fluid port 2154, thereby forcing the ball 2008 against the tapered surface 2020. In this position, the contact between the ball 2008 and tapered surface 2020 creates a seal which can be maintained by continuing hydrostatic pressure in the cavity 2018. The ball 2008 may also be urged below the polishing surface, such as by the force of a substrate being polished, so that contact is made between the ball 2008 and the contact element 2162. This contact position is shown by the dashed lines 2008'.

Whether the ball bearing contact assembly 1900 is configured for face up or face down polishing, the polishing operation is substantially the same. For purposes of describing one possible operation, it will be assumed that the ball 2008 is initially in the separated contactless position and that sufficient hydrostatic pressure is provided to maintain this position, even where gravity provides a counteracting force (in the case of face down polishing). In this position, substantial electrical communication between the power supply 150 and the ball 2008 is not present as a result of the separation between the contact element 2162 and the ball 2008. Of course, some degree of current flow via the ball 2008 may be made possible to the extent that the surrounding electrolyte is capable of supporting a current. A substrate to be polished is then brought into contact with the upper surface of the polishing pad 1902. The position of lower surface of the substrate is illustrated by the plane 2030, which is substantially coplanar with the upper surface of the polishing pad 1902. In this position, contact is made between the ball 2008 and the contact element 2162. Accordingly, a closed-circuit is now established between the anode (i.e. power supply 150) and the cathode (i.e. the substrate). Further, fluid flow is permitted around the ball 2008 and through the upper opening 2023 of the housing 2006. Either or both the substrate and the pad 1902 may be actuated (e.g., rotated) to provide relative movement between the substrate and the pad. During such relative movement electrical contact between the ball 2008 and the contact element 2162 is maintained. Persons skilled in the art will recognize that good electrical contact is maintained between the ball 2008 and the contact element 2162, even in the event of slight axial movement of the ball 2008, by appropriate positioning of the contact element 2162. Further, it is generally preferable to maintain good electrical contact between the ball 2008 and the contact element 2404 with minimal physical pressure therebetween. The particular degree of pressure resulting from contact between the ball 2008 and the contact element 2162 may be determined by the positioning of the respective elements and the flexibility (e.g., spring constant) of the biasing members 2160.

At the end of the polishing cycle and/or rinse cycle, the substrate may be removed from the polishing pad 1902. If fluid flow through the fluid port 2028 is not terminated, and if sufficient backside pressure is available, the ball 2008 is urged up against the ball seat 2020. In this position, the ball 2008 substantially restricts or prevents fluid flow through the housing opening 2023. As such, the ball 2008 operates as a check valve to conserve electrolyte between polishing cycles.

Figure 24:
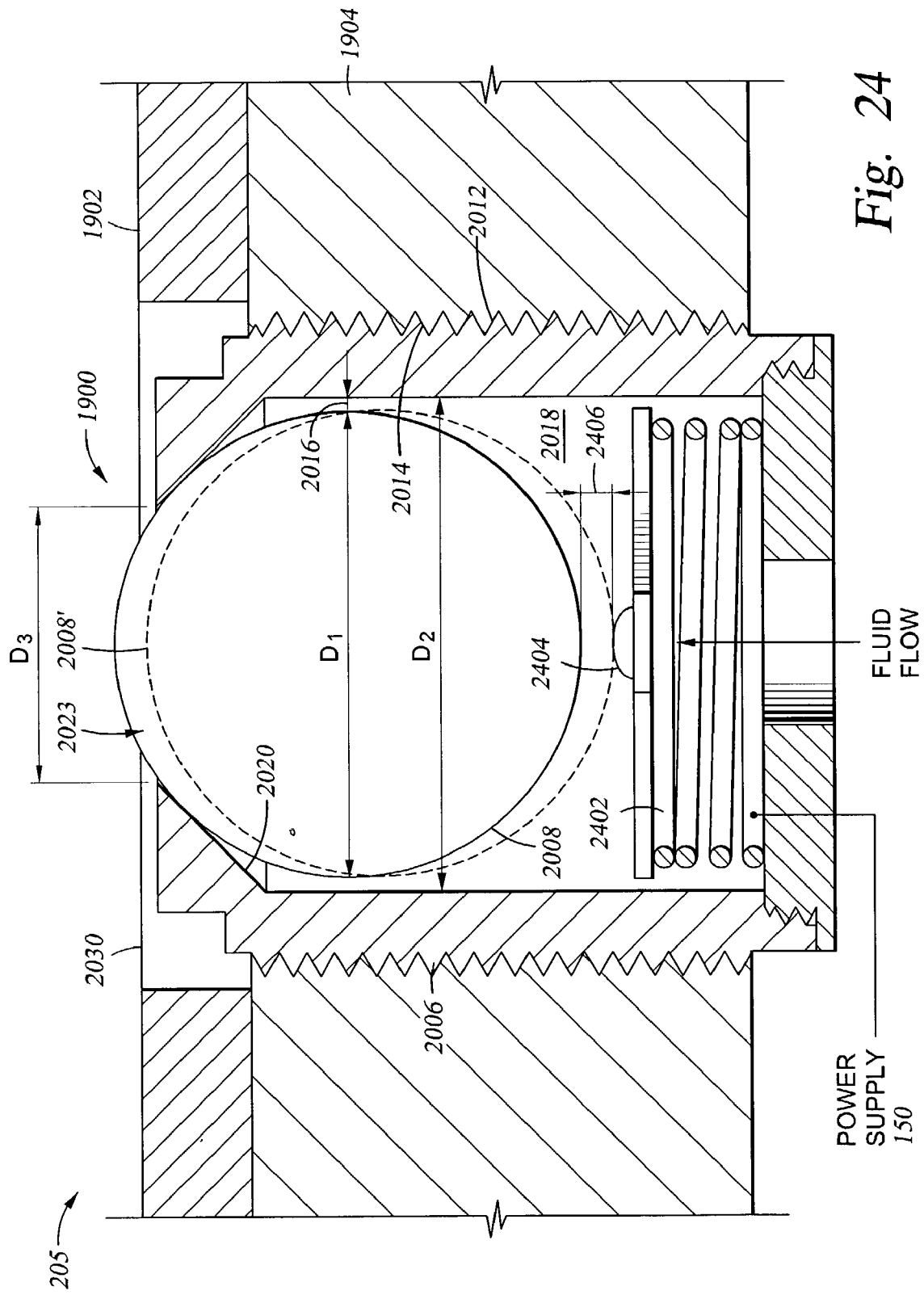
FIG. 24 is a side sectional view of another embodiment of the ball bearing contact assembly of FIG. 19.

FIG. 24 shows yet another embodiment of the ball bearing contact assembly 1900. Where possible, like numerals have been used for simplicity. Accordingly, components which have been described above will not be described again, except to note particular differences, where appropriate or if necessary.

In general, the ball bearing contact assembly 1900 shown in FIG. 24 comprises the ball 2008', a biasing member 2402 and a contact element 2404. In general, the ball 2008, the biasing member 2402 and the contact element 2404 are all current-conducting members. As such, these members may be made of conducting materials such as metal. In a particular embodiment, the ball 2008 is a plastic or steel core plated with gold. In another embodiment, the ball 2008 is solid gold. Further, either or both the biasing element 2402 and the contact element 2404 may include gold. In any case, the biasing element 2402 is connected to the power supply 150 to provide a current to the contact element 2404 and the ball 2008.

The movement of the ball 2008 within the cavity 2018 is restricted at one end by the ball seat 2020 and at another end by the biasing member 2402, which carries the contact element 2404. The biasing member 2402 may be any flexible member providing some degree of linear compression in response to pressure from the ball 2008. For example, in the embodiment illustrated in FIG. 24, the biasing member 2402 is a spring. In this case, the lower end of the spring 2402 may be supported on a ledge 2146 of the housing 2006. To avoid sliding of the spring 2402 within the cavity 2018, the spring 2402 is preferably affixed to the ledge 2146.

In FIG. 24, the ball 2008 is shown separated from (i.e., not in contact with) the contact element 2026 by a distance 2404 and a portion of the ball 2008 is extended over the polishing surface (represented by plane 2030). In one embodiment, the ball 2008 is maintained in the separated contactless position by operation of gravity, where configured for face up polishing. Where the ball bearing contact assembly 1900 is configured for face down polishing the separated contactless position may be maintained by fluid pressure. In other words, fluid is flowed into the cavity 2018 from a lower end of the housing 2006, thereby forcing the ball 2008 against the tapered surface 2020. In this position, the contact between the ball 2008 and tapered surface 2020 creates a seal which can be maintained by continuing hydrostatic pressure in the cavity 2018. The ball 2008 may also be urged below the polishing surface, such as by the force of a substrate being polished, so that contact is made between the ball 2008 and the contact element 2404. This contact position is shown by the dashed lines 2008'.

Whether the ball bearing contact assembly 1900 is configured for face up or face down polishing, the polishing operation is substantially the same. For purposes of describing one possible operation, it will be assumed that the ball 2008 is initially in the separated contactless position and that sufficient hydrostatic pressure is provided to maintain this position, even where gravity provides a counteracting force (in the case of face down polishing). In this position, substantial electrical communication between the power supply 150 and the ball 2008 is not present as a result of the gap 2406. Of course, some degree of current flow via the ball 2008 may be made possible to the extent that the surrounding electrolyte is capable of supporting a current. A substrate to be polished is then brought into contact with the upper surface of the polishing pad 1902. The position of lower surface of the substrate is illustrated by the plane 2030, which is substantially coplanar with the upper surface of the polishing pad 1902. In this position, contact is made between the ball 2008 and the contact element 2404. Accordingly, a closed-circuit is now established between the anode (i.e. power supply 150) and the cathode (i.e. the substrate). Further, fluid flow is permitted around the ball 2008 and through the upper opening 2023 of the housing 2006. Either or both the substrate and the pad 1902 may be actuated (e.g., rotated) to provide relative movement between the substrate and the pad. During such relative movement electrical contact between the ball 2008 and the contact element 2404 is maintained. Persons skilled in the art will recognize that good electrical contact is maintained between the ball 2008 and the contact element 2404, even in the event of slight axial movement of the ball 2008, by appropriate positioning of the contact element 2404. Further, it is generally preferable to maintain good electrical contact between the ball 2008 and the contact element 2404 with minimal physical pressure therebetween. The particular degree of pressure resulting from contact between the ball 2008 and the contact element 2404 may be determined by the positioning of the respective elements and the spring constant of the biasing member 2402.

For each of the foregoing embodiments, the substrate may be removed from the polishing pad 1902 at the end of the polishing cycle and/or rinse cycle. If fluid flow through the cavity 2018 is not terminated, and if sufficient backside pressure is available, the ball 2008 is urged up against the ball seat 2020. In this position (indicated by the dashed lines 2008" in the embodiment of FIG. 20), the ball 2008 substantially restricts or prevents fluid flow through the housing opening 2023. As such, the ball 2008 operates as a check valve. Such an arrangement may be desirable, for example, to conserve electrolyte between polishing cycles. Accordingly, when the next substrate is brought into contact with the ball 2008, the ball is depressed into the cavity 2018 and into the position 2008'. In this position, fluid flow is permitted through the opening 2023.

For each of the foregoing embodiments, the ball 2008 and the contact element(s) 2026, 2404, 2162 are only in selective electrical contact. For example, when the ball 2008 is urged against the seat 2020 (the position indicated by the dashed lines 2008" in the case of FIG. 20), no physical (and hence, electrical) contact is made between the ball 2008 and the contact element(s) 2026, 2404, 2162. Contact between the ball 2008 and the contact elements 2026, 2404, 2162 is then made only when a substrate (or some other object) urges the ball into the cavity 2018 and against the contact element. In this way, the assembly 1900 operates as a switch, whereby a current flow path between the ball 2008 and the power supply 150 is only selectively established. This configuration may prevent or mitigate etching of the balls 2008 which are not in contact with a substrate being polished.

In some embodiments it may be desirable to adjust the height of the contact elements, such as the balls 2008 described above. At least one height adjustment mechanism was described above with respect to FIG. 20 in which a set screw 2022 is provided to adjust a lower positional limit of the ball 2008 within the cavity 2018. However, any variety of other height adjustment mechanisms are contemplated, including mechanisms which adjust the height of the contact element (e.g., the ball 2008), a structure containing or supporting the contact element (e.g., the housing 2006) or both.

Power Supply and Control

Figure 25:
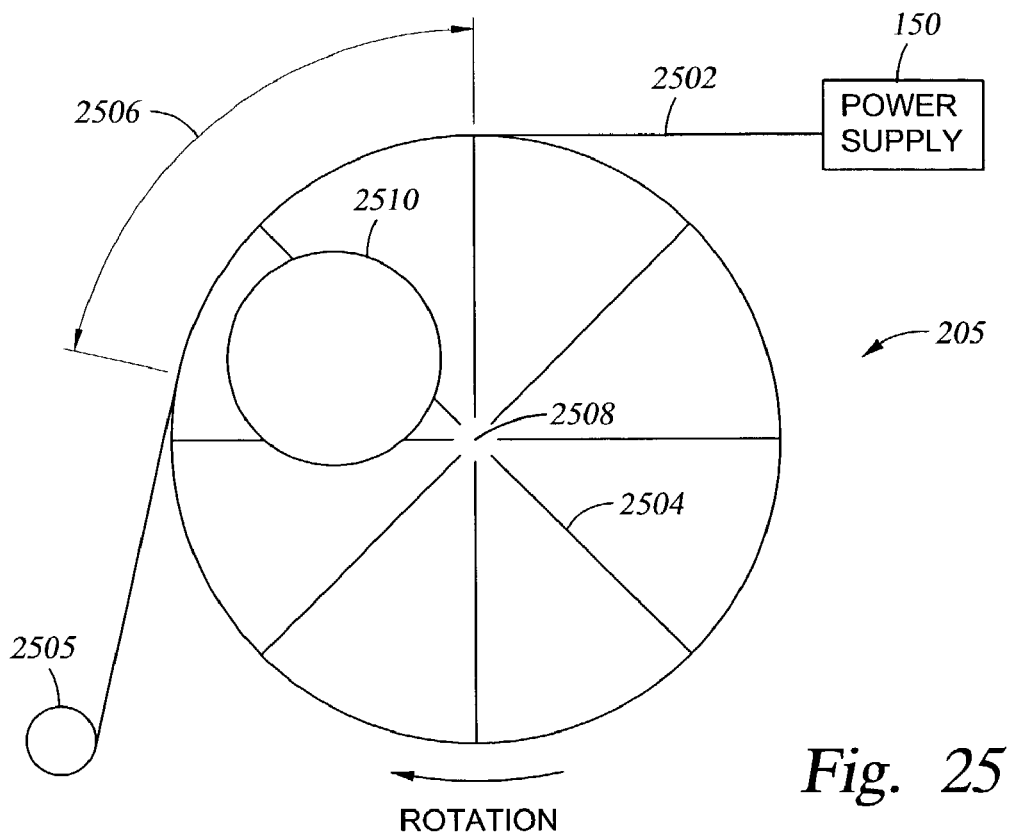
FIG. 25 is a plan view of an embodiment of a polishing article having a power control assembly.

For various embodiments of the conductive polishing article 205 described above, power must be coupled to the conductive elements disposed on the polishing article 205. One embodiment suitable for providing power is described with reference to FIG. 25 which shows a top view of the polishing article 205. A power strip 2502 and conducting members 2504 (eight shown) are used to provide a current to the polishing article 205. The power strip 2502 and the conducting members 2504 may be of any sufficiently conductive material, such as copper. The power strip 2502 is connected at one end to the power supply 150 and add another end to an anchor 2505. The anchor may be any insulated member. Illustratively, a portion of the power strip (indicated by arc length 2506) is wrapped around a circumferential edge of the polishing article 205. The conducting members 2504 are generally radially disposed from a center 2508 of the polishing article 205 to the edge of the conductive polishing article 205. The terminal ends of the conducting members 2504 at the edge of the conductive polish article 205 are sufficiently exposed to make electrical contact with the conducting strip 2502. To this end, the conducting members 2504 may extend slightly beyond the edge of the polishing article 205. In this manner, the power strip 2502 is capable of providing a current to any conductive element(s) 2504 of the polishing article 205 with which it comes into contact with.

In one embodiment, the conducting members 2504 comprise the embedded pad inserts/assemblies shown in FIGS. 3–12 and described above. In another embodiment, the conducting members 2504 are electrically connected to other contact elements disposed on the polishing article 205 including, for example, those elements described with reference to FIGS. 3–12. In any case, it should be noted that, at least in one embodiment, the conducting members are electrically isolated from one another (note that in FIG. 25 the conducting members to not touch at the center of the polishing article 205). This allows, at any given time, some of the conducting members to be positively biased by contact with the power strip, while other conducting members are not biased.

In operation, a substrate 2510 is brought into contacting with the upper polishing surface of the polishing article 205 while the polishing medium is rotated about its center axis. In some embodiments, the substrate may be moved relative to the polishing article 205 by action of the polishing head 130. However, in order to ensure anodic dissolution, the substrate's position should be constrained to a region in which contact with one of the energized conducting members (that is, one of the conducting members currently in contact with the power strip) is made. Those conducting members not in direct contact with the power strip, or indirect contact with the power strip via the substrate, will not experience a positive bias, or at least a relatively smaller bias. As a result, electrochemical attack and damage of the conducting members and any conductive elements electrically connected thereto is reduced. In one embodiment, any one of the conductive members and power strip are electrically connected for between about 20% and 60% of the rotation period of the polishing article 205.

Typically, the highest potential on the conducting members is closest to the power strip and the lowest potential is at the end of the conducting members closest to the center of the polishing article 205. Accordingly, in order to ensure an equipotential surface along the length of the conducting members, and therefore over the surface of the contacting substrate, the conducting members may be of increasing conductivity from the edge of the polishing article 205 to the center 2508. In some cases, substrate rotation relative to the polishing pad will equalize or average out the potential imparted to the substrate surface to provide for more uniform material deposition rate or removal rate.

Over time, the power strip contacting the edge of the polishing article 205 may become worn. Accordingly, it may be necessary to replace or recondition the power strip. To this end, the anchor 2505 may be equipped with a power strip dispenser. A mechanism may be provided on the other end of the power strip to take up slack when a length of power strip is dispensed from the power strip dispenser.

Figure 26:
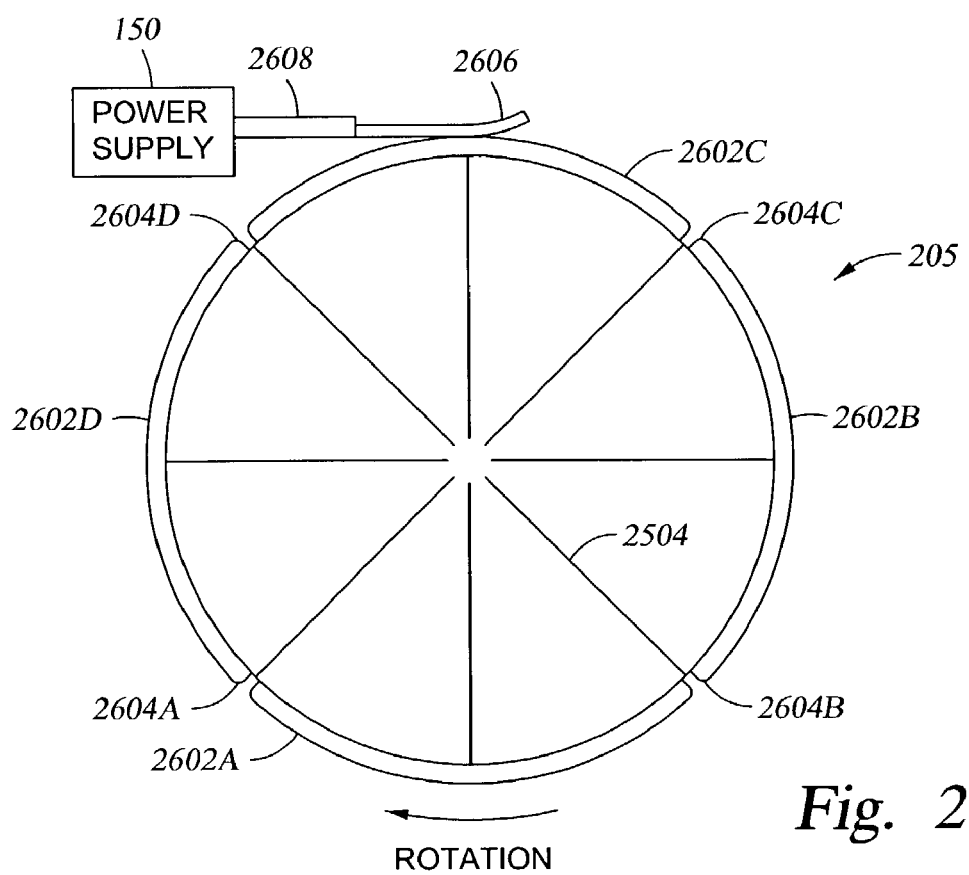
FIG. 26 is a plan view of another embodiment of a polishing article having a power control assembly.

FIG. 26 shows a top view of another embodiment of the polishing article 205 in which power is coupled from the power supply 150 to a substrate (not shown) being polished. As in the embodiment described above with reference to FIG. 25, the polishing article 205 includes a plurality of electrically isolated conducting members 2504. A plurality of conductive ring portions 2602A–D (four shown, by way of illustration) are disposed at the perimeter of the polishing area of the polishing article 205. The ring portions 2602 are in electrical communication with the one or more conducting members 2504. However, the ring portions 2602 are isolated from one another by gaps 2604A–D. Although not shown, in one embodiment insulating material is disposed within the gaps to prevent arcing between the ring portions. Periodic electrical contact is made between the ring portions 2602 and the power supply 150 via a contact finger 2606 connected to a flexible arm 2608. The flexible arm 2608 provides a mechanical bias against the ring portions 2602 to ensure adequate contact. In one embodiment, the conductive ring portions are embedded within the perimeter edge of the polishing article 205, but exposed to allow contact with the contact finger 2606.

In operation, a substrate is placed into contact with the upper polishing surface of the rotating polishing article 205. At any given time, a selective positive bias is provided to one or more of the conductive ring portions 2602, and therefore, the associated (i.e. electrically connected) conducting members 2504. To ensure anodic dissolution, the substrate is positioned to be in electrical contact with the appropriate conducting members 2504. During rotation of the polishing article 205, one or more of the conducting members 2504 will be positively biased, while the other conducting members will be unbiased. In this manner, electrochemical damage to any of the conducting portions of the polishing article 205 is reduced.

Contacts: Materials

The materials used for contacts (e.g., the wire contacts of FIGS. 3–12) and the roller/ball contacts of FIGS. 13–24) taught, shown or suggested herein may be selected according to suitability to a particular application. For example, good conductivity and resistance to dissolution may be considered desirable characteristics. Further, low surface roughness may be desirable to avoid scratching the surface of the substrate being polished. Accordingly, any variety of materials are contemplated for use according to aspects of the present invention. By way of example, some materials have been recited above with respect to particular embodiments. More generally, preferred materials include metals, and more particularly, noble metals such as gold, platinum and titanium. Other materials include Iridium (Ir) and Rhodium (Rh). In some embodiments, inert materials such as graphite may be used. With regard to conductive materials, the contact elements may be solid or plated. For example, in one embodiment the wire contacts (FIGS. 3–12) comprise a flexible non-conductive material (e.g., nylon fiber) coated with a noble metal. In a particular embodiment, the non-conductive material is Torlon®, a glass filled polyamide/polyimide available from McMaster—Carr, Inc.

Persons skilled in the art will recognize that the foregoing embodiments are merely illustrative. The invention contemplates and admits of many other embodiments. For example, a number of the foregoing embodiments described a face down electropolishing technique. That is, the substrate to be processed is in a face down orientation relative to the polishing pad. However, in other embodiments, face up electropolishing techniques are employed. These and other embodiments are considered within the scope of the invention. Further, persons skilled in the art will recognize that aspects of various embodiments have been separately described/shown. However, each of the embodiments may be combined or be employed in the alternative with respect to other embodiments. For example, wire contacts in the form of arches (See FIGS. 3 and 4) and twisted (or partially twisted) loops/arches (See FIG. 5 and FIGS. 11 and 12) have been disclosed. Accordingly, it is contemplated that other embodiments showing wire arches may instead be configured as wire twisted loops.

For purposes of illustration some embodiments disclosed herein may have been described using terms such as over, under, below, adjacent, and the like. Such terms are used to indicate relative location. As such, the recited location of an entity is not limiting of any embodiment of the invention and other relative locations are contemplated and are within the scope of the invention.

While the foregoing is directed to embodiments of the present invention, other and further embodiments of the invention may be devised without departing from the basic scope thereof, and the scope thereof is determined by the claims that follow.

What is claimed is:

1. An electrochemical processing article, comprising:
   a pad body defining a polishing surface and having a fluid flow channel disposed therethrough; and
   a conductive rotating contact element rotatably disposed at least partially in the fluid flow channel of the pad body and having at least a portion positionable at a substrate contact position at which the conductive rotating contact element contacts a substrate surface during electrochemical processing, wherein the conductive rotating contact element is hydraulically actuatable into the substrate contact position by fluid flow through the fluid flow channel.

2. The polishing article of claim 1, further comprising a flexible conductive contact member defining a power supply connection surface for electrically connecting a power supply to the conductive rotating contact element.

3. The polishing article of claim 1, further comprising a conductive contact member for electrically connecting a power supply to the conductive rotating contact element, wherein the conductive rotating contact element is in physical contact with the conductive contact member in the substrate contact position and separated from the conductive contact member in another position.

4. The polishing article of claim 1, further comprising a contact assembly for electrically connecting a power supply to the conductive rotating contact element, comprising:
   a body defining a power supply contact surface;
   at least one flexible arm extending from the body; and
   a contact element disposed at a distal end of the at least one flexible arm.

5. The polishing article of claim 4, wherein the contact element is rounded.

6. The polishing article of claim 4, wherein the contact element defines one of a spherically shaped surface and a cylindrically shaped surface.

7. The polishing article of claim 1, wherein the fluid flow channel is formed in one of the pad body and a housing disposed in the pad body.

8. The polishing article of claim 1, further comprising a position adjustment member adapted to change a range of motion of the conductive rotating contact element.

9. The polishing article of claim 8, wherein the position adjustment member comprises, at one end, a contact surface for the conductive rotating contact element.

10. The polishing article of claim 8, wherein the position adjustment mechanism comprises a threaded member defining, at one end, a contact surface for the conductive rotating contact element.

11. The polishing article of claim 8, wherein the position adjustment mechanism comprises a slidable position adjustment member and a biasing member in contact with the slidable position adjustment member and wherein the biasing member provides a directional bias to the slidable position adjustment member.

12. The polishing article of claim 1, wherein the conductive rotating contact element is part of a roller bearing assembly.

13. The electrochemical processing article of claim 12, further comprising a height adjustment mechanism connected to the roller bearing assembly and adapted to change the height of the roller bearing over the polishing surface.

14. The electrochemical processing article of claim 12, further comprising a power supply electrically coupled to the roller bearing assembly.

15. The electrochemical processing article of claim 12, further comprising a pressure-responsive compressible member having the roller bearing assembly disposed thereon, whereby the height of the roller bearing assembly over the polishing surface changes in response to an applied force on the roller bearing assembly.

16. The electrochemical processing article of claim 1, wherein the conductive rotating contact element is at least one of spherically shaped, cylindrically shaped and frusto-conically shaped.

17. The electrochemical processing article of claim 16, further comprising a housing having the conductive rotating contact element and a contact element disposed therein, wherein the contact element is adapted for electrically coupling the conductive rotating contact element to a power source.

18. The electrochemical processing article of claim 16, further comprising an electrically conductive housing having the conductive rotating contact element disposed therein.

19. The electrochemical processing article of claim 18, wherein the electrically conductive housing is coupled to a power source.

20. The electrochemical processing article of claim 18, wherein the electrically conductive housing comprises a retaining surface at one end to restrict axial movement of the conductive rotating contact element within the housing.

21. The electrochemical processing article of claim 16, wherein the conductive rotating contact element comprises a plastic core at least partially covered with electrically conductive material.

22. The electrochemical processing article of claim 21, wherein the electrically Conductive material comprises gold.

23. The electrochemical processing article of claim 16, further comprising a conductive pressure-responsive compressible member defining a contact surface for engaging the conductive rotating contact element.

24. The electrochemical processing article of claim 23, wherein the conductive pressure-responsive compressible member comprises a spring.

25. An electrochemical processing article, comprising:
a pad body defining a polishing surface and having a fluid flow channel disposed therethrough; and
a conductive rotating contact element rotatably disposed at least partially in the fluid flow channel of the pad body and having at least a portion positionable at a substrate contact position at which the conductive rotating contact element contacts a substrate surface during electrochemical processing, wherein fluid flowed through the fluid flow channel causes a pressure drop sufficient to lift the conductive rotating contact element into the substrate contact position.

26. An electrochemical processing article, comprising:
a pad body defining a polishing surface and having a fluid flow channel disposed therethrough; and
a conductive rotating contact element rotatably disposed at least partially in the fluid flow channel of the pad body and having at least a portion positionable at a substrate contact position at which the conductive rotating contact element contacts a substrate surface during electrochemical processing wherein the conductive rotating contact element is part of a roller bearing assembly electrically coupled to a power supply, and, wherein the roller bearing assembly comprises a plurality of conductive rotating contact elements rotatably disposed on an axle.

27. An electrochemical processing article, comprising:
a pad body defining a polishing surface and having a fluid flow channel disposed therethrough; and
a conductive rotating contact element rotatably disposed at least partially in the fluid flow channel of the pad body and having at least a portion positionable at a substrate contact position at which the conductive rotating contact element contacts a substrate surface during electrochemical processing wherein the conductive rotating contact element is part of a roller bearing assembly electrically coupled to a power supply, and, wherein the pad body is circular and is rotated about a central axis and the roller bearing assembly comprises an axis of rotation aligned with a radius of the polishing pad.

28. A current conducting assembly for electrochemical processing, comprising:
a housing defining an electrolyte flow passageway; and
a current-providing conductive rotatable contact element rotatably disposed in the housing and having at least a substrate contact portion positionable at a substrate contact position to rotatably contact a substrate surface during electrochemical mechanical polishing, wherein the current-providing conductive rotatable contact element is hydraulically actuatable into the substrate contact position by fluid flow through the electrolyte flow passageway.

29. The current conducting assembly of claim 28, wherein the housing is non-conductive.

30. The current conducting assembly of claim 28, wherein the electrolyte flow passageway is registered with a platen electrolyte flow passageway formed in a platen.

31. The current conducting assembly of claim 28, further comprising a position adjustment mechanism adapted to change a range of motion of the current-providing conductive rotatable contact element.

32. The current conducting assembly of claim 31, wherein the position adjustment member comprises, at an upper end, a contact surface for the current-providing conductive rotatable contact element.

33. The current conducting assembly of claim 31, wherein the position adjustment mechanism is a threaded member defining a contact element surface at an upper end for engaging the current-providing conductive rotatable contact element.

34. The current conducting assembly of claim 31, wherein the position adjustment mechanism comprises a slidable position adjustment member and a biasing member in contact with position adjustment mechanism and wherein the biasing member provides a directional bias to the position adjustment mechanism.

35. The current conducting assembly of claim 28, wherein the current-providing conductive rotatable contact element comprises at least one ball.

36. The current conducting assembly of claim 35, wherein the housing comprises a ball seat having a diameter smaller than a diameter of the at least one ball.

37. The current conducting assembly of claim 28, wherein the current-providing conductive rotatable contact element is at least one of spherically shaped, cylindrically shaped and frustoconically shaped.

38. The current conducting assembly of claim 37, wherein the housing is electrically conductive and is coupled to a power source.

39. The current conducting assembly of claim 37, wherein the housing comprises a retaining surface at one end to restrict movement of the current-providing conductive rotatable contact element within the housing.

40. The current conducting assembly of claim 37, wherein the current-providing conductive rotatable contact element comprises a non-conductive core at least partially covered with electrically conductive material.

41. The current conducting assembly of claim 40, wherein the electrically conductive material comprises gold.

42. The current conducting assembly of claim 37, further comprising a conductive pressure-responsive compressible member defining a contact surface for engaging the current providing conductive rotatable contact element.

43. The current conducting assembly of claim 42, wherein the conductive pressure-responsive compressible member comprises a spring.

44. An electrochemical processing system, comprising:
a cell body defining an electrolyte-containing volume;
an electrode disposed in the electrolyte-containing volume;
a polishing pad disposed in the electrolyte-containing volume and comprising a pad body defining a polishing surface;
at least one conductive rotatable contact element at least partially disposed through the pad body and extending over the polishing surface and rotatable with respect to the polishing pad, wherein the conductive rotatable contact element is adapted to rotatably contact a substrate surface during electrochemical processing;

a housing defining an electrolyte flow passageway and having the at least one conductive rotatable contact element rotatably disposed therein; and a power supply coupled to the electrode and the contact element, wherein the housing defines a fluid flow channel through which a fluid is flowed to hydraulically actuate the conductive rotating contact element into a substrate contact position, and wherein the conductive rotating contact element is at least one of spherically shaped, cylindrically shaped and frustoconically shaped.

45. The system of claim 44, wherein the housing is electrically conductive.

46. The system of claim 45, wherein the electrolyte flow passageway defined in the electrically conductive housing is registered with an electrolyte flow passageway formed in a platen.

47. The system of claim 44, wherein the conductive rotatable contact element is positionable between a first position disposed below the polishing surface and a second position adapted to contact the substrate surface.

48. The system of claim 44, further comprising a position adjustment mechanism adapted to change a range of motion of the conductive rotating contact element.

49. The system of claim 48, wherein the position adjustment member comprises, at an upper end, a contact surface for the conductive rotating contact element.

50. The system of claim 48, wherein the position adjustment mechanism is a threaded member defining a conductive rotating contact element contact surface at an upper end.

51. The system of claim 48, wherein the position adjustment mechanism comprises a slidable position adjustment member and a biasing member in contact with position adjustment mechanism and wherein the biasing member provides a directional bias to the position adjustment mechanism.

52. The system of claim 48, wherein the conductive rotating contact element comprises at least one ball.

53. The system of claim 52, further comprising an electrically conductive housing having the ball disposed therein.

54. The system of claim 53, wherein the electrically conductive housing comprises a ball seat having a diameter smaller than a diameter of the at least one ball.

55. The system of claim 53, further comprising contact elements disposed in the housing for electrically contacting the conductive rotating contact element.

56. The system of claim 44, further comprising a housing having the conductive rotating contact element disposed therein.

57. The system of claim 44, wherein the housing comprises a retaining surface at one end to restrict movement of the conductive rotating contact element within the housing.

58. The system of claim 44, wherein the conductive rotating contact element comprises a non-conductive core at least partially covered with electrically conductive material.

59. The system of claim 58, wherein the electrically conductive material comprises a noble metal.

60. The system of claim 58, wherein the electrically conductive material comprises gold.

61. The system of claim 44, further comprising a conductive pressure-responsive compressible member defining a contact surface for engaging the conductive rotating contact element.

62. The system of claim 61, wherein the conductive pressure-responsive compressible member comprises a spring.

63. An electrochemical processing system, comprising:
a cell body defining an electrolyte-containing volume;
an electrode disposed in the electrolyte-containing volume;
a polishing pad disposed in the electrolyte-containing volume and comprising a pad body defining a polishing surface;
at least one conductive rotatable contact element at least partially disposed through the pad body and extending over the polishing surface and rotatable with respect to the polishing pad, wherein the conductive rotatable contact element is adapted to rotatably contact a substrate surface during electrochemical processing;
a housing defining an electrolyte flow passageway and having the at least one conductive rotatable contact element rotatably disposed therein; and
a power supply coupled to the electrode and the contact element, wherein the conductive rotating contact element is part of a roller bearing assembly, and wherein the roller bearing assembly comprises a plurality of conductive rotating contact elements rotatably disposed on an axle.

64. An electrochemical processing system, comprising:
a cell body defining an electrolyte-containing volume;
an electrode disposed in the electrolyte-containing volume;
a polishing pad disposed in the electrolyte-containing volume and comprising a pad body defining a polishing surface;
at least one conductive rotatable contact element at least partially disposed through the pad body and extending over the polishing surface and rotatable with respect to the polishing pad, wherein the conductive rotatable contact element is adapted to rotatably contact a substrate surface during electrochemical processing;
a housing defining an electrolyte flow passageway and having the at least one conductive rotatable contact element rotatable disposed therein; and
a power supply coupled to the electrode and the contact element, wherein the conductive rotating contact element is part of a roller bearing assembly, and wherein the polishing pad is circular and is rotated about a central axis and the roller bearing assembly comprises an axis of rotation aligned with a radius of the polishing pad.

65. The system of claim 64, further comprising a height adjustment mechanism connected to the roller beating assembly and adapted to change a height of the roller bearing assembly over the polishing surface.

66. The system of claim 64, further comprising a power supply electrically coupled to the roller beating assembly.

67. The system of claim 64, further comprising a pressure-responsive compressible member having the roller bearing assembly disposed thereon, whereby a height of the roller bearing assembly over the polishing surface changes in response to an applied force on the roller bearing.

* * * * *

UNITED STATES PATENT AND TRADEMARK OFFICE
CERTIFICATE OF CORRECTION

PATENT NO. : 7,125,477 B2
APPLICATION NO. : 10/211626
DATED : October 24, 2006
INVENTOR(S) : Butterfield et al.

It is certified that error appears in the above-identified patent and that said Letters Patent is hereby corrected as shown below:

Title Page, Item (56), References Cited, U.S. PATENT DOCUMENTS: Change "6,982,524" to --6,962,524--

Column 2, Line 43: Before "outer", change "a" to --an--

Column 2, Line 51: Before "outer", change "a" to --an--

Column 3, Line 18: Before "least", insert --at--

Column 3, Line 39: Before "pad", insert --the--

Column 4, Line 28; Before "pad", insert --the--

Column 11, Line 29: After "first", insert --to--

Column 12, Line 23: After "also", insert --be--

Column 15, Line 16: Change "attacked" to --attack--

Column 15, Line 24: Before "shown", delete "a"

Column 15, Line 47: Change "and" to --end--

Column 16, Line 14: Change "it" to --its--

Column 16, Line 16: Change "1102" to --1100--

Column 16, Line 17: Change "element." to --element).--

Column 16, Line 41: After "such", insert --as--

Column 21, Line 35: After "extends", insert --to--

Column 23, Line 23: Before "is", insert --it--

Column 23, Line 37: Change "element" to --elements--

Column 24, Line 52: Change "or" to --are--

Column 24, Line 58: Change "urged" to --urge--

UNITED STATES PATENT AND TRADEMARK OFFICE
CERTIFICATE OF CORRECTION

PATENT NO. : 7,125,477 B2
APPLICATION NO. : 10/211626
DATED : October 24, 2006
INVENTOR(S) : Butterfield et al.

It is certified that error appears in the above-identified patent and that said Letters Patent is hereby corrected as shown below:

Column 27, Line 39: Change "2026' to --2404--

Column 27, Line 39: Change "2404" to --2406--

Column 29, Line 16: Change "add" to --at--

Column 29, Line 24: Change "polish" to --polishing--

Column 29, Line 30: After "contact", delete "with"

Column 29, Line 41: Change "to" to --do--

Column 29, Line 46: Change "contacting" to --contact--

Column 30, Line 55: Delete the ")" after "3-12"

Column 31, Claim 2, Line 53: Change "polishing article" to --article--

Column 31, Claim 3, Line 57: Change "polishing article" to --article--

Column 31, Claim 4, Line 64: Change "polishing article" to --article--

Column 32, Claim 5, Line 4: Change "polishing article" to --article--

Column 32, Claim 6, Line 6: Change "polishing article" to --article--

Column 32, Claim 7, Line 9: Change "polishing article" to --article--

Column 32, Claim 8, Line 12: Change "polishing article" to --article--

Column 32, Claim 9, Line 15: Change "polishing article" to --article--

Column 32, Claim 10, Line 18: Change "polishing article" to --article--

Column 32, Claim 11, Line 22: Change "polishing article" to --article--

Column 32, Claim 12, Line 28: Change "polishing article" to --article--

Column 33, Claim 22, Line 2: Change "Conductive" to --conductive--

UNITED STATES PATENT AND TRADEMARK OFFICE
CERTIFICATE OF CORRECTION

PATENT NO. : 7,125,477 B2
APPLICATION NO. : 10/211626
DATED : October 24, 2006
INVENTOR(S) : Butterfield et al.

It is certified that error appears in the above-identified patent and that said Letters Patent is hereby corrected as shown below:

Column 33, Claim 26, Line 34: Delete the comma after "and"

Column 33, Claim 27, Line 49: Delete the comma after "and"

Column 33, Claim 27, Lines 51-52: Change "polishing pad" to --pad body--

Column 33, Claim 28, Line 60: Change "rotalably" to --rotatably--

Column 36, Claim 64, Line 42: Change "rotatable" to --rotatably--

Column 36, Claim 65, Line 51: Change "beating" to --bearing--

Column 36, Claim 66, Line 56: Change "beating" to --bearing--

Signed and Sealed this

Sixteenth Day of January, 2007

JON W. DUDAS
*Director of the United States Patent and Trademark Office*